(12) United States Patent
Goto et al.

(10) Patent No.: US 10,778,181 B2
(45) Date of Patent: Sep. 15, 2020

(54) ELASTIC WAVE DEVICE WITH SUB-WAVELENGTH THICK PIEZOELECTRIC LAYER AND HIGH VELOCITY LAYER

(71) Applicant: Skyworks Solutions, Inc., Irvine, CA (US)

(72) Inventors: Rei Goto, Osaka (JP); Jie Zou, Irvine, CA (US); Hiroyuki Nakamura, Osaka-Fu (JP); Chun Sing Lam, San Jose, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 488 days.

(21) Appl. No.: 15/787,596

(22) Filed: Oct. 18, 2017

(65) Prior Publication Data
US 2018/0159507 A1 Jun. 7, 2018

Related U.S. Application Data

(60) Provisional application No. 62/410,804, filed on Oct. 20, 2016, provisional application No. 62/423,705, filed on Nov. 17, 2016.

(51) Int. Cl.
*H03H 9/25* (2006.01)
*H03H 9/02* (2006.01)
*H03H 9/64* (2006.01)
*H01L 41/047* (2006.01)
(Continued)

(52) U.S. Cl.
CPC ....... *H03H 9/02559* (2013.01); *H01L 41/047* (2013.01); *H01L 41/0477* (2013.01); *H01L 41/1873* (2013.01); *H03H 9/02574* (2013.01); *H03H 9/02818* (2013.01); *H03H 9/02834* (2013.01); *H03H 9/25* (2013.01);
(Continued)

(58) Field of Classification Search
CPC ........... H03H 9/02559; H03H 9/02574; H03H 9/02818; H03H 9/02834; H03H 9/25; H03H 9/6483; H03H 9/725; H03H 9/6489; H01L 41/047; H01L 41/0477; H01L 41/1873
USPC ...................... 310/313 A–313 D, 313 R, 346; 333/187–193
See application file for complete search history.

(56) References Cited

U.S. PATENT DOCUMENTS 5,998,907 A * 12/1999 Taguchi ............. H03H 9/02574
310/313 R
7,105,980 B2 9/2006 Abbott et al.
7,213,314 B2 5/2007 Abbott et al.
(Continued)

FOREIGN PATENT DOCUMENTS

EP 2 830 216 1/2015
WO WO 2014/079912 5/2014

OTHER PUBLICATIONS

Abbott, et al., "Advances in RF SAW Substrates," 2004, 11 pages.
(Continued)

*Primary Examiner* — Thomas M Dougherty
(74) *Attorney, Agent, or Firm* — Knobbe, Martens, Olson & Bear, LLP

(57) ABSTRACT

Aspects of this disclosure relate to an elastic wave device. The elastic wave device includes a sub-wavelength thick piezoelectric layer, an interdigital transducer electrode on the piezoelectric layer, and a high velocity layer configured to inhibit an elastic wave from leaking from the piezoelectric layer at anti-resonance.

20 Claims, 65 Drawing Sheets

(51) Int. Cl.
   *H03H 9/72*      (2006.01)
   *H01L 41/187*    (2006.01)
(52) U.S. Cl.
   CPC ........ *H03H 9/6483* (2013.01); *H03H 9/6489* (2013.01); *H03H 9/725* (2013.01)

(56) References Cited

U.S. PATENT DOCUMENTS

| | | | |
|---|---|---|---|
| 7,446,453 | B1 | 11/2008 | Naumenko et al. |
| 8,035,464 | B1 | 10/2011 | Abbott et al. |
| 8,384,268 | B2 | 2/2013 | Kadota |
| 8,610,518 | B1 | 12/2013 | Solal et al. |
| 8,973,229 | B2 | 3/2015 | Kando et al. |
| 9,190,981 | B2 | 11/2015 | Kando et al. |
| 9,246,533 | B2 | 1/2016 | Fujiwara et al. |
| 9,276,558 | B2 | 3/2016 | Kando et al. |
| 9,391,589 | B2 | 7/2016 | Chamaly et al. |
| 9,407,237 | B2 | 8/2016 | Ikeuchi |
| 9,413,330 | B2 | 8/2016 | Shimizu et al. |
| 9,413,334 | B2 | 8/2016 | Kando |
| 9,419,584 | B2 | 8/2016 | Tsurunari et al. |
| 9,425,766 | B2 | 8/2016 | Fujiwara et al. |
| 9,425,767 | B2 | 8/2016 | Abe et al. |
| 9,431,996 | B2 | 8/2016 | Watanabe et al. |
| 2003/0080831 | A1 | 5/2003 | Naumenko et al. |
| 2003/0151329 | A1* | 8/2003 | Kadota ............... H03H 9/02559 310/313 A |
| 2006/0220494 | A1 | 10/2006 | Miura et al. |
| 2007/0013459 | A1* | 1/2007 | Mimura ............ H03H 9/02559 333/133 |
| 2010/0171389 | A1 | 7/2010 | Yamanouchi et al. |
| 2010/0219905 | A1* | 9/2010 | Nakamura ......... H03H 9/02858 333/133 |
| 2011/0041987 | A1 | 2/2011 | Hori et al. |
| 2011/0109196 | A1 | 5/2011 | Goto et al. |
| 2013/0162368 | A1 | 6/2013 | Tsurunari et al. |
| 2013/0200960 | A1 | 8/2013 | Sauer et al. |
| 2013/0285768 | A1 | 10/2013 | Watanabe et al. |
| 2014/0028414 | A1* | 1/2014 | Chamaly ............ H03H 9/02559 333/193 |
| 2014/0152145 | A1 | 6/2014 | Kando et al. |
| 2014/0203893 | A1 | 7/2014 | Kando et al. |
| 2014/0225684 | A1* | 8/2014 | Kando ............... H03H 9/02559 333/195 |
| 2015/0094000 | A1 | 4/2015 | Aigner et al. |
| 2015/0102705 | A1 | 4/2015 | Iwamoto et al. |
| 2016/0211829 | A1* | 7/2016 | Iwaki ................. H03H 9/02559 |
| 2016/0261249 | A1 | 9/2016 | Takamine |
| 2016/0277003 | A1 | 9/2016 | Kikuchi et al. |
| 2017/0222618 | A1 | 8/2017 | Inoue et al. |
| 2019/0074819 | A1* | 3/2019 | Goto .................... H03H 9/6489 |

OTHER PUBLICATIONS

Abbott, et al., "Characterization of Bonded Wafer for RF Filters with Reduced TCF", 2005 IEEE Ultrasonics Symposium, 2005, pp. 926-929.

Hashimoto, et al. Wideband Love Wave Filters Operating in GHz Range on Cu-Grating/Rotated-YX—LiNbO3—Substrate Structure, 2004 IEEE Ultrasonics Symposium, 2004, pp. 1330-1334.

Bjurstrom, et al, "Temperature compensation of liquid FBAR sensors," Journal of Micomechanics and Microengineering, vol. 17, No. 3, 2007, pp. 651-658.

Kadota, et al., "Improved Quality Factor of Hetero Acoustic Layer (HAL) SAW Resonator Combining LiTaO$_3$ Thin Plate and Quartz Substrate", 2017 IEEE International Ultrasonics Symposium, 2017.

Kawachi, et al., "A Study of Optimum Material for SAW Bonded Wafer," 2012 IEEE International Ultrasonics Symposium Proceedings, 2012, pp. 1260-1263.

Lin, "Temperature Compensation of Aluminum Nitride Lamb Wave Resonators Utilizing the Lowest-Order Symmetric Mode," Electrical Engineering and Computer Sciences University of California at Berkeley, Technical Report No. UCB/EECS-2012-264, Dec. 14, 2012.

Nakahata, et al., "Theoretical Study on SAW Characteristics of Layered Structures Including a Diamond Layer," IEEE Transactions on Ultrasonics, Ferroelectronics, and Frequency Control, vol. 42, No. 2, May 1995, pp. 362-375.

Naumenko, "Solidly Mounted Plate Mode Resonators Based on 42°-48° LT cuts: Loss Mechanisms," 2017 IEEE International Ultrasonics Symposium, 2017.

Naumenko, at al. "Optimal cut of lithium niobate with suppressed Rayleigh-type mode for application in resonator SAW filters," 2008 IEEE International Ultrasonics Symposium Proceedings, 2008, pp. 1013-2017.

Plessky, et al., "Interaction between the Rayleigh-type SAW and the SH-wave in a periodic rating on a 128°-LN substrate," 2010 IEEE International Ultrasonics Symposium Proceedings, 2010, pp. 167-170.

Randles, et al. "Temperature Compensated AIN Based SAW," Journal of Automation and Control Engineering, vol. 2, No. 2, Jun. 2014, pp. 191-194.

Smith, et al, "Temperature Dependence of the Elastic, Piezoelectric, and Dielectric Constants of Lithium Tantalate and Lithium Niobate," Journal of Applied Physics, vol. 42, No. 6, May 1971.

Takai, et al., "I.H.P.SAW Technology and its Application to Microacoustic Components (Invited)", 2017 IEEE International Ultrasonics Symposium, 2017.

International Search Report dated Feb. 9, 2018 in Application No. PCT/US2017/057256.

Written Opinion dated Feb. 9, 2018 in Application No. PCT/US2017/057256.

* cited by examiner

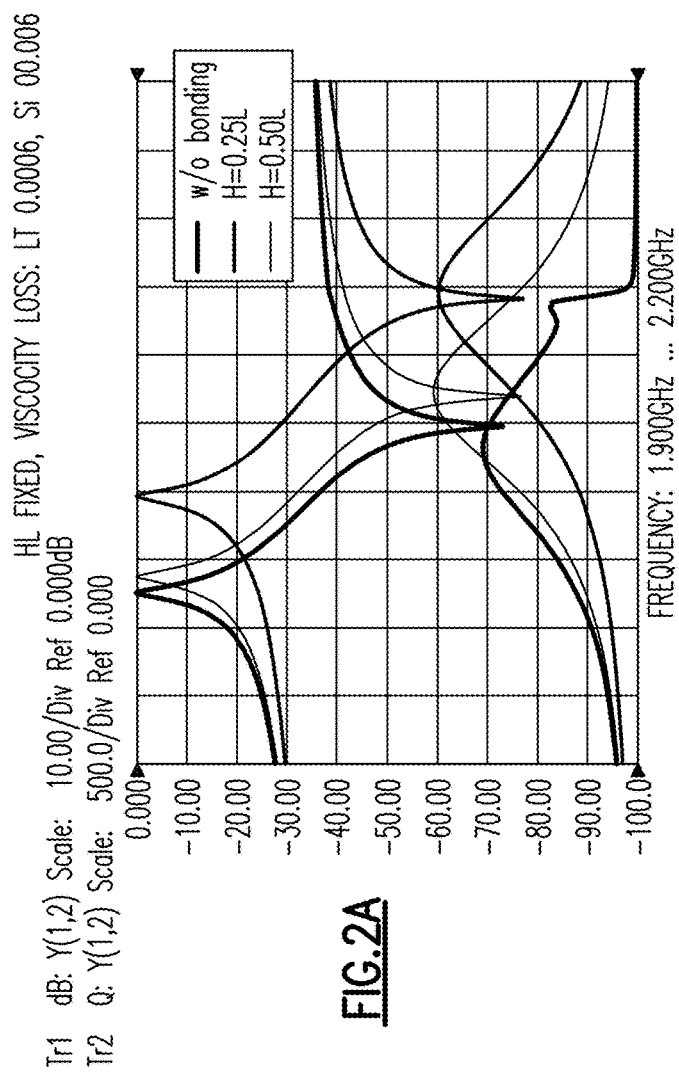
FIG. 2A
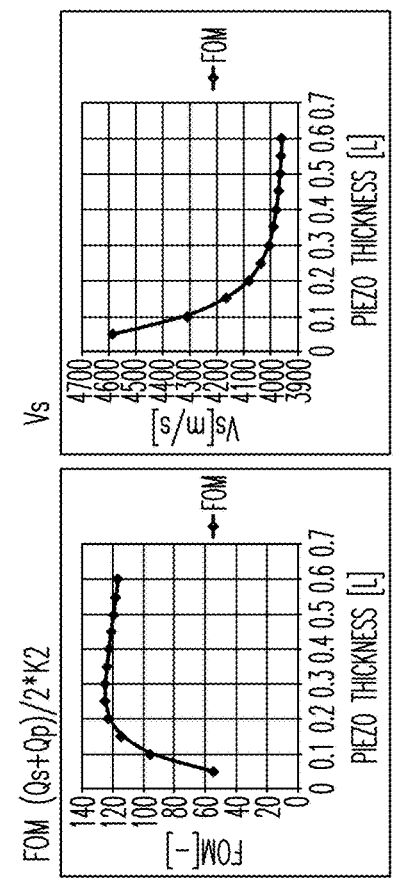
FIG. 2E
FIG. 2D
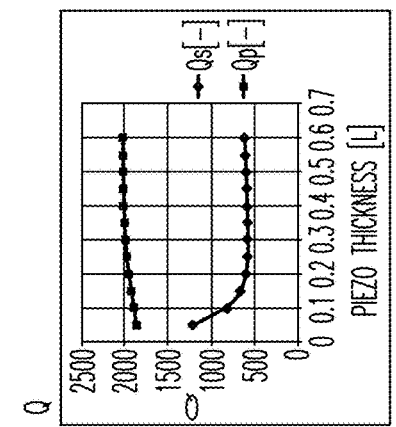
FIG. 2C
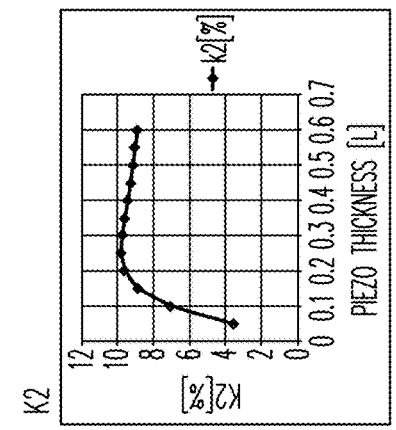
FIG. 2B

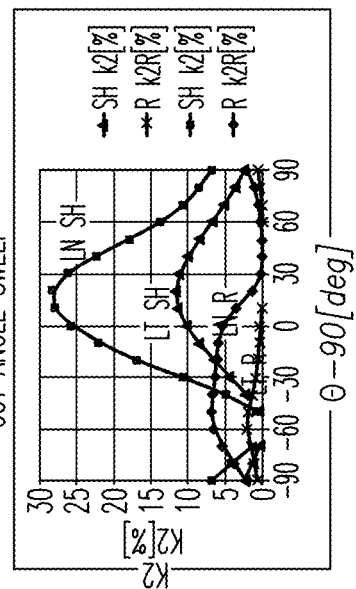
FIG.8A
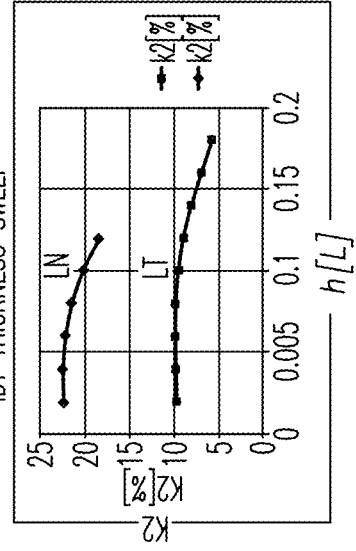
FIG.8B
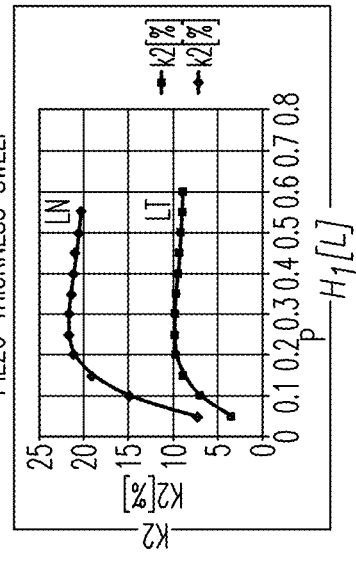
FIG.8C
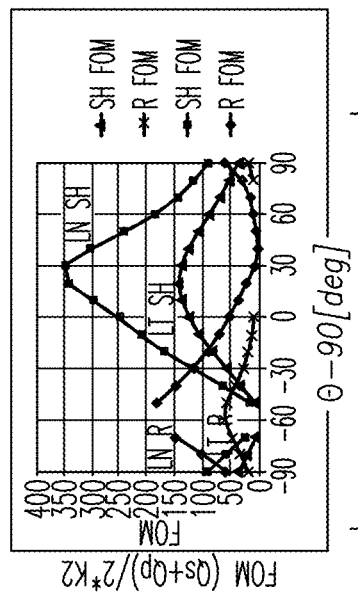
FIG.8D
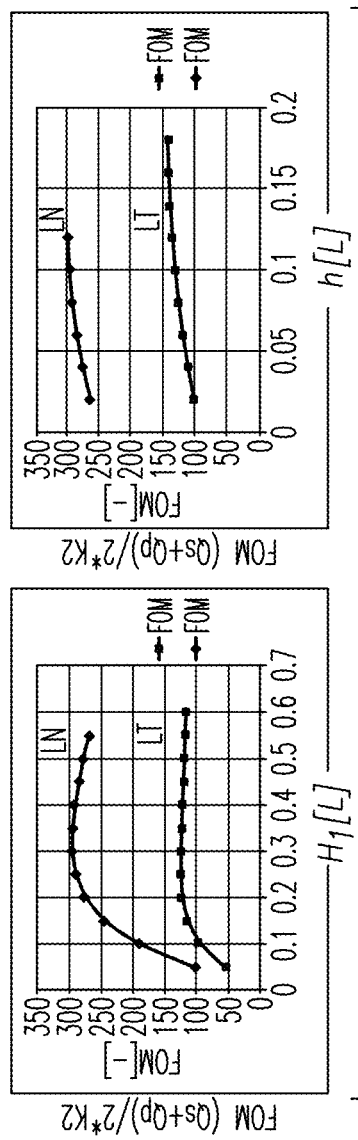
FIG.8E
FIG.8F

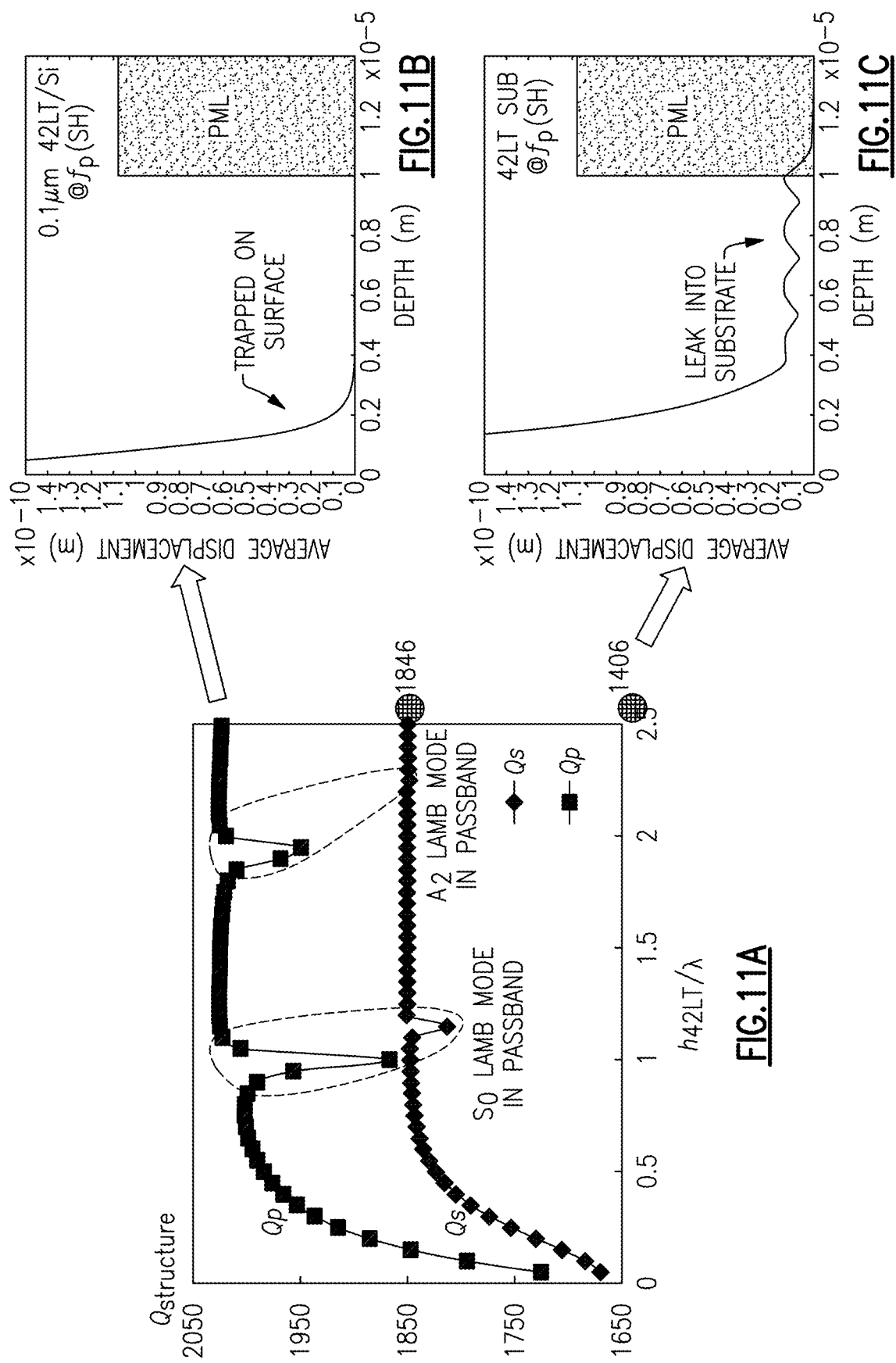

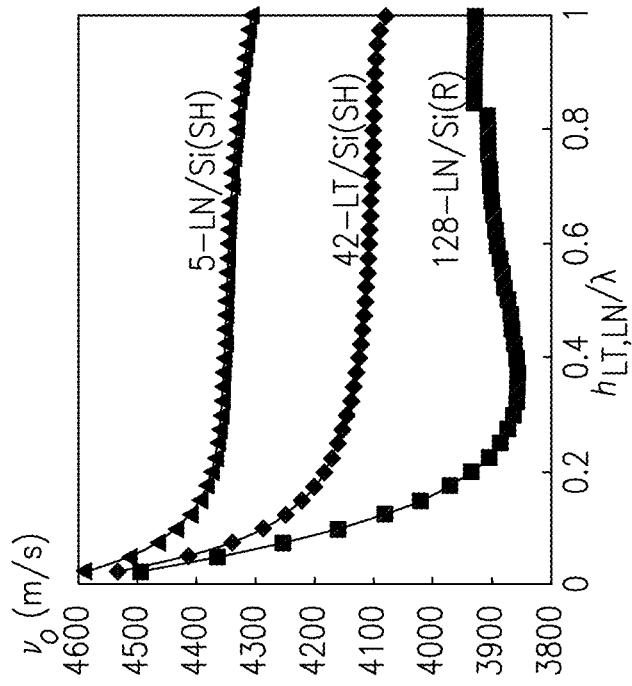
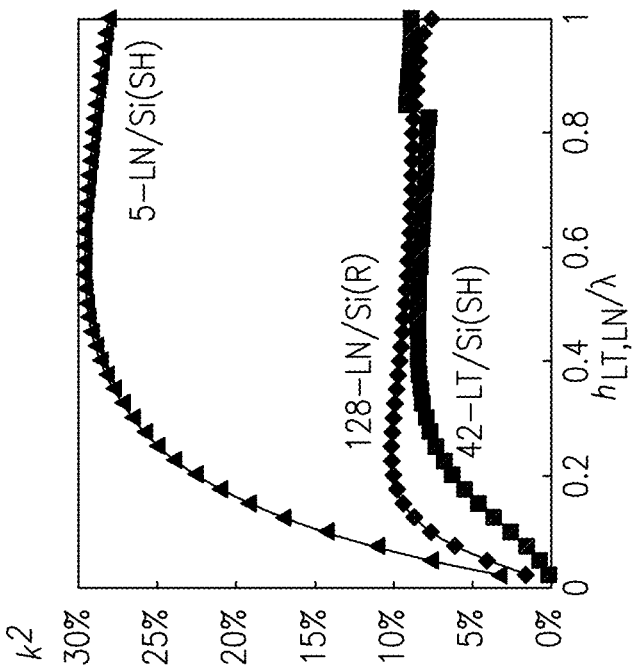
FIG. 17A
FIG. 17B

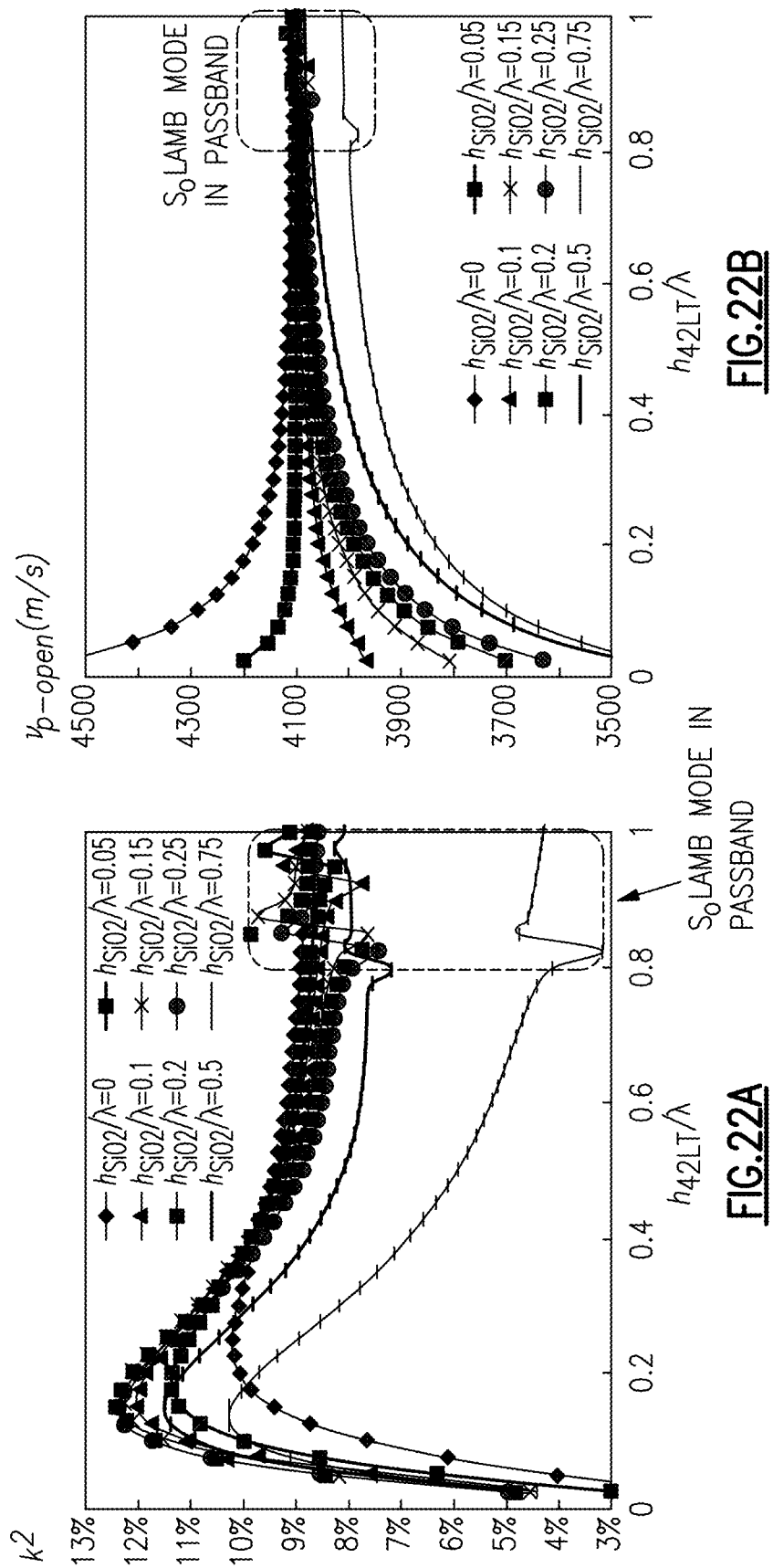

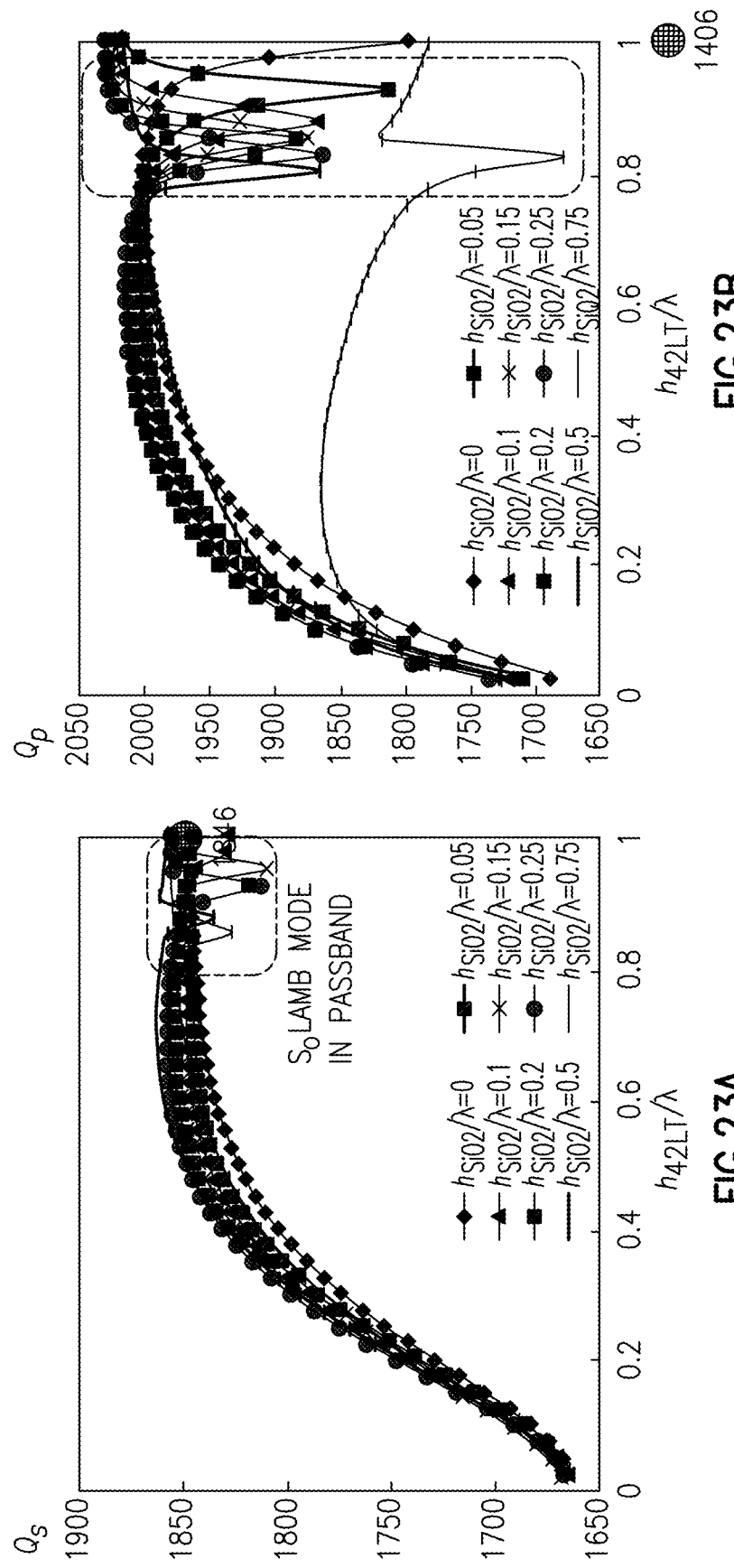

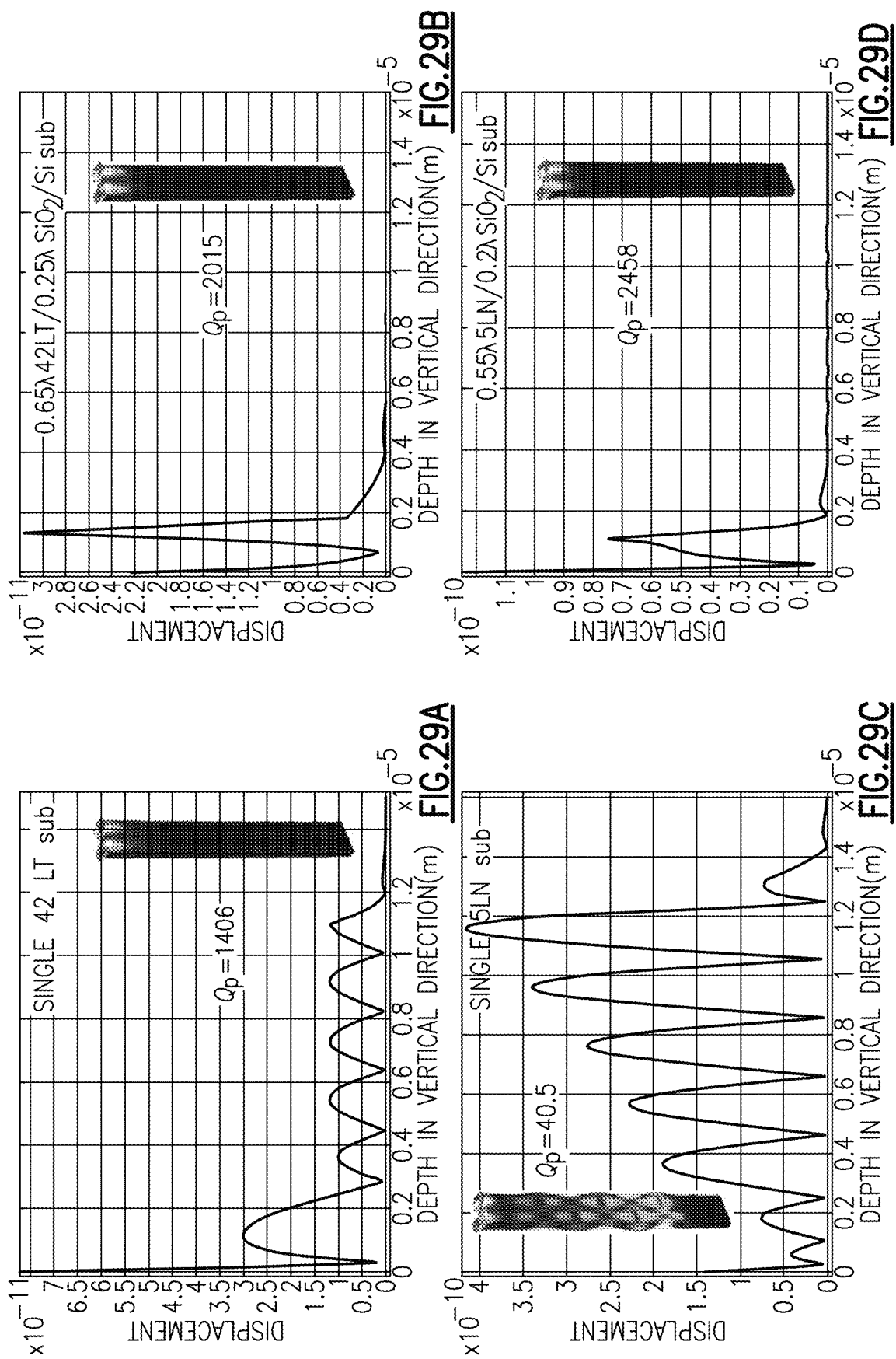

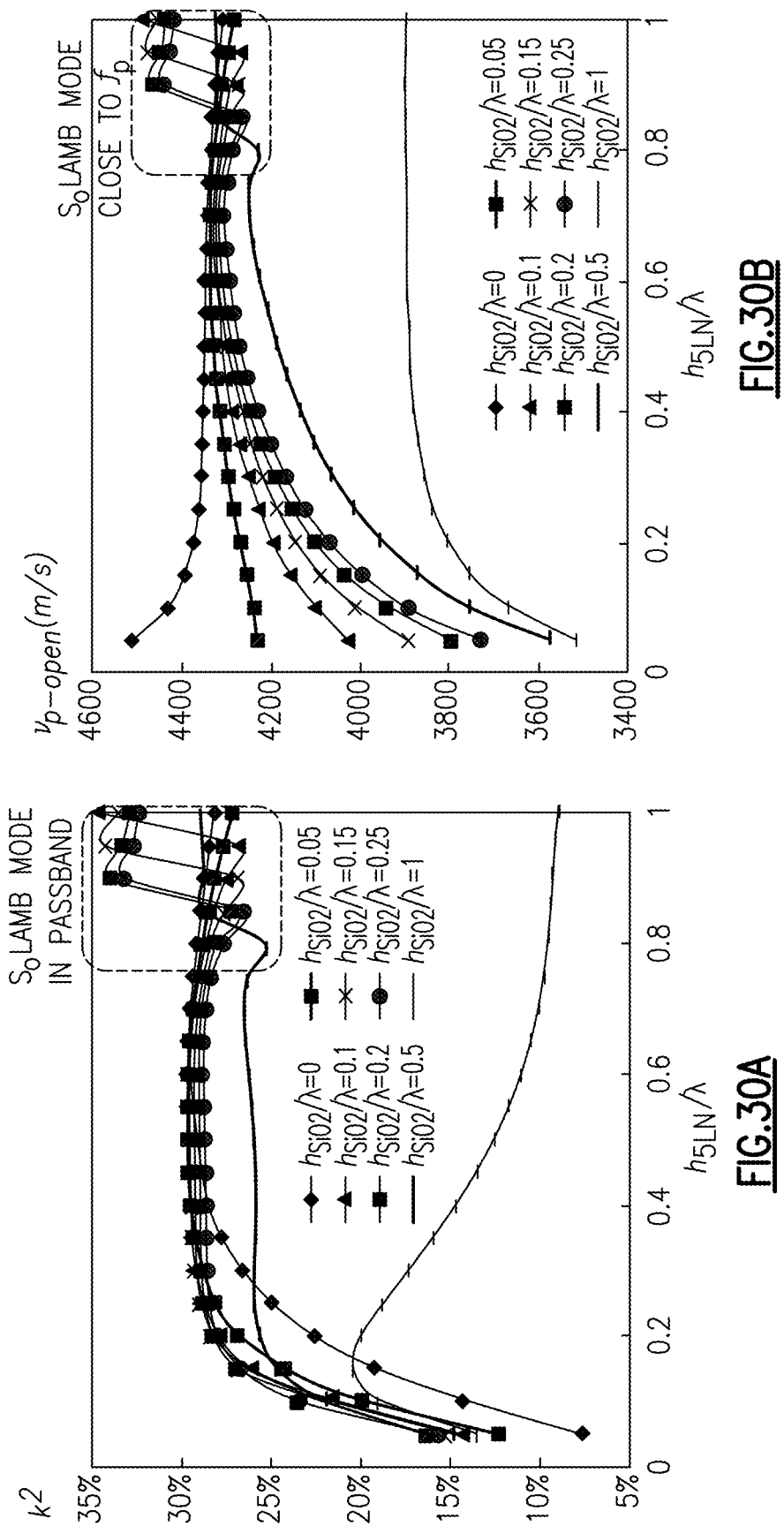

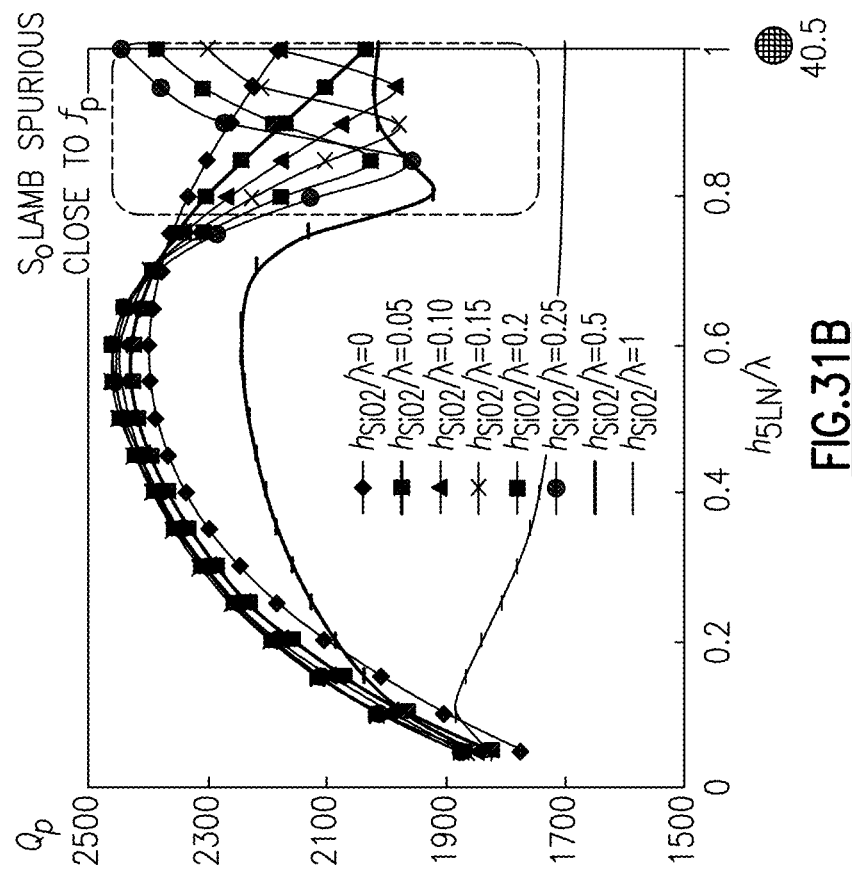
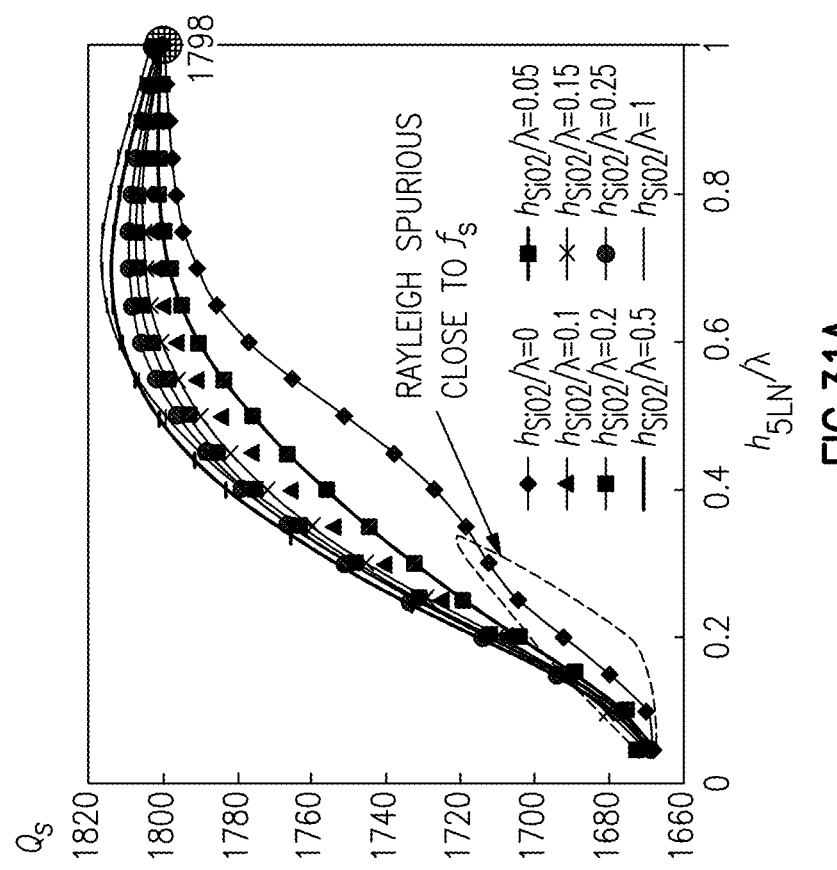
FIG. 31B
FIG. 31A

RAYLEIGH SPURIOUS
CLOSE TO $f_s$ $S_0$ LAMB SPURIOUS
CLOSE TO $f_p$

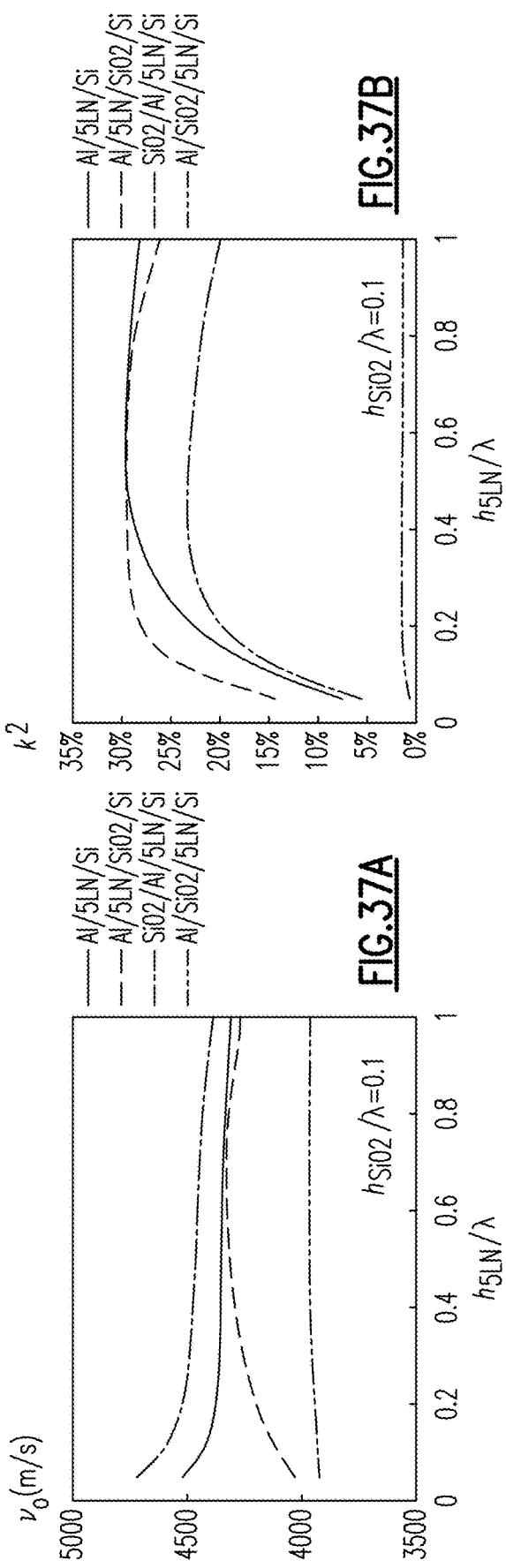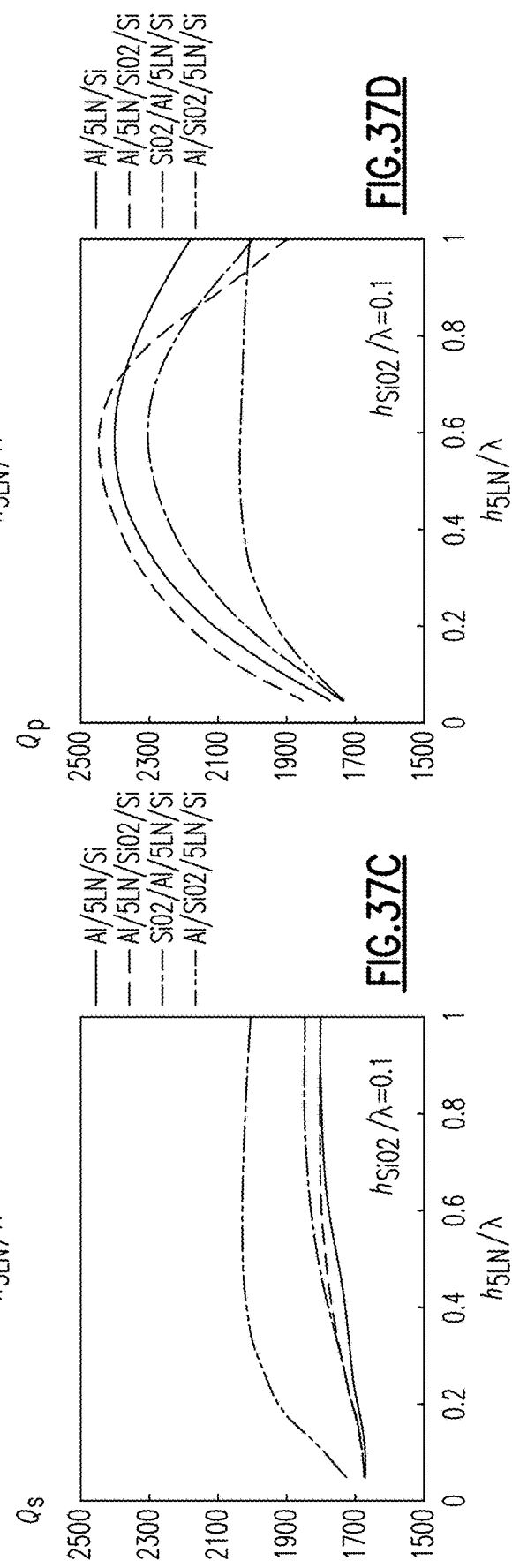

K2 DEPENDENCE OF H1

TCV (CHANGE IN RESONANT FREQUENCY)

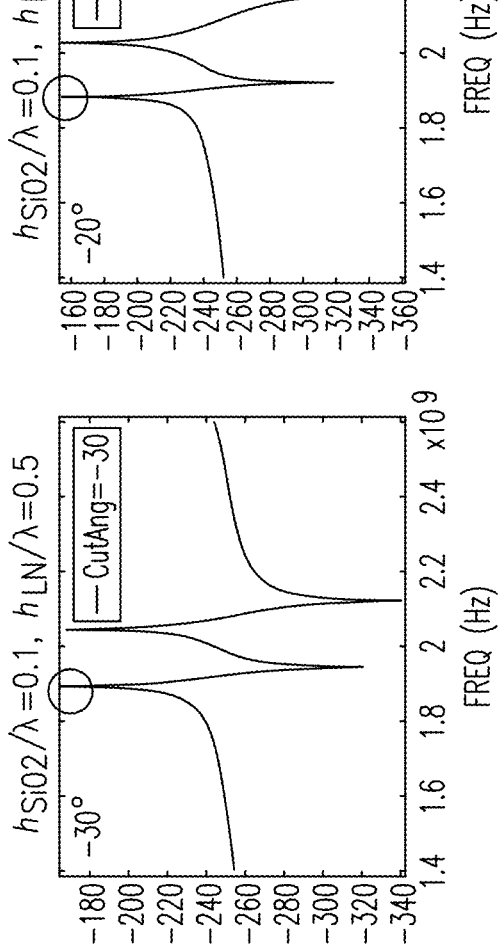
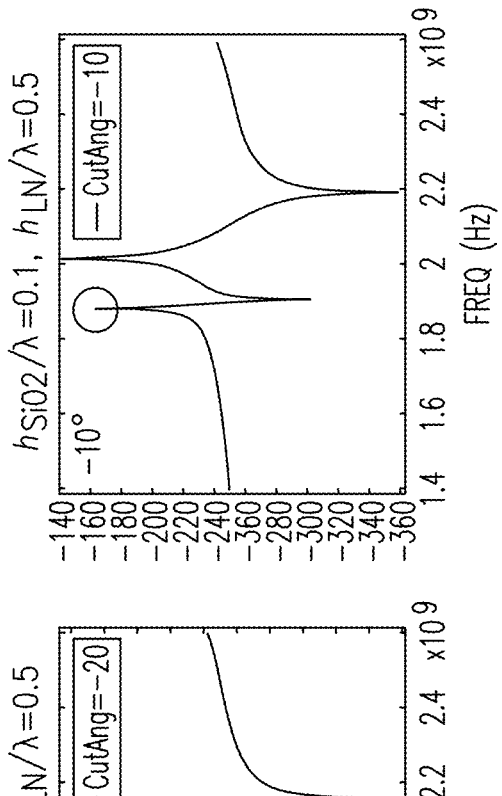
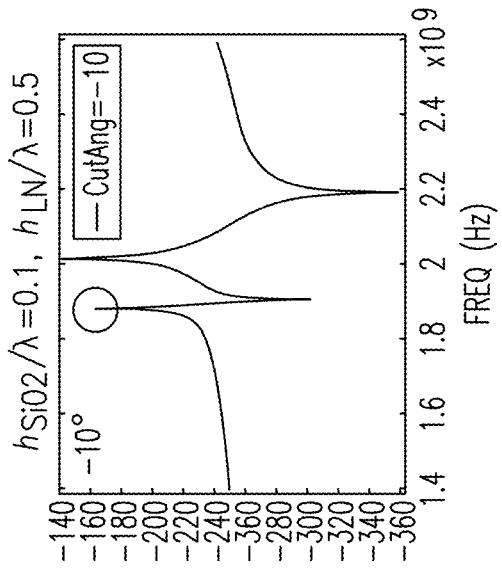
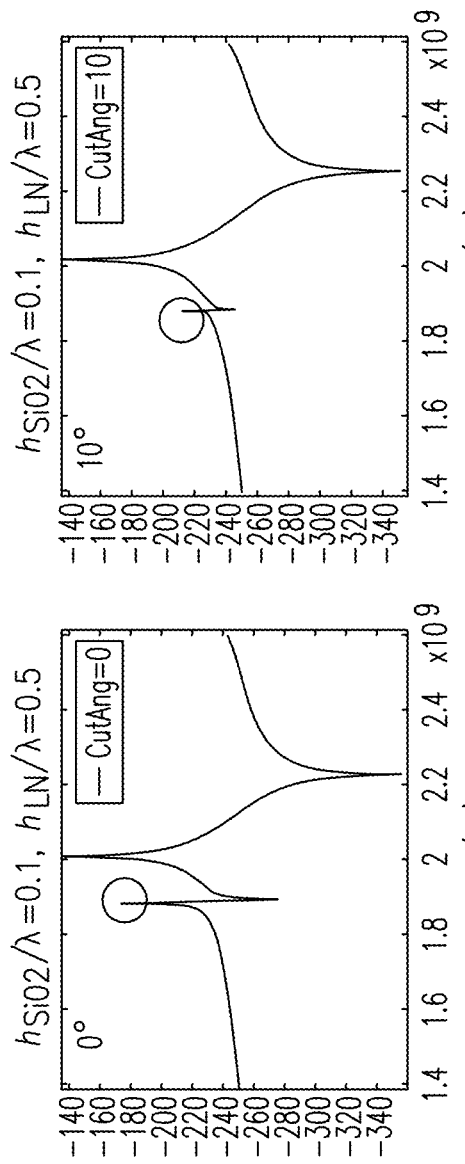
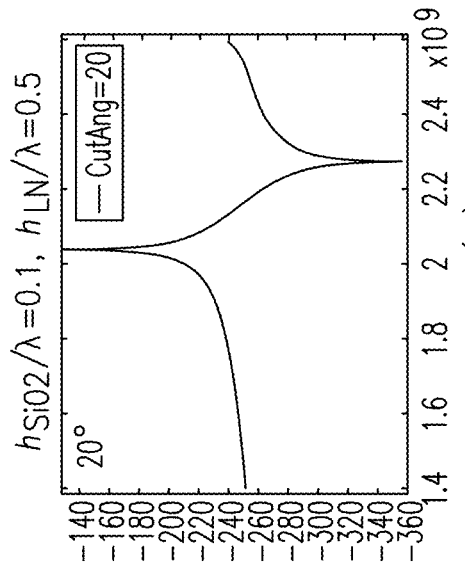
FIG.50A  FIG.50B  FIG.50C  FIG.50D  FIG.50E  FIG.50F

ELASTIC WAVE DEVICE WITH SUB-WAVELENGTH THICK PIEZOELECTRIC LAYER AND HIGH VELOCITY LAYER

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application claims the benefit of priority under 35 U.S.C. § 119(e) of U.S. Provisional Patent Application No. 62/410,804, filed Oct. 20, 2016 and titled "ELASTIC WAVE DEVICE," the disclosure of which is hereby incorporated by reference in its entirety herein. This application claims the benefit of priority under 35 U.S.C. § 119(e) of U.S. Provisional Patent Application No. 62/423,705, filed Nov. 17, 2016 and titled "ELASTIC WAVE DEVICE," the disclosure of which is hereby incorporated by reference in its entirety herein.

BACKGROUND

Technical Field

Embodiments of this disclosure relate to an elastic wave device.

Description of Related Technology

An elastic wave device can implement a surface acoustic wave resonator. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. Surface acoustic wave resonators can implement a surface acoustic wave filter.

Surface acoustic wave resonators can be implemented in radio frequency electronic systems. For instance, filters in a radio frequency front end of a mobile phone can include surface acoustic wave filters. Designing a surface acoustic wave resonator that meets or exceeds the design specifications for such radio frequency systems can be challenging.

SUMMARY OF CERTAIN INVENTIVE ASPECTS

The innovations described in the claims each have several features, no single one of which is solely responsible for its desirable attributes. Without limiting the scope of the claims, some prominent features of this disclosure will now be briefly described.

One aspect of this disclosure is an elastic wave device that includes a piezoelectric layer, an interdigital transducer electrode on the piezoelectric layer, and a high velocity layer in physical contact with the piezoelectric layer. The piezoelectric layer has a cut angle in a cut angle range from −10° to 60°. The interdigital transducer electrode is configured to generate an elastic wave having a wavelength of $\lambda$. The piezoelectric layer has a thickness in a thickness range from $0.35\lambda$ to $0.8\lambda$. The high velocity layer has a higher bulk velocity than a velocity of the elastic wave.

The piezoelectric layer can include a lithium niobate layer. The piezoelectric layer can include a lithium tantalate layer. The thickness of the piezoelectric layer can be in a range from $0.4\lambda$ to $0.75\lambda$.

The high velocity layer can be a silicon layer.

The cut angle of the piezoelectric layer can be in a range from −10° to 50°. The cut angle of the piezoelectric layer can be in a range from −10° to 30°. The cut angle of the piezoelectric layer can be in a range from 0° to 30°. The cut angle of the piezoelectric layer can be in a range from 10° to 30°. The cut angle of the piezoelectric layer can be in a range from 20° to 30°. The cut angle of the piezoelectric layer can be in a range from 30° to 40°.

The interdigital transducer electrode can include aluminum. In some instances, the material of the interdigital transducer electrode can be an aluminum alloy. The interdigital transducer electrode can have a thickness in a second thickness range from $0.02\lambda$ to $0.1\lambda$.

The elastic wave device can further include a temperature compensating layer arranged such that the interdigital transducer electrode is disposed between the temperature compensating layer and the piezoelectric layer. The temperature compensating layer can include silicon dioxide. The temperature compensating layer can have a thickness of less than $0.5\lambda$.

Another aspect of this disclosure is an elastic wave device that includes a lithium niobate layer, an interdigital transducer electrode on the lithium niobate layer, and a silicon substrate in physical contact with the lithium niobate layer. The lithium niobate layer has a cut angle in a cut angle range from −10° to 60°. The interdigital transducer electrode is configured to generate an elastic wave having a wavelength of $\lambda$. The lithium niobate layer has a thickness in a thickness range from $0.35\lambda$ to $0.8\lambda$.

The cut angle of the lithium niobate layer can be a range from −10° to 30°. The cut angle of the lithium niobate layer can be a range from 15° to 35°. The cut angle of the lithium niobate layer can be a range from 20° to 30°.

The thickness of the lithium niobate layer can be in a range from $0.4\lambda$ to $0.75\lambda$.

The interdigital transducer electrode can include aluminum. The interdigital transducer electrode can have a thickness in a second thickness range from $0.02\lambda$ to $0.1\lambda$.

The elastic wave device can further include a temperature compensating layer arranged such that the interdigital transducer electrode is disposed between the temperature compensating layer and the lithium niobate layer. The temperature compensating layer can include silicon dioxide. The temperature compensating layer can have a thickness of less than $0.5\lambda$.

Another aspect of this disclosure is an elastic wave device that includes a lithium niobate layer, an interdigital transducer electrode on the lithium niobate layer, a high velocity layer having a higher bulk velocity than a velocity of the elastic wave, and a temperature compensating layer disposed between the high velocity layer and the lithium niobate layer. The lithium niobate layer has a cut angle in a cut angle range from −10° to 60°. The interdigital transducer electrode is configured to generate an elastic wave having a wavelength of $\lambda$. The lithium niobate layer has a thickness in a thickness range from $0.35\lambda$ to $0.8\lambda$. The high velocity layer is configured to inhibit the elastic wave from leaking from the lithium niobate layer at anti-resonance. The temperature compensating layer has a positive temperature coefficient of frequency. The elastic wave device is arranged so as to have an electromechanical coupling coefficient of at least 26%.

The high velocity layer can be a silicon layer.

The temperature compensating layer can be a silicon dioxide layer. The temperature compensating layer can have a thickness of less than $0.5\lambda$.

The interdigital transducer electrode can include aluminum.

The cut angle of the lithium niobate layer can be in a range from 15° to 35°. The cut angle of the lithium niobate layer can be in a range from 20° to 30°. The cut angle of the lithium niobate layer can be in a range from −10° to 30°.

The thickness of the lithium niobate layer can be in a range from 0.4$\lambda$ to 0.75$\lambda$.

The electromechanical coupling coefficient can be at least 28%. The electromechanical coupling coefficient can be less than 30%. The electromechanical coupling coefficient can be less than 35%.

A quality factor of the acoustic wave device can be in a range from 2000 to 5000.

Another aspect of this disclosure is an elastic wave device that includes a lithium tantalate layer, an interdigital transducer electrode on the lithium tantalate layer, a high velocity layer having a higher bulk velocity than a velocity of the elastic wave, and a temperature compensating layer disposed between the high velocity layer and the lithium tantalate layer. The lithium tantalate layer has a cut angle in a cut angle range from −10° to 50°. The interdigital transducer electrode is configured to generate an elastic wave having a wavelength of $\lambda$. The lithium tantalate layer has a thickness that is less than k. The high velocity layer is configured to inhibit the elastic wave from leaking from the lithium tantalate layer at anti-resonance. The temperature compensating layer has a positive temperature coefficient of frequency.

The high velocity layer can be a silicon layer.

The temperature compensating layer can be a silicon dioxide layer. The temperature compensating layer can have a thickness of less than 0.5$\lambda$.

The interdigital transducer electrode can include aluminum. The interdigital transducer electrode can have a thickness in a second thickness range from 0.02$\lambda$ to 0.1$\lambda$.

The cut angle of the lithium tantalate layer can be in a range from −10° to 30°. The cut angle of the lithium tantalate layer can be in a range from 0° to 30°. The cut angle of the lithium tantalate layer can be in a range from 10° to 30°. The cut angle of the lithium tantalate layer can be in a range from 30° to 40°. The cut angle of the lithium tantalate layer can be in a range from 15° to 35°. The cut angle of the lithium tantalate layer can be in a range from 20° to 30°.

The thickness of the lithium tantalate layer can be in a range from 0.25, to 0.8$\lambda$. The thickness of the lithium tantalate layer can be in a range from 0.35$\lambda$ to 0.8$\lambda$. The thickness of the lithium tantalate layer can be in a range from 0.4$\lambda$ to 0.75$\lambda$.

Another aspect of this disclosure is an elastic wave device that includes a piezoelectric layer, an interdigital transducer electrode on the piezoelectric layer, and a high velocity layer having a higher bulk velocity than a velocity of the elastic wave and being configured to inhibit the elastic wave from leaking from the piezoelectric layer at anti-resonance. The piezoelectric layer has a cut angle in a cut angle range from −10° to 60°. The interdigital transducer electrode is configured to generate an elastic wave having a wavelength of $\lambda$. The interdigital transducer electrode has a thickness in a first thickness range from 0.02$\lambda$ to 0.1$\lambda$. The piezoelectric layer has a thickness that is less than k.

The high velocity layer can be a silicon layer.

The piezoelectric layer can include a lithium niobate layer. The piezoelectric layer can include a lithium tantalate layer.

The thickness of the interdigital transducer electrode can be between 0.05$\lambda$ and 0.1$\lambda$. The interdigital transducer electrode can include aluminum.

The cut angle of the piezoelectric layer can be in a range from −10° to 30°. The cut angle of the piezoelectric layer can be in a range from 0° to 30°. The cut angle of the piezoelectric layer can be in a range from 15° to 35°. The cut angle of the piezoelectric layer can be in a range from 20° to 30°. The cut angle of the piezoelectric layer can be in a range from 30° to 40°.

The thickness of the piezoelectric layer can be in a second thickness range from 0.25$\lambda$ to 0.8$\lambda$. The thickness of the piezoelectric layer can be in a range from 0.35$\lambda$ to 0.8$\lambda$. The thickness of the piezoelectric layer can be range from 0.4$\lambda$ to 0.75$\lambda$.

The high velocity layer can be bonded to and in physical contact with the piezoelectric layer. The high velocity layer can be a silicon substrate.

The elastic wave device can further include a temperature compensating layer disposed between the high velocity layer and the piezoelectric layer. The temperature compensating layer can include silicon dioxide. The temperature compensating layer can have a thickness of less than 0.5$\lambda$.

The elastic wave device can further include a temperature compensating layer arranged such that the interdigital transducer electrode is disposed between the temperature compensating layer and the piezoelectric layer. The temperature compensating layer can include silicon dioxide. The temperature compensating layer can have a thickness of less than 0.5$\lambda$.

Another aspect of this disclosure is an elastic wave device that includes a piezoelectric layer, an interdigital transducer electrode on the piezoelectric layer, a silicon layer configured to inhibit the elastic wave from leaking from the piezoelectric layer at anti-resonance, and a temperature compensating layer having a positive temperature coefficient of frequency. The piezoelectric layer has a cut angle in a cut angle range from −10° to 60°. The interdigital transducer electrode is configured to generate an elastic wave having a wavelength of $\lambda$. The piezoelectric layer has a thickness in a thickness range from 0.25$\lambda$ to 0.8$\lambda$. The piezoelectric layer is disposed between the silicon layer and the interdigital transducer electrode. The interdigital transducer electrode is disposed between the temperature compensating layer and the piezoelectric layer.

The temperature compensating layer can have a thickness of less than 0.5$\lambda$. The temperature compensating layer can include silicon dioxide. The temperature compensating layer can include tellurium dioxide. The temperature compensating layer can include SiOF.

The cut angle of the piezoelectric layer can be between −10° and 30°. The cut angle of the piezoelectric layer can be between 15° and 35°. The cut angle of the piezoelectric layer can be between 20° and 30°.

The thickness of the piezoelectric layer can be between 0.35$\lambda$ to 0.8$\lambda$. The thickness of the piezoelectric layer can be between 0.4$\lambda$ to 0.75$\lambda$.

The interdigital transducer electrode can have a thickness between 0.02$\lambda$ and 0.1$\lambda$. The interdigital transducer electrode can include aluminum.

The piezoelectric layer can be a lithium niobate layer. The piezoelectric layer can be a lithium tantalate layer.

The silicon layer can be physical contact with the piezoelectric layer.

A filter can include an elastic wave device in accordance with any suitable principles and advantages discussed herein. A duplexer can include an elastic wave device in accordance with any suitable principles and advantages discussed herein.

A packaged module can include an elastic wave device in accordance with any suitable principles and advantages discussed herein. The packaged module can further include a radio frequency switch. The packaged module can further include a power amplifier.

A wireless communication device can include an elastic wave device in accordance with any suitable principles and advantages discussed herein. The wireless communication device can be a mobile phone. The elastic wave device can be included in a filter and/or a frequency multiplexing circuit, such as a duplexer.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 15/787,568, titled "ELASTIC WAVE DEVICE WITH SUB-WAVELENGTH THICK PIEZOELECTRIC LAYER," filed on even date herewith, the entire disclosure of which is hereby incorporated by reference herein.

BRIEF DESCRIPTION OF THE DRAWINGS

Embodiments of this disclosure will be described, by way of non-limiting example, with reference to the accompanying drawings.

FIGS. 2A to 2E are graphs of simulations of an elastic wave device of FIG. 1 that includes a lithium tantalate piezoelectric layer on a silicon substrate, in which a thickness of the lithium tantalate piezoelectric layer is varied. FIG. 2A is a graph of a frequency response for various lithium tantalate thicknesses and for a corresponding device without a silicon substrate. FIG. 2B is a graph of electromechanical coupling coefficient versus lithium tantalate thickness. FIG. 2C is a graph of quality factor versus lithium tantalate thickness. FIG. 2D is a graph of figure of merit versus lithium tantalate thickness. FIG. 2E is a graph of velocity versus lithium tantalate thickness.

FIG. 3A is a graph of a frequency response for various interdigital transducer electrode thicknesses and for a corresponding device without a silicon substrate. FIG. 3B is a graph of electromechanical coupling coefficient versus interdigital transducer electrode thickness. FIG. 3C is a graph of quality factor versus interdigital transducer electrode thickness. FIG. 3D is a graph of figure of merit versus interdigital transducer electrode thickness. FIG. 3E is a graph of velocity versus interdigital transducer electrode thickness.

FIG. 4A is a graph of a frequency response for various cut angles and for a corresponding device without a silicon substrate. FIG. 4B is a graph of electromechanical coupling coefficient versus cut angle. FIG. 4C is a graph of quality factor versus cut angle. FIG. 4D is a graph of figure of merit versus cut angle. FIG. 4E is a graph of velocity versus cut angle.

FIG. 5A is a graph of a frequency response for various lithium niobate thicknesses and for a corresponding device without a silicon substrate. FIG. 5B is a graph of electromechanical coupling coefficient versus lithium niobate thickness. FIG. 5C is a graph of quality factor versus lithium niobate thickness. FIG. 5D is a graph of figure of merit versus lithium niobate thickness. FIG. 5E is a graph of velocity versus lithium niobate thickness.

FIG. 6A is a graph of a frequency response for various interdigital transducer electrode thicknesses and for a corresponding device without a silicon substrate. FIG. 6B is a graph of electromechanical coupling coefficient versus interdigital transducer electrode thickness. FIG. 6C is a graph of quality factor versus interdigital transducer electrode thickness. FIG. 6D is a graph of figure of merit versus interdigital transducer electrode thickness. FIG. 6E is a graph of velocity versus interdigital transducer electrode thickness.

FIG. 7A is a graph of a frequency response for various cut angles and for a corresponding device without a silicon substrate. FIG. 7B is a graph of electromechanical coupling coefficient versus cut angle. FIG. 7C is a graph of quality factor versus cut angle. FIG. 7D is a graph of figure of merit versus cut angle. FIG. 7E is a graph of velocity versus cut angle.

FIGS. 8A to 8F compare simulation results for an elastic wave device of FIG. 1 that includes a lithium tantalate piezoelectric layer with an elastic wave device FIG. 1 that includes a lithium niobate piezoelectric layer. FIG. 8A is a graph electromechanical coupling coefficient versus piezoelectric layer thickness. FIG. 8B is a graph of electromechanical coupling coefficient versus interdigital transducer electrode thickness. FIG. 8C is a graph of electromechanical coupling coefficient versus cut angle. FIG. 8D is a graph figure of merit versus piezoelectric layer thickness. FIG. 8E is a graph of figure of merit versus interdigital transducer electrode thickness. FIG. 8F is a graph of figure of merit versus cut angle.

FIG. 11A is a graph of the quality factor versus piezoelectric layer thickness for an elastic wave device of FIG. 1 with an LT piezoelectric layer with a 42° cut angle on a silicon substrate. FIG. 11B is a graph that illustrates that waves can be trapped on the surface of an elastic wave device of FIG. 1 with an LT piezoelectric layer with a 42° cut angle on a silicon substrate. FIG. 11C illustrates that elastic waves can leak into the substrate for a similar elastic wave device that does not include a silicon substrate.

FIG. 12A illustrates a spurious mode for a lithium tantalate thickness of $0.05\lambda$. FIG. 12B illustrates a spurious mode for a lithium tantalate thickness of $0.75\lambda$. FIG. 12C illustrates a spurious mode for a lithium tantalate thickness of $0.25\lambda$. FIG. 12D illustrates a spurious mode for a lithium tantalate thickness of $1\lambda$.

FIG. 13A illustrates an impact of IDT electrode thickness on Q. FIG. 13B illustrates an impact of IDT electrode thickness on phase velocity (Vp). FIG. 13C illustrates an impact of IDT electrode thickness on $k^2$.

FIG. 15A illustrates $k^2$ as a function of thickness of the LN layer. FIG. 15B illustrates Qp as a function of thickness of the LN layer. FIG. 15C illustrates Qs as a function of thickness of the LN layer. FIG. 15D illustrates $v_0$ as a function of thickness of the LN layer.

FIG. 16A corresponds to a cut angle of $-30°$. FIG. 16B corresponds to a cut angle of $-20°$. FIG. 16C corresponds to a cut angle of $-10°$. FIG. 16D corresponds to a cut angle of $0°$. FIG. 16E corresponds to a cut angle of $10°$. FIG. 16F corresponds to a cut angle of $20°$. FIG. 16G corresponds to a cut angle of $30°$. FIG. 16H corresponds to a cut angle of $40°$. FIG. 16I corresponds to a cut angle of $50°$. FIG. 16J corresponds to a cut angle of $60°$. FIG. 16K corresponds to a cut angle of $70°$.

FIG. 17A is a graph of $k^2$ for certain cut angles of an elastic wave device of FIG. 1 with a high velocity layer that is a silicon substrate.

FIG. 17B is a graph of $v_0$ for certain cut angles of an elastic wave device of FIG. 1 with a high velocity layer that is a silicon substrate.

FIG. 18A illustrates a frequency response for a LN layer having a thickness of $0.7\lambda$. FIG. 18B illustrates a frequency response for a LN layer having a thickness of $1\lambda$. FIG. 18C illustrates a frequency response for a LN layer having a theoretically infinite thickness.

FIG. 20A is a graph of Qs as a function of thickness of certain piezoelectric layers. FIG. 20B is a graph of Qp as a function of thickness of certain piezoelectric layers.

FIG. 22A is a graph of $k^2$ as a function of 42LT thickness for various thicknesses of a silicon dioxide layer of the elastic wave device of FIG. 21.

FIG. 22B is a graph of $v_{P\text{-}OPEN}$ as a function of 42LT thickness for various thicknesses of a silicon dioxide layer of the elastic wave device of FIG. 21.

FIG. 23A illustrates a relationship between Qs and 42LT thicknesses for various silicon dioxide layer thicknesses of the elastic wave device of FIG. 21.

FIG. 23B illustrates a relationship between Qp and 42LT thicknesses for various silicon dioxide layer thicknesses of the elastic wave device of FIG. 21.

FIG. 24A corresponds to 42LT with a thickness of $0.25\lambda$. FIG. 24B corresponds to 42LT with a thickness of $0.5\lambda$.

FIG. 25A shows a relatively clean frequency response for a 42LT layer with a thickness of $0.15\lambda$ and a silicon dioxide thickness of $0.2\lambda$. FIG. 25B shows a Rayleigh wave in a pass band when the 42LT layer has a thickness of less than $0.03\lambda$. FIG. 25C shows a plate wave in a pass band when the 42LT layer has a thickness of greater than $0.8\lambda$.

FIGS. 29A to 29D illustrate displacement being confined to the surface of the piezoelectric layer for 42LT and 5LN piezoelectric layers in the elastic wave device of FIG. 21 while displacement is not as confined to the surface in similar elastic wave devices without a high velocity layer and a temperature compensating layer. FIG. 29A illustrates displacement in an elastic wave device with a 42LT substrate. FIG. 29B illustrates displacement in an elastic wave device of FIG. 21 with a 42LT piezoelectric layer, a silicon dioxide temperature compensating layer, and a high velocity layer that is a silicon substrate. FIG. 29C illustrates displacement in an elastic wave device with a 5LN substrate. FIG. 29D illustrates displacement in an elastic wave device of FIG. 21 with a 5LN piezoelectric layer, a silicon dioxide temperature compensating layer, and a high velocity layer that is a silicon substrate.

FIG. 30A is a graph of $k^2$ as a function of 5LN thickness for various thicknesses of a silicon dioxide layer of the elastic wave device of FIG. 21.

FIG. 30B is a graph of $v_{P\text{-}OPEN}$ as a function of 5LN thickness for various thicknesses of a silicon dioxide layer of the elastic wave device of FIG. 21.

FIG. 31A illustrates a relationship between Qs and 5LN thicknesses for various silicon dioxide layer thicknesses of the elastic wave device of FIG. 21. FIG. 31B illustrates a relationship between Qp and 5LN thicknesses for various silicon dioxide layer thicknesses of the elastic wave device of FIG. 21.

FIG. 32A corresponds to a 5LN with a thickness of 0.25λ. FIG. 32B corresponds to a 5LN with a thickness of 0.5λ.

FIG. 33A relates to 5LN/Si elastic wave device with a LN layer that is 0.25λ thick. FIG. 33B relates to 5LN/Si elastic wave device with a LN layer that is 1λ thick. FIG. 33C relates to a 5LN/SiO$_2$/Si elastic wave device.

FIGS. 37A to 37F are graphs that compare various parameters for elastic wave devices with a silicon dioxide layer in various positions. FIG. 37A is a graph of Vo as a function of piezoelectric layer height. FIG. 37B is a graph of $k^2$ as a function of piezoelectric layer height. FIG. 37C is a graph of Qs as a function of piezoelectric layer height. FIG. 37D is a graph of Qp as a function of piezoelectric layer height. FIG. 37E is a graph of Qavg as a function of piezoelectric layer height. FIG. 37F is a graph of FOM as a function of piezoelectric layer height.

FIG. 39A corresponds to a cut angle of −30°. FIG. 39B corresponds to a cut angle of −20°. FIG. 39C corresponds to a cut angle of −10°. FIG. 39D corresponds to a cut angle of 0°. FIG. 39E corresponds to a cut angle of 10°. FIG. 39F corresponds to a cut angle of 20°. FIG. 39G corresponds to a cut angle of 30°. FIG. 39H corresponds to a cut angle of 40°. FIG. 39I corresponds to a cut angle of 50°. FIG. 39J corresponds to a cut angle of 60°. FIG. 39K corresponds to a cut angle of 70°. FIG. 39L corresponds to a cut angle of 80°.

FIG. 41A is a graph of $k^2$ as a function of LN thickness for various thicknesses of the dielectric layer. FIG. 41B is a graph of temperature coefficient of velocity (TCV) as a function of LN thickness for various thicknesses of the dielectric layer.

FIG. 42A corresponds to LN having a cut angle of 0°. FIG. 42B corresponds to LN having a cut angle of 10°. FIG. 42C corresponds to LN having a cut angle of 20°. FIG. 42D corresponds to LN having a cut angle of 30°.

FIG. 43A corresponds to a 5LN piezoelectric layer with a thickness of 0.25λ. FIG. 43B corresponds to a 5LN piezoelectric layer with a thickness of 0.5λ.

FIG. 46A corresponds to a 42LT piezoelectric layer with a thickness of 0.25λ. FIG. 46B corresponds to a 42LT piezoelectric layer with a thickness of 0.5λ.

FIGS. 50A to 50L illustrate admittance over frequency for various cut angle of LN in an elastic wave device of FIG. 40 that includes a silicon dioxide layer over an LN piezoelectric layer on a silicon substrate. FIG. 50A corresponds to a cut angle of −30°. FIG. 50B corresponds to a cut angle of −20°.

FIG. 50C corresponds to a cut angle of −10°. FIG. 50D corresponds to a cut angle of 0°. FIG. 50E corresponds to a cut angle of 10°. FIG. 50F corresponds to a cut angle of 20°. FIG. 50G corresponds to a cut angle of 30°. FIG. 50H corresponds to a cut angle of 40°. FIG. 50I corresponds to a cut angle of 50°. FIG. 50J corresponds to a cut angle of 60°. FIG. 50K corresponds to a cut angle of 70°. FIG. 50L corresponds to a cut angle of 80°.

DETAILED DESCRIPTION OF CERTAIN EMBODIMENTS

Figure 1:
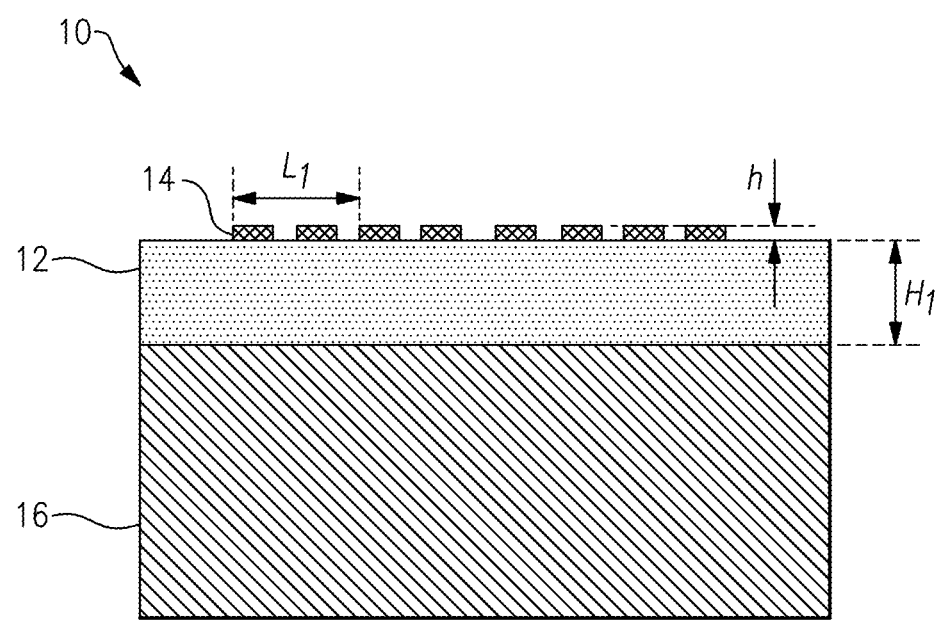
FIG. 1 is a cross-sectional view of an elastic wave device according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Elastic wave devices that include lithium niobate ($LiNbO_3$) with a relatively low cut angle can have a relatively large electromechanical coupling coefficient ($k^2$). Such devices can operate in a leaky surface acoustic wave mode in which shear horizontal (SH) waves leak into a substrate under the lithium niobate layer at anti-resonance (fp). At an anti-resonance frequency, an oscillation amplitude can be approximately zero. This can cause the quality factor (Q) of such devices to be relatively low. Q can represent a ratio of stored power to dissipated power. Q can be frequency dependent. A quality factor at resonance (Qs) can be different than a quality factor at anti-resonance (Qp). With a relatively low Q, such elastic wave devices can be unsuitable for certain filter applications. Any of the elastic wave devices discussed herein can implement a surface acoustic wave (SAW) resonator. Thus, a SAW resonator can be implemented in accordance with any suitable principles and advantages discussed herein.

Copper (Cu) electrodes and gratings can be used to lower a phase velocity of a leaky surface acoustic wave to prevent leakage from a piezoelectric layer, such as a lithium niobate layer. This can create a less leaky SH wave. Using heavy electrodes has resulted in difficulty in sufficiently reducing leakage from a piezoelectric layer and achieving a Q that is desirable for use in a filter. In addition, Rayleigh wave spurs can be relatively close to resonance in such approaches, which can be undesirable.

Aspects of this disclosure relate to using a silicon (Si) substrate to prevent leakage from a piezoelectric layer of an elastic wave device at anti-resonance. A bulk velocity of the silicon substrate can be significantly higher than a velocity of the SH wave, which can prevent leakage from a piezoelectric layer of the elastic wave device. The piezoelectric layer, such as a lithium niobate layer, can have a relatively low acoustic impedance and the silicon substrate can have a relatively high acoustic impedance. A difference in acoustic impedance of the piezoelectric layer and the silicon substrate can create an effective reflection at an interface of the piezoelectric layer and the silicon substrate to prevent the SH wave from leaking into the silicon substrate. This can cause the anti-resonant Q to be significantly improved. The piezoelectric layer can have a thickness that is less that a wavelength of the SH wave. This can cause the plate wave spurs to be away from resonance of the SH wave main mode. A temperature compensating layer, such as a silicon dioxide ($SiO_2$) layer, can be included over an interdigital transducer electrode of the elastic wave device and the piezoelectric layer to improve a temperature coefficient of frequency (TCF) of the elastic wave device.

An aspect of this disclosure is an elastic wave device that includes a piezoelectric layer, an interdigital transducer electrode on the piezoelectric layer, and a high velocity layer in physical contact with the piezoelectric layer. The piezoelectric layer has a cut angle in a cut angle range from −10° to 60°. The interdigital transducer electrode is configured to generate an elastic wave having a wavelength of λ. The piezoelectric layer has a thickness in a thickness range from 0.35λ to 0.8λ. The high velocity layer has a higher bulk velocity than a velocity of the elastic wave. The thickness of the piezoelectric layer can contribute to increasing a Qp of the elastic wave device. The cut angle can contribute to relatively high $k^2$, Qp, and Figure of Merit values of the elastic wave device.

Another aspect of this disclosure is an elastic wave device that includes a lithium niobate layer, an interdigital transducer electrode on the lithium niobate layer, and a silicon substrate in physical contact with the lithium niobate layer. The lithium niobate layer has a cut angle in a cut angle range from −10° to 60°. The interdigital transducer electrode is configured to generate an elastic wave having a wavelength of λ. The lithium niobate layer has a thickness in a thickness range from 0.35λ to 0.8λ. The thickness of the lithium niobate layer can contribute to increasing a Qp of the elastic wave device. The cut angle can contribute to relatively high $k^2$, Qp, and Figure of Merit values of the elastic wave device.

Another aspect of this disclosure is an elastic wave device that includes a lithium niobate layer, an interdigital transducer electrode on the lithium niobate layer, a high velocity layer, and a temperature compensating layer. The lithium niobate layer has a cut angle in a cut angle range from −10° to 60°. The interdigital transducer electrode is configured to generate an elastic wave having a wavelength of λ. The lithium niobate layer has a thickness in a thickness range from 0.35λ to 0.8λ. The high velocity layer has a higher bulk velocity than a velocity of the surface acoustic wave. The high velocity layer is configured to prevent the surface acoustic wave from leaking from the lithium niobate layer at anti-resonance. The temperature compensating layer is disposed between the high velocity layer and the lithium niobate layer. The temperature compensating layer has a positive temperature coefficient of frequency. The elastic device arranged so as to have an electromechanical coupling coefficient of at least 26%.

Another aspect of this disclosure is an elastic wave device that includes a lithium tantalate layer, an interdigital transducer electrode on the lithium tantalate layer, a high velocity layer, and a temperature compensating layer. The lithium tantalate layer has a cut angle in a cut angle range from −10° to 50°. The interdigital transducer electrode is configured to generate an elastic wave having a wavelength of λ. The lithium tantalate layer has a thickness that is less than k. The high velocity layer has a higher bulk velocity than a velocity of the surface acoustic wave. The high velocity layer is configured to prevent the surface acoustic wave from leaking from the lithium niobate layer at anti-resonance. The temperature compensating layer is disposed between the high velocity layer and the lithium tantalate layer. The temperature compensating layer has a positive temperature coefficient of frequency.

Another aspect of this disclosure is an elastic wave device that includes a piezoelectric layer, an interdigital transducer electrode on the piezoelectric layer, and a high velocity layer. The piezoelectric layer has a cut angle in a cut angle range from −10° to 60°. The interdigital transducer electrode is configured to generate an elastic wave having a wavelength of λ. The interdigital transducer electrode has a thickness in a thickness range from 0.02λ to 0.1λ. The piezoelectric layer has a thickness that is less than λ. The high velocity layer has a higher bulk velocity than a velocity of the elastic wave. The high velocity layer is configured to prevent the elastic wave from leaking from the piezoelectric layer at anti-resonance. The thickness of the interdigital transducer electrode can contribute to desirable $k^2$, Qp, and Figure of Merit values of the elastic wave device.

Another aspect of this disclosure is an elastic wave device that includes a piezoelectric layer, an interdigital transducer electrode on the piezoelectric layer, a silicon layer configured to prevent the elastic wave from leaking from the piezoelectric layer at anti-resonance, and a temperature compensating layer having a positive temperature coefficient of frequency. The piezoelectric layer has a cut angle in a cut angle range from −10° to 60°. The interdigital transducer electrode is configured to generate an elastic wave having a wavelength of λ. The piezoelectric layer has a thickness in a thickness range from 0.25λ to 0.8λ. The piezoelectric layer is disposed between the silicon layer and the interdigital transducer electrode. The interdigital transducer electrode being is disposed between the temperature compensating layer and the piezoelectric layer.

In certain embodiments, an elastic wave device including a sub-wavelength thick lithium niobate layer having a relatively low cut angle on a silicon substrate can be effective at inhibiting and/or preventing leakage of an SH wave and trapping energy on a surface of the lithium niobate layer on which an interdigital transducer (IDT) electrode is disposed. The relatively low cut angle can be in a range from 20° to 30° in certain embodiments. In such elastic wave devices, the Q can be greater than about 2000 and the $k^2$ can be greater than 20%. Including a temperature compensating layer, such as silicon dioxide, over the interdigital transducer electrode can cause the TCF of the elastic wave device to be increased.

According to some embodiments, an elastic wave device includes a lithium niobate layer that is bonded to a silicon substrate opposite to a side of the lithium niobate layer on which an IDT electrode is disposed. In such embodiments, a relatively high anti-resonant Q (e.g., an anti-resonant Q of 2000 or greater) can be achieved by a lithium niobate layer having a thickness that is less than a wavelength of an elastic wave of the elastic wave device and the silicon substrate. At the same time, a relatively large $k^2$ (e.g., 20% or greater) can be achieved by having a relatively low cut angle (e.g., a cut angle in a range from 20° to 30°).

In some other embodiments, an elastic wave device can include a dielectric layer (e.g., a silicon dioxide layer) that is disposed between a sub-wavelength thick lithium niobate layer having a relatively low cut angle and a silicon substrate. The dielectric layer can bring the TCF closer to zero. Accordingly, frequency dependence on lithium niobate thickness can be reduced.

FIG. 1 is a cross-sectional view of an elastic wave device 10 according to an embodiment. As illustrated, the elastic wave device 10 includes a piezoelectric layer 12, an IDT electrode 14, and a high velocity layer 16.

The piezoelectric layer 12 can be a lithium niobate (LiNbO3) layer or a lithium tantalate (LiTaO3) layer, for example. The illustrated piezoelectric layer 12 has a thickness $H_1$ that is less that a wavelength of an elastic wave generated by the IDT electrode 14 of the elastic wave device 10. The piezoelectric layer 12 can have a relatively low cut angle. For instance, the cut angle of the piezoelectric layer 12 can be a range from −10° to 35°. In some embodiments, the cut angle of the piezoelectric layer can be in a range from 15° to 35° or a range from 20° to 30°. As used herein, a "cut angle" of N° refers to an N° rotated Y-cut in a Y-cut X-propagation piezoelectric layer. Accordingly, for a piezoelectric layer with Euler angles (φ, θ, Ψ), the "cut angle" in degrees can be 0 minus 90°.

An IDT electrode 14 is disposed on piezoelectric layer 12. The IDT electrode 14 can generate an elastic wave on a surface of the piezoelectric layer 12. The illustrated IDT electrode 14 has a pitch $L_1$ and a thickness h. The pitch $L_1$ is the wavelength 2λ, of an elastic wave generated by the elastic wave device 10. The IDT electrode 14 can include aluminum and/or any other suitable material for an IDT electrode 14. For example, IDT electrode material can include aluminum (Al), titanium (Ti), gold (Au), silver (Ag), copper (Cu), platinum (Pt), tungsten (W), molybdenum (Mo), ruthenium (Ru), or any suitable combination thereof. In certain applications, the IDT electrode 14 can include aluminum. For instance, the IDT electrode can include an aluminum alloy, such as aluminum and copper.

In the illustrated elastic wave device 10, the high velocity layer 16 is bonded to and in physical contact with the piezoelectric layer 12. The high velocity layer 16 has a higher bulk velocity than a velocity of the elastic wave generated by the IDT electrode 14. The high velocity layer 16 can have a higher acoustic impedance than piezoelectric layer 12. The high velocity layer 16 can inhibit an elastic wave generated by the elastic wave device 10 from leaking from the piezoelectric layer 12 at anti-resonance. The high velocity layer 16 can be a silicon layer. Such a silicon layer can have a relatively high acoustic velocity, a relatively large stiffness, and a relatively small density. The silicon layer can be a polycrystalline silicon layer in certain instances.

In some instances, the elastic wave device 10 includes a lithium tantalate piezoelectric layer bonded with a silicon substrate. FIGS. 2A to 4E illustrate simulation results associated with such elastic wave devices.

FIGS. 2A to 2E are graphs of simulations of an elastic wave device 10 with a lithium tantalate piezoelectric layer having a cut angle of 42°, a high velocity layer that is a silicon substrate, and an IDT electrode having a pitch $L_1$ of 2.0 um and a thickness h of 160 nm. The pitch $L_1$ is the wavelength λ of the elastic wave. Thus, the thickness h of 160 nm corresponds to 0.08λ. The thickness $H_1$ of the lithium tantalate layer was swept in this elastic wave device. FIG. 2A is a graph that shows the frequency responses for thickness $H_1$ of a lithium tantalate layer that are 0.25λ and 0.5λ and for a corresponding device without a silicon substrate, where λ is the wavelength of an elastic wave generated by the IDT electrode. The wavelength λ is represented by "L" in some figures. FIG. 2B shows that a maximum $k^2$ for the device is achieved when the thickness of the lithium tantalate layer is around 0.25λ. FIG. 2C illustrates that Qs can increase with when the thickness $H_1$ of the lithium tantalate layer is lower. FIG. 2D illustrates that a figure of merit (FOM) has a high value for a range of thickness $H_1$ of the lithium tantalate layer from about 0.2λ to 0.3λ. FIG. 2E illustrates that Vs sensitivity can increase with a thinner lithium tantalate layer.

Figure 3A:
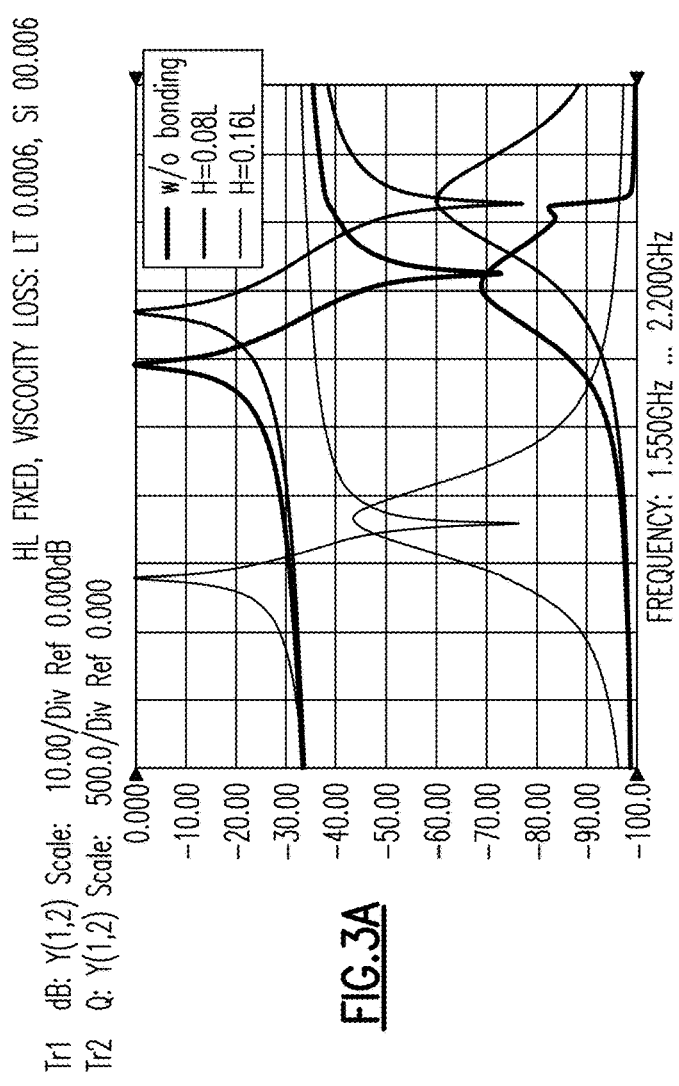
FIGS. 3A to 3E are graphs of simulations of an elastic wave device of FIG. 1 that includes a lithium tantalate piezoelectric layer on a silicon substrate, in which a thickness of an interdigital transducer electrode is varied.
Figure 3E:
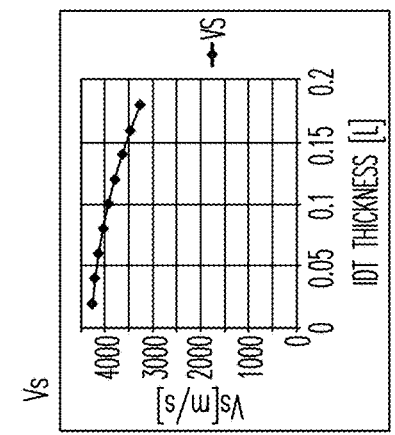
Figure 3D:
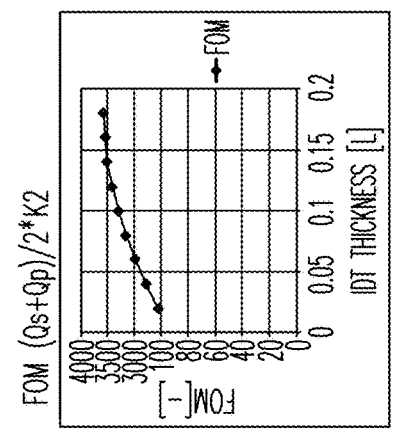
Figure 3C:
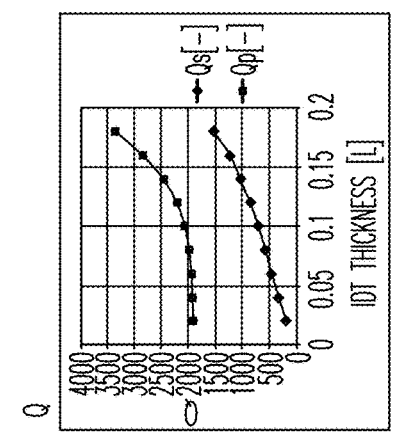
Figure 3B:
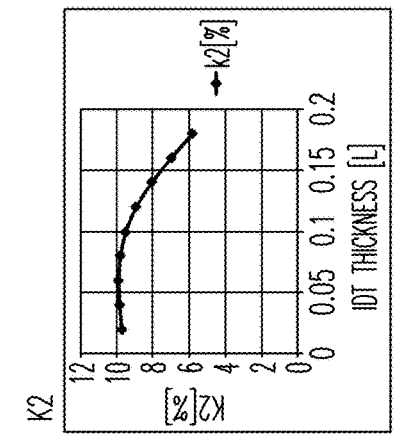

FIGS. 3A to 3E are graphs of simulations of an elastic wave device 10 with a lithium tantalate piezoelectric layer having a cut angle of 42° and a thickness $H_1$ of 0.25λ (where λ is the wavelength of the elastic wave), a high velocity layer that is a silicon substrate, and an IDT electrode having a pitch $L_1$ of 2.0 um. The thickness h of the IDT electrode was swept in this elastic wave device. FIG. 3A in a graph that shows the frequency responses for thickness h of an IDT electrode that are 0.08λ and 0.16λ and for a corresponding device without the silicon substrate bonded with the lithium tantalate layer. FIG. 3B shows that $k^2$ for the device can start to decrease when h is less than about 0.08λ. FIG. 3C illustrates that Qs and Qp can increase with greater IDT electrode thickness h. FIG. 3D illustrates that FOM can increase with greater IDT electrode thickness h. FIG. 3E illustrates that Vs sensitivity can increase with a thinner IDT electrode.

Figure 4A:
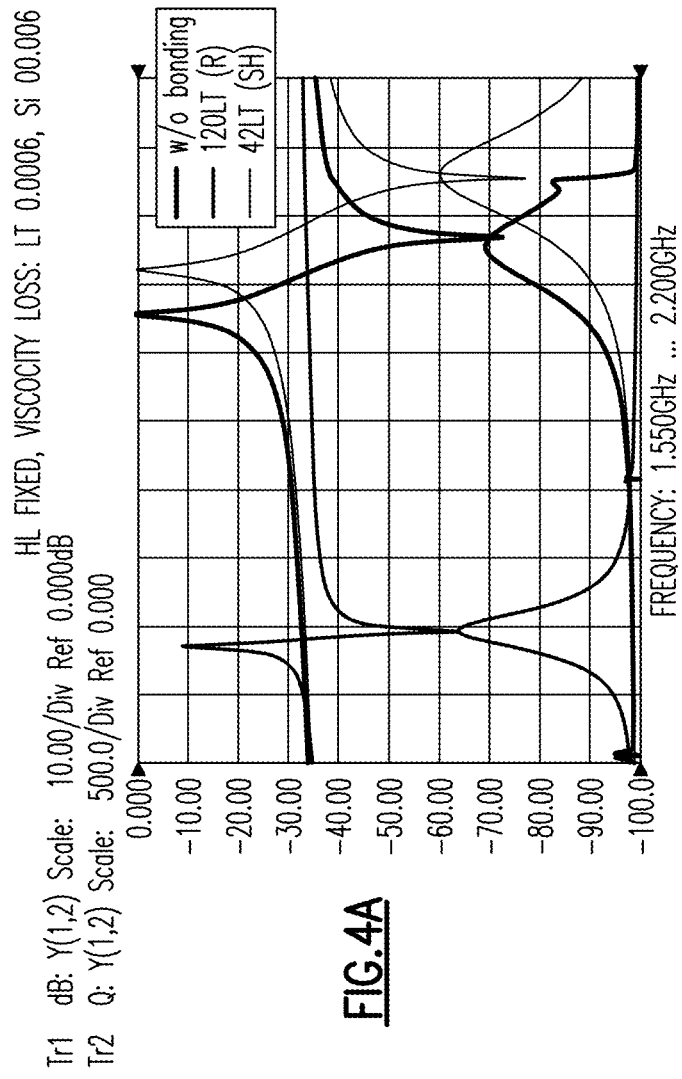
FIGS. 4A to 4E are graphs of simulations of an elastic wave device of FIG. 1 that includes a lithium tantalate piezoelectric layer on a silicon substrate, in which a cut angle is varied.
Figure 4E:
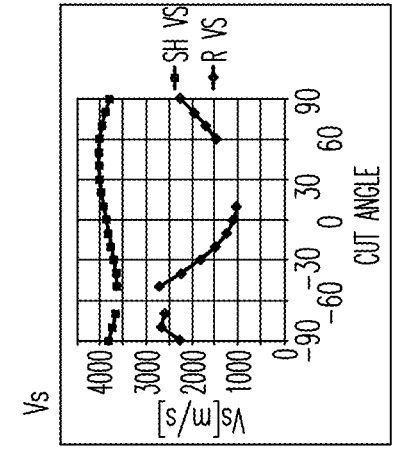
Figure 4D:
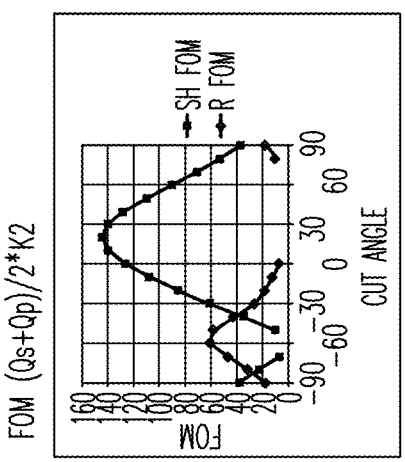
Figure 4B:
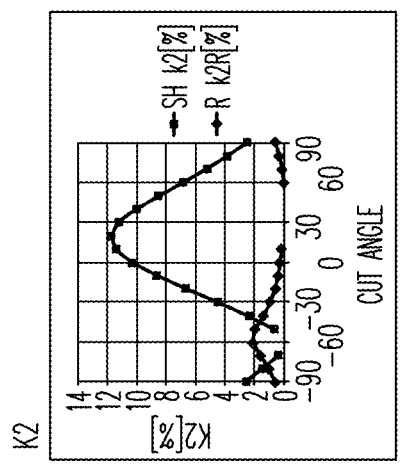
Figure 4C:
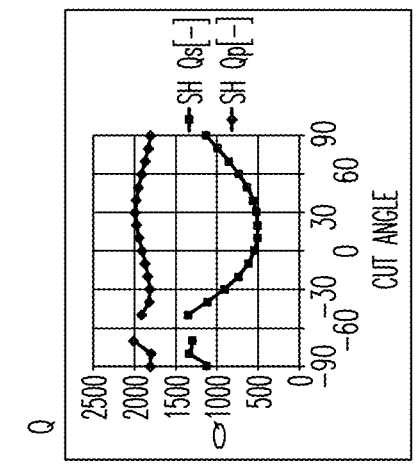

FIGS. 4A to 4E are graphs of simulations of an elastic wave device 10 with a lithium tantalate piezoelectric layer having a thickness $H_1$ of 0.25λ (where λ is the wavelength of the elastic wave), a high velocity layer that is a silicon substrate, and an IDT electrode having a pitch $L_1$ of 2.0 um and a height h of 0.08λ. The cut angle of the lithium tantalate layer was swept in this elastic wave device. FIG. 4A in a graph that shows the frequency responses for cut angles of 42° and 120° and for a corresponding device without the silicon substrate bonded with the lithium tantalate layer. FIG. 4B shows that $k^2$ for the device can be at a maximum for a cut angle of about 20°. FIG. 4C illustrates Qs and Qp versus cut angle. FIG. 4D illustrates that FOM can have a maximum for a cut angle of around 20° to 30°. FIG. 4E illustrates Vs versus cut angle.

In certain instances, the elastic wave device 10 includes a lithium niobate piezoelectric layer bonded with a silicon substrate. FIGS. 5A to 7E illustrate simulation results associated with such elastic wave devices.

Figure 5A:
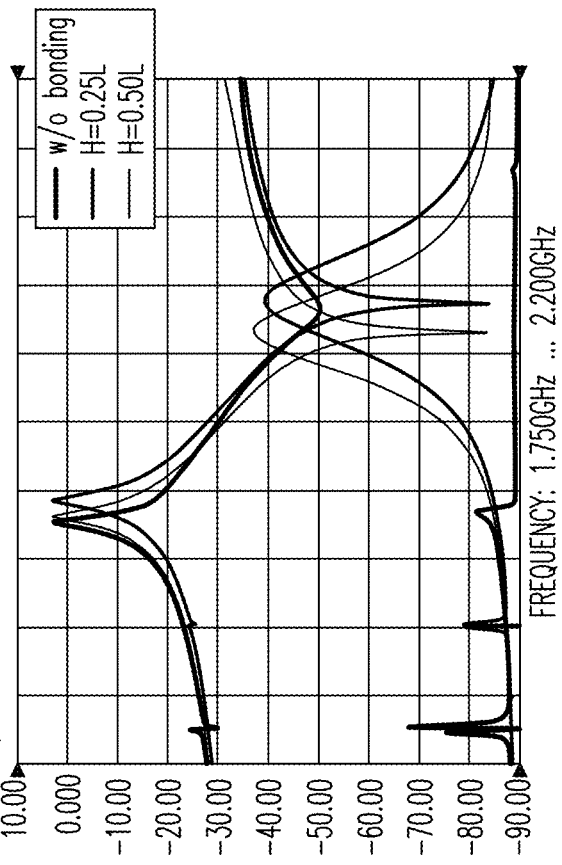
FIGS. 5A to 5E are graphs of simulations of an elastic wave device of FIG. 1 that includes a lithium niobate piezoelectric layer on a silicon substrate, in which a thickness of the lithium niobate piezoelectric layer is varied.
Figure 5E:
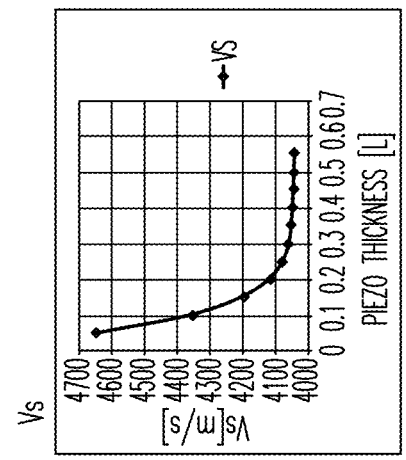
Figure 5D:
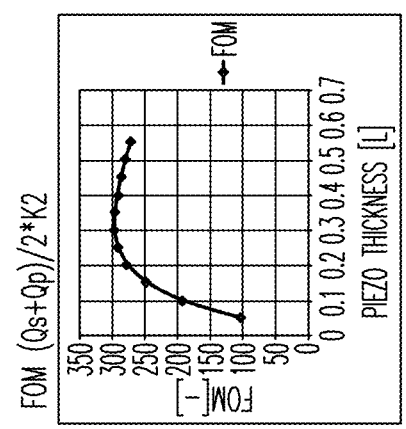
Figure 5B:
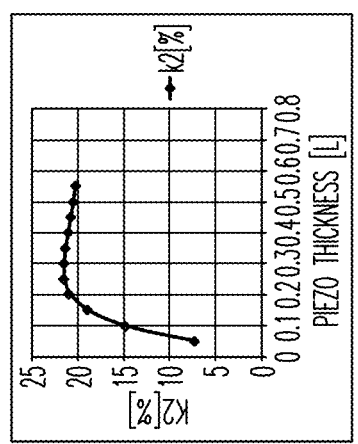
Figure 5C:
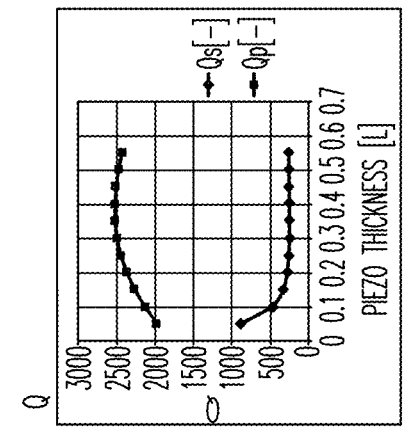

FIGS. 5A to 5E are graphs of simulations of an elastic wave device 10 with a lithium niobate piezoelectric layer having a cut angle of 42°, a high velocity layer that is a silicon substrate, and an IDT electrode having a pitch $L_1$ of 2.0 um and a thickness h of 160 nm or 0.08λ. The thickness $H_1$ of the lithium niobate layer was swept in this elastic wave device. FIG. 5A is a graph that shows the frequency responses for thickness $H_1$ of a lithium niobate layer that are 0.25λ and 0.5λ (where λ is the wavelength of an elastic wave generated by the IDT electrode) and for a corresponding device without a silicon substrate. FIG. 5B shows that a maximum $k^2$ for the device can be achieved when the thickness of the lithium niobate layer that is around 0.25λ. FIG. 5C illustrates that Qs can increase with when the thickness $H_1$ of the lithium niobate layer is lower. FIG. 5D illustrates that a figure of merit (FOM) has a relatively high value for a range of thickness $H_1$ of the lithium niobate layer from about 0.2λ to 0.4λ. FIG. 5E illustrates that Vs sensitivity can increase with a thinner lithium niobate layer.

Figure 6A:
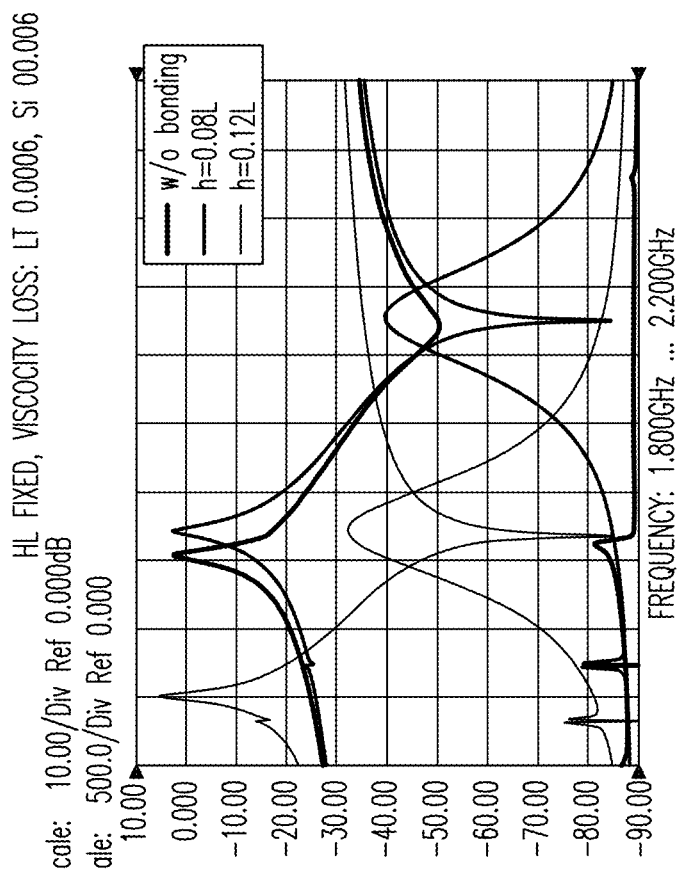
FIGS. 6A to 6E are graphs of simulations of an elastic wave device of FIG. 1 that includes a lithium niobate piezoelectric layer on a silicon substrate, in which a thickness of an interdigital transducer electrode is varied.
Figure 6B:
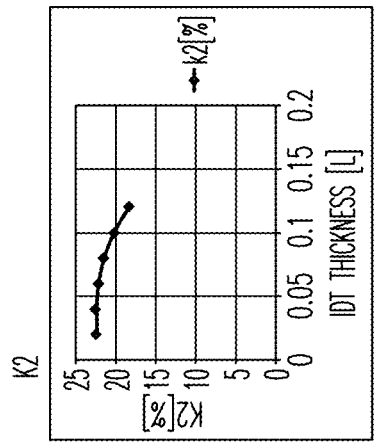
Figure 6C:
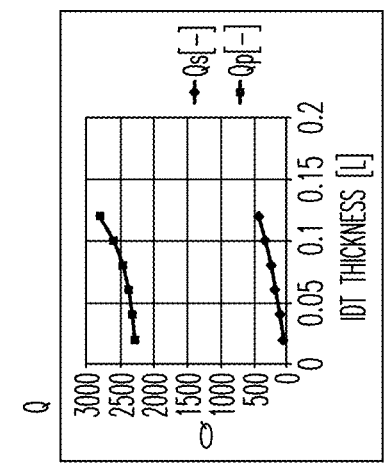
Figure 6D:
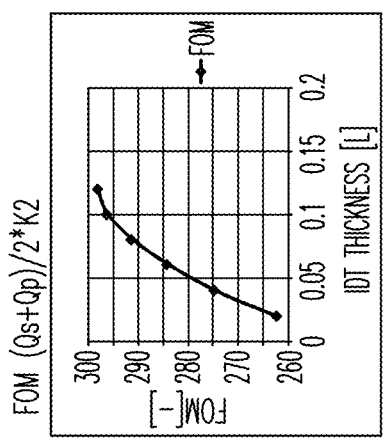
Figure 6E:
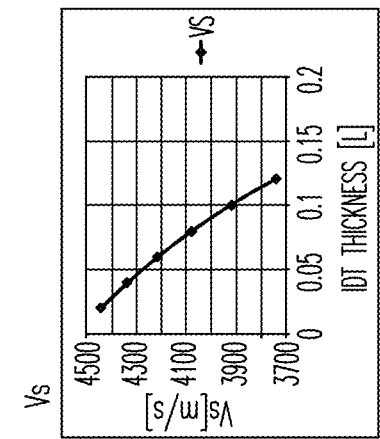

FIGS. 6A to 6E are graphs of simulations of an elastic wave device 10 with a lithium niobate piezoelectric layer having a cut angle of 42° and a thickness $H_1$ of 0.25λ (where λ is the wavelength of the elastic wave), a high velocity layer that is a silicon substrate, and an IDT electrode having a pitch $L_1$ of 2.0 um. The thickness h of the IDT electrode was swept in this elastic wave device. FIG. 6A in a graph that shows the frequency responses for thickness h of an IDT electrode that are 0.08λ and 0.12λ and for a corresponding device without the silicon substrate bonded with the lithium niobate layer. FIG. 6B shows that $k^2$ for the device can decrease for thicker IDT electrodes. FIG. 6C illustrates that Qs and Qp can increase with greater IDT electrode thickness h. FIG. 6D illustrates that FOM can increases with greater IDT electrode thickness h. FIG. 6E illustrates that Vs sensitivity can increase with a thinner IDT electrode. FIGS. 6B to 6E show that an elastic wave device can have desirable characteristics when the IDT electrode has a thickness in a range from 0.02λ to 0.1λ.

Figure 7A:
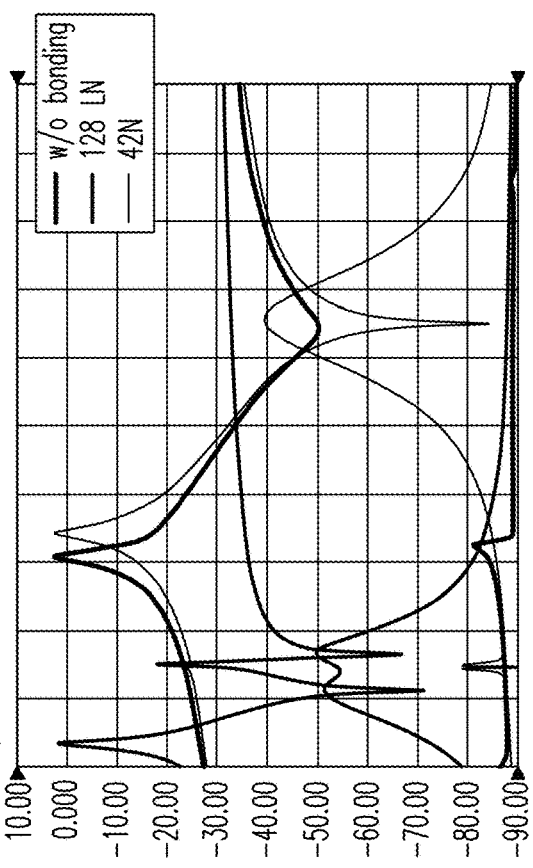
FIGS. 7A to 7E are graphs of simulations of an elastic wave device of FIG. 1 that includes a lithium niobate piezoelectric layer on a silicon substrate, in which a cut angle is varied.
Figure 7E:
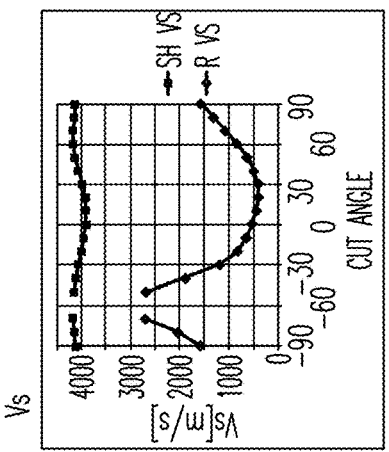
Figure 7D:
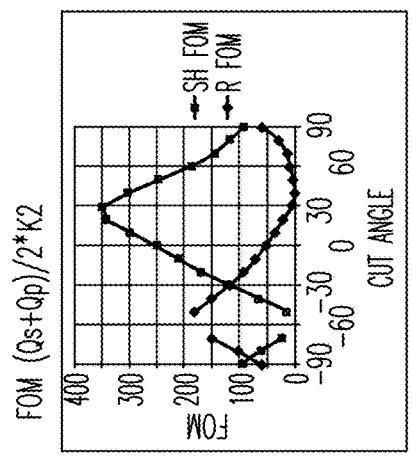
Figure 7B:
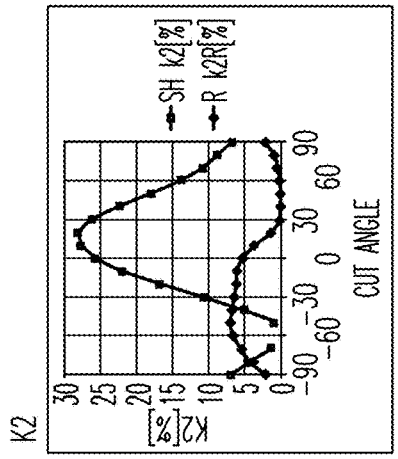
Figure 7C:
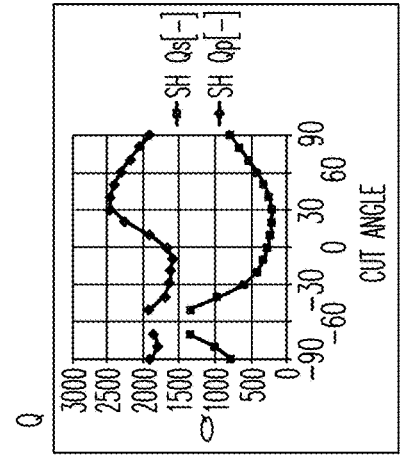

FIGS. 7A to 7E are graphs of simulations of an elastic wave device 10 with a lithium niobate piezoelectric layer having a thickness $H_1$ of 0.25λ (where λ is the wavelength of the elastic wave), a high velocity layer that is a silicon substrate, and an IDT electrode having a pitch $L_1$ of 2.0 um and a height h of 0.08λ. The cut angle of the lithium niobate layer was swept in this elastic wave device. FIG. 7A in a graph that shows the frequency responses for cut angles of 42° and 128° and for a corresponding device without the silicon substrate bonded with the lithium niobate layer. FIG. 7B shows that $k^2$ for the device can be at a maximum for a cut angle of about 20°. FIG. 7C illustrates Qs and Qp versus cut angle. FIG. 7D illustrates that FOM can have a maximum for a cut angle of around 20° to 30°. FIG. 7E illustrates Vs versus cut angle.

FIGS. 8A to 8F compare simulation results for an elastic wave device 10 that has a lithium tantalate (LT) piezoelectric layer with elastic wave device 10 that has a lithium niobate (LN) piezoelectric layer. In these figures and some other figures, "L" represents the wavelength λ of the elastic wave. FIG. 8A shows that an elastic wave device with an LN piezoelectric layer can have a higher $k^2$ than an elastic wave device with an LT piezoelectric layer for various piezoelectric layer thicknesses. FIG. 8B shows that an elastic wave device with an LN piezoelectric layer can have a higher $k^2$ than an elastic wave device with an LT piezoelectric layer for various IDT electrode thicknesses. FIG. 8C shows that an elastic wave device with an LN piezoelectric layer can have a higher $k^2$ than an elastic wave device with an LT piezoelectric layer for various cut angles. FIG. 8D shows that an elastic wave device with an LN piezoelectric layer can have a higher FOM than an elastic wave device with an LT piezoelectric layer for various piezoelectric layer thicknesses. FIG. 8E shows that an elastic wave device with an LN piezoelectric layer can have a higher FOM than an elastic wave device with an LT piezoelectric layer for various IDT electrode thicknesses. FIG. 8F shows that an elastic wave device with an LN piezoelectric layer can have a higher FOM than an elastic wave device with an LT piezoelectric layer for various cut angles.

Figure 9:
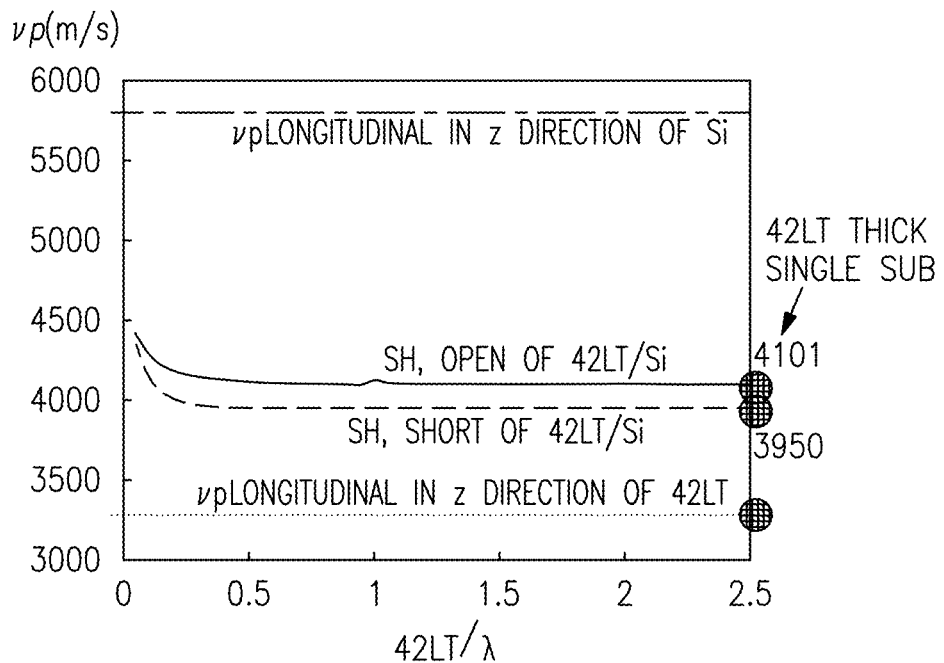
FIG. 9 is a graph of phase velocity versus piezoelectric layer thickness for an elastic wave device of FIG. 1 with an LT piezoelectric layer with a 42° cut angle on a silicon substrate.

FIG. 9 is a graph of phase velocity (Vp) versus piezoelectric layer thickness for an elastic wave device 10 with an LT piezoelectric layer with a 42° cut angle and silicon substrate as a high velocity layer. As used herein, 42LT can refer to lithium tantalate with a 42° cut angle. Phase velocity (Vp) of the elastic wave device can be modeled by the following equations:

$$v_{p,m} \approx f_s \times \lambda \quad \text{(Equation 1)}$$

$$v_{p,o} \approx f_p \times \lambda \quad \text{(Equation 2)}$$

An SH wave can get reflected back to the LT layer at the LT/Si interface and concentrate on the surface of the LT layer when $v_{SH}$, 42LT/Si<$V_L$, Si. An SH wave can be coupled with bulk mode and leak into the substrate for (leaky SAW) for an elastic wave device with just a 42LT layer with an IDT electrode.

Figure 10:
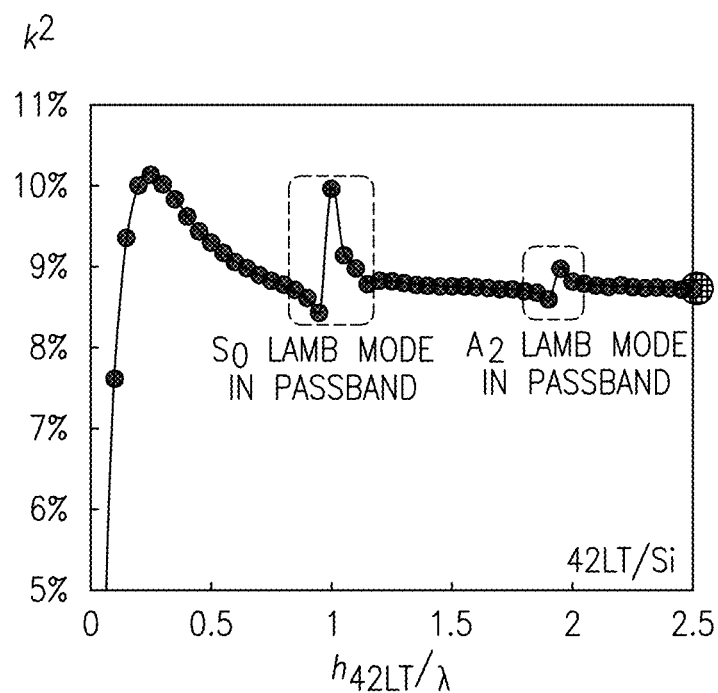
FIG. 10 is a graph of $k^2$ versus piezoelectric layer thickness for an elastic wave device of FIG. 1 with an LT piezoelectric layer with a 42° cut angle on a silicon substrate.

FIG. 10 is a graph of $k^2$ versus piezoelectric layer thickness for an elastic wave device 10 with an LT piezoelectric layer with a 42° cut angle and silicon substrate as a high velocity layer. $K^2$ can be modeled by the following equation:

$$k^2 = \frac{\pi}{2}\frac{fs}{fp} \bigg/ \tan\left(\frac{\pi}{2}\frac{fs}{fp}\right) \quad \text{(Equation 3)}$$

In this simulation, a maximum $k^2$ of about 10% is achieved at an LT layer thickness of about 0.25λ. Lamb modes can be present in a pass band at certain thicknesses of the LT layer.

FIG. 11A is a graph of the quality factor versus piezoelectric layer thickness for an elastic wave device 10 with an LT piezoelectric layer with a 42° cut angle and silicon substrate as a high velocity layer. Qp is boosted in such an elastic wave device related to a substrate that consists only of 42LN instead of 42LN/Si. FIG. 11B illustrates that waves can be trapped on the surface of an elastic wave device 10 with an LT piezoelectric layer with a 42° cut angle and silicon substrate as a high velocity layer. This can correspond to an increase in Qp. By contrast, FIG. 11C illustrates that elastic waves can leak into the substrate for a similar elastic wave device that does not include a silicon substrate. With a 42LT substrate and no silicon substrate, Qs can be 1846 and Qp can be 1406 in some instances. Accordingly, FIG. 11A illustrates that a silicon substrate bonded with a LT layer can cause the Qp of an elastic wave device to be significantly increased.

Figure 12A:
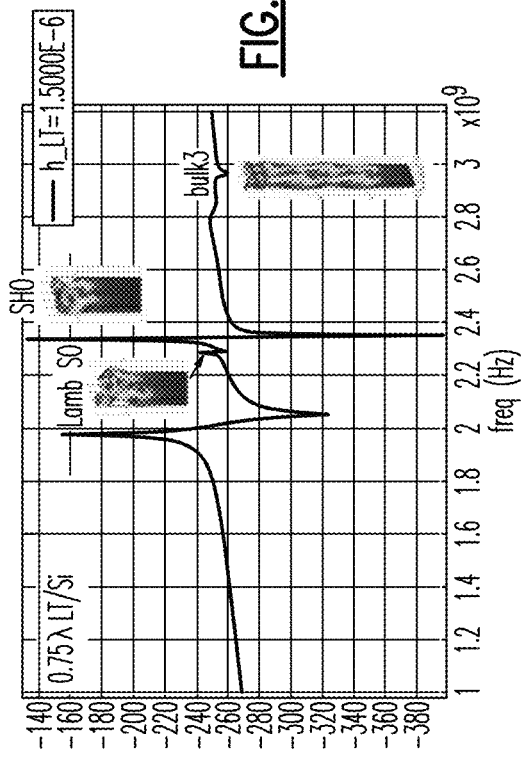
FIGS. 12A to 12D illustrate spurious modes for an elastic wave device of FIG. 1 with an LT piezoelectric layer on silicon substrate.
Figure 12B:
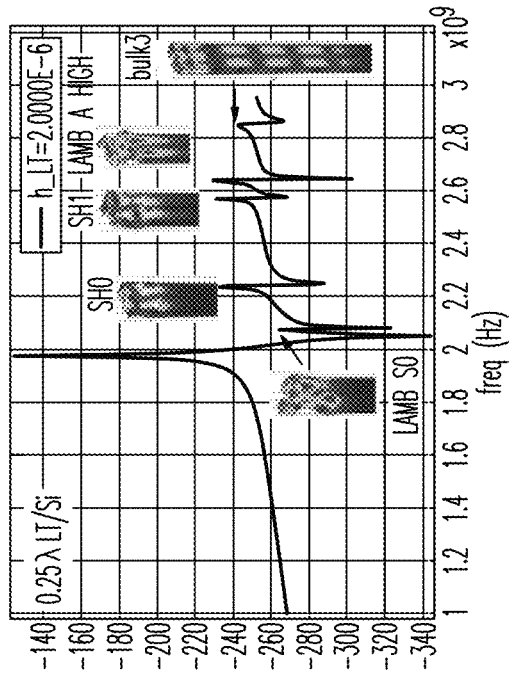
Figure 12C:
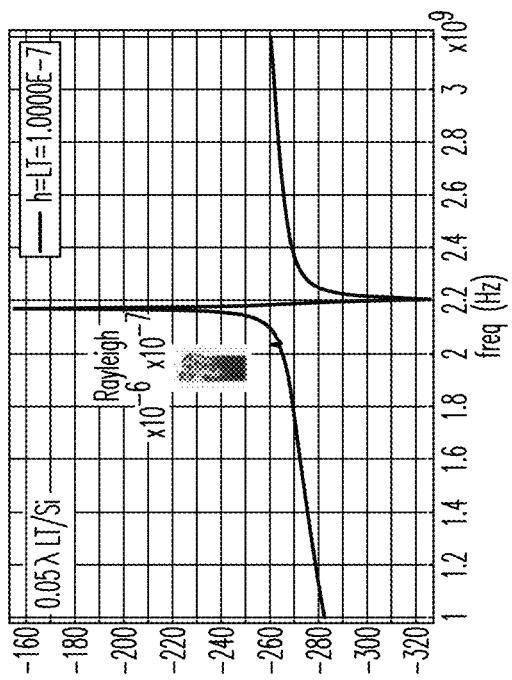
Figure 12D:
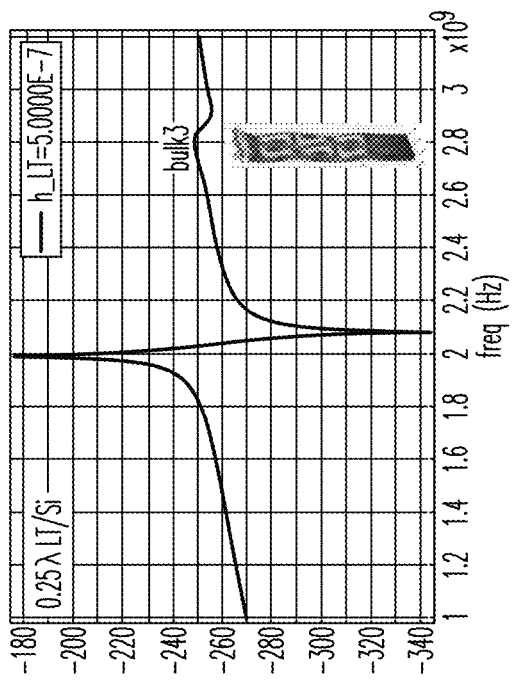

FIGS. 12A to 12D illustrates spurious modes for an elastic wave device 10 with an LT piezoelectric layer and silicon substrate as a high velocity layer for various thicknesses of the LT layer. FIG. 12A corresponds to LT thickness of 0.05λ, FIG. 12B corresponds to LT thickness of 0.75λ, FIG. 12C corresponds to LT thickness of 0.25λ, and FIG. 12D corresponds to LT thickness of 1λ.

In an elastic wave device 10 with an LT piezoelectric layer with a 42° cut angle and silicon substrate as a high velocity layer a temperature coefficient of frequency (TCF) does not appear to change significantly as thickness of the LT layer changes. TCF does not appear to be impacted significantly by the silicon substrate.

Figure 13A:
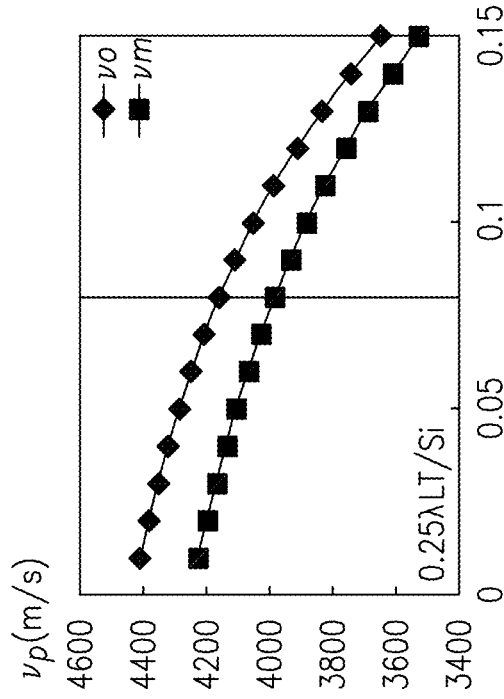
FIGS. 13A to 13C illustrate an impact of the thickness of an aluminum IDT electrode on an elastic wave device of FIG. 1 with an LT piezoelectric layer on a silicon substrate for various thicknesses of the LT layer.
Figure 13C:
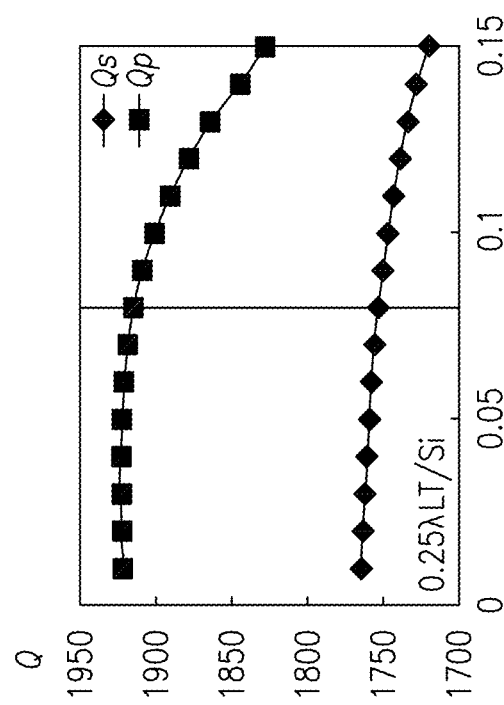
Figure 13B:
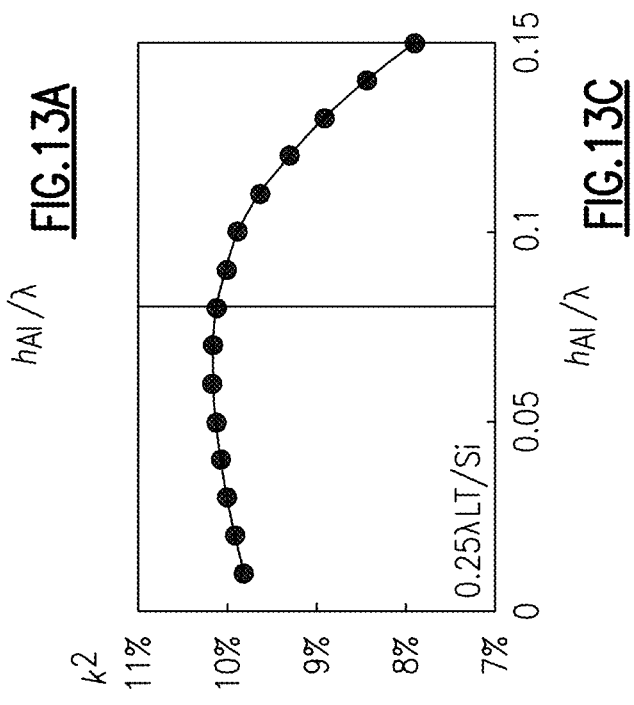

FIGS. 13A to 13C illustrates an impact of the thickness of an aluminum IDT electrode on an elastic wave device 10 with an LT piezoelectric layer with a thickness of 0.25λ and silicon substrate as a high velocity layer for various thicknesses of the LT layer. FIG. 13A illustrates an impact of IDT electrode thickness on Q. FIG. 13B illustrates an impact of IDT electrode thickness on Vp. FIG. 13C illustrates an impact of IDT electrode thickness on $k^2$.

While several of the simulations discussed above are based on a 2 GHz device, similar results are expected for Vp, $k^2$, and Q for elastic wave devices arranged to generate elastic waves having different frequencies. Thus, results have been presented in terms of wavelength λ. For instance, an elastic wave device arranged to generate an elastic wave of with a wavelength of 2 um and a frequency of about 2 GHz can have similar properties as a corresponding elastic wave device with arranged to generate an elastic wave of with a wavelength of 4 um and a frequency of about 1 GHz.

Figure 14A:
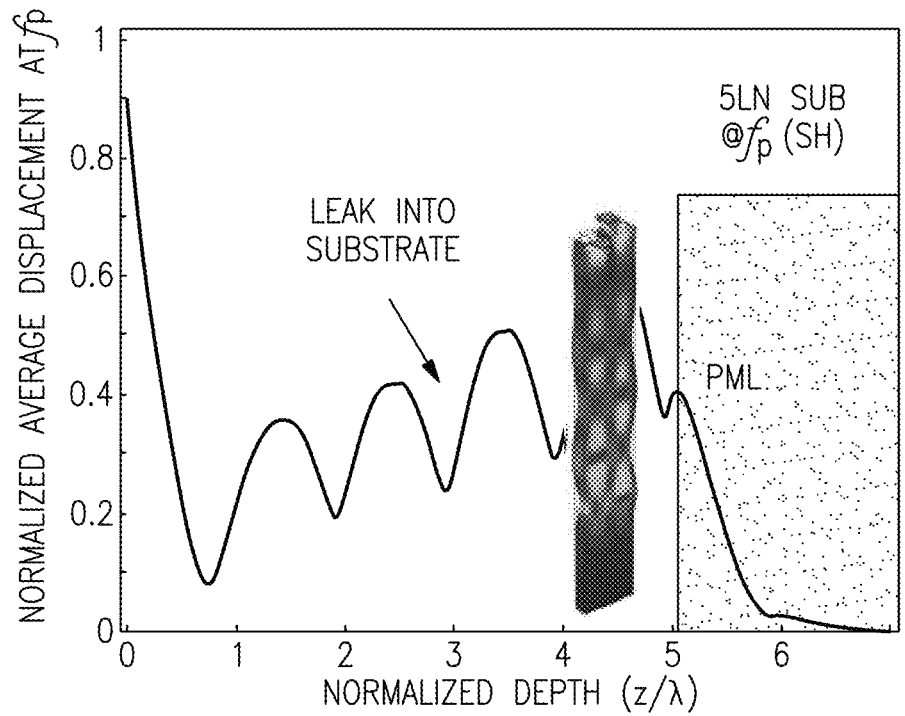
FIG. 14A illustrates normalized average surface displacement fp for an elastic wave device with a lithium niobate substrate.
Figure 14B:
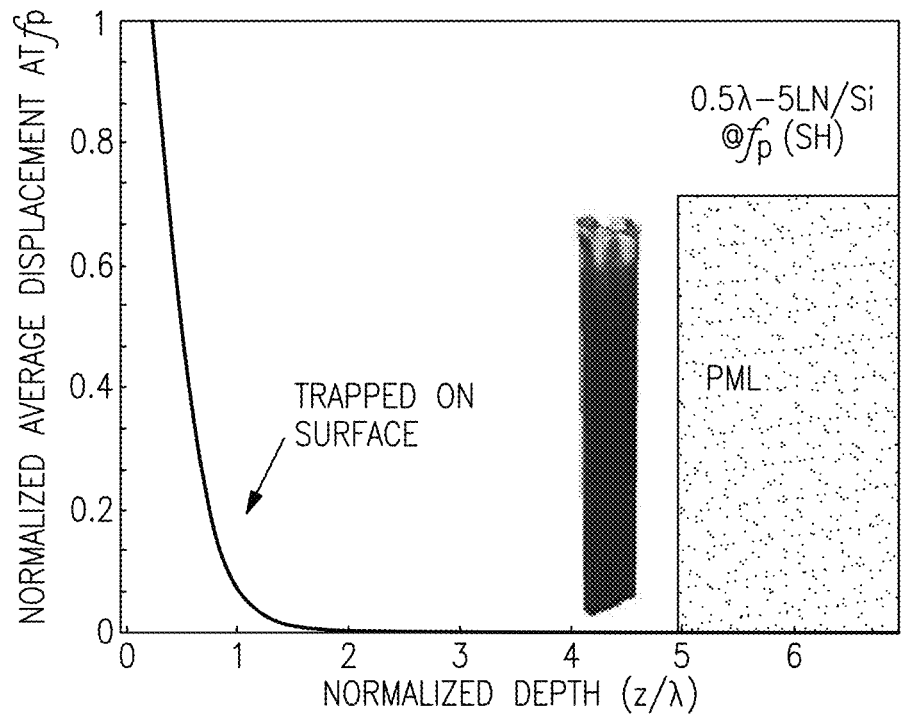
FIG. 14B illustrates normalized average surface displacement fp for an elastic wave device of FIG. 1 with a lithium niobate substrate on a silicon substrate.

FIG. 14A illustrates normalized average surface displacement at anti-resonance (fp) for an elastic wave device with a lithium niobate (LN) substrate with a thickness of 0.5λ and a cut angle of 5°. Such a device can experience leakage into the LN substrate as shown in FIG. 14A. FIG. 14B illustrates normalized average surface displacement at fp for an elastic wave device 10 with a lithium niobate (LN) substrate with a thickness of 0.5λ and a cut angle of 5° and a silicon substrate for the high velocity layer. Such a device can have elastic waves trapped at a surface of the LN layer as indicated by FIG. 14B.

Figure 15A:
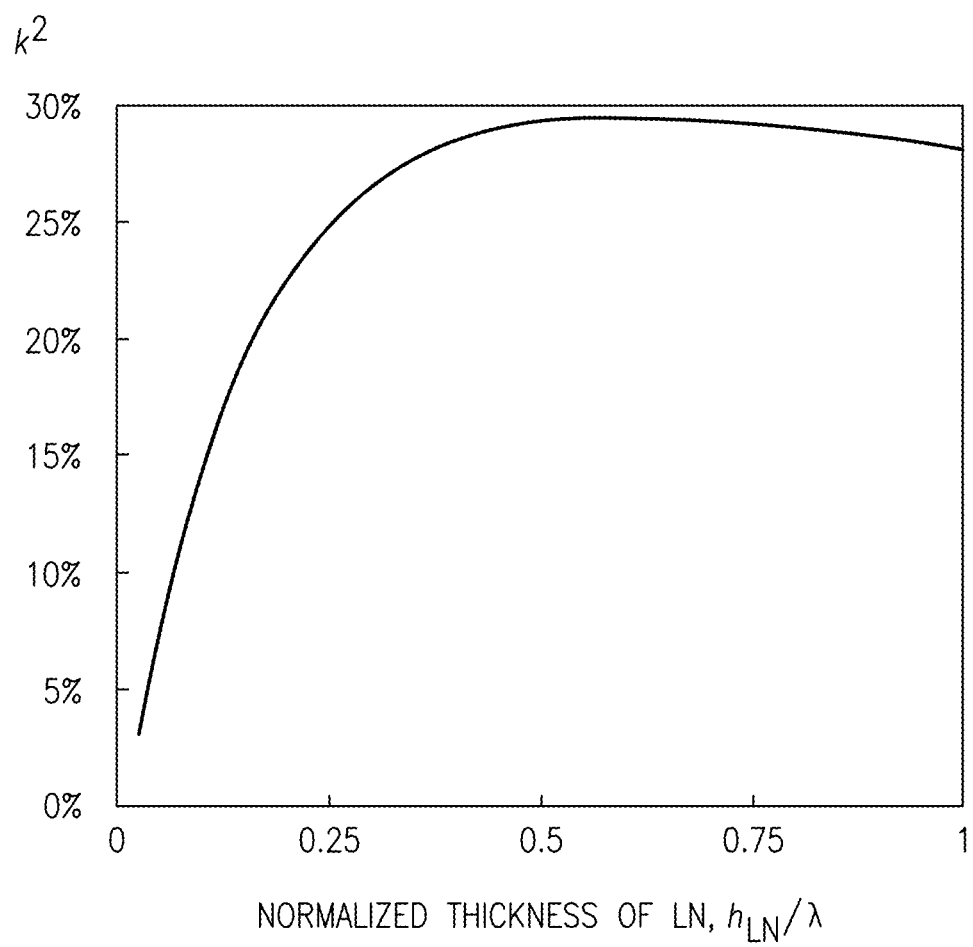
FIGS. 15A to 15D are graphs for simulations of an elastic wave device of FIG. 1 with an LN piezoelectric layer on a silicon substrate for thickness of the LN layer and various parameters.
Figure 15B:
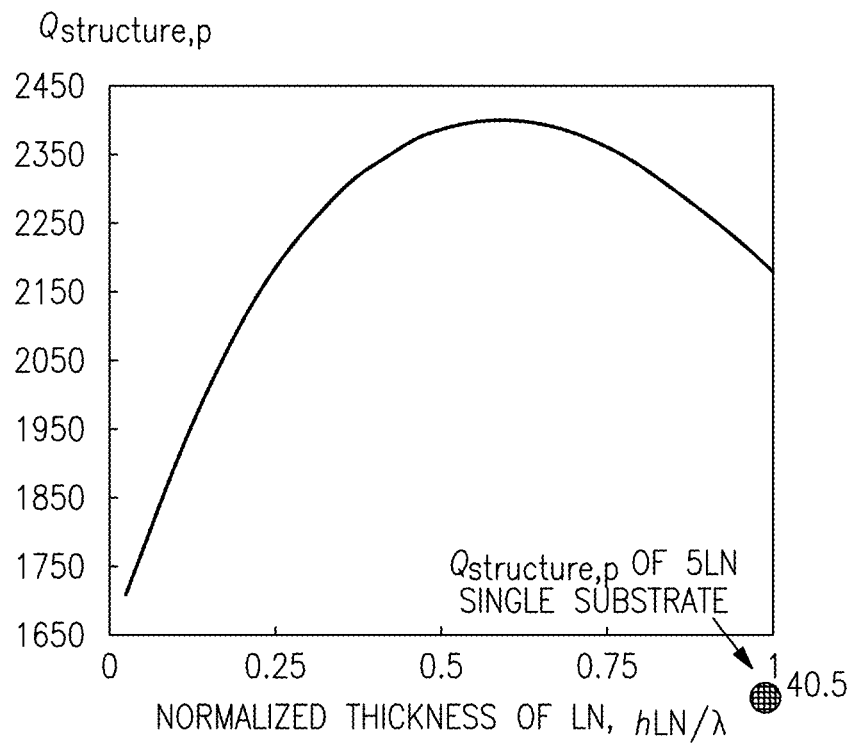
Figure 15C:
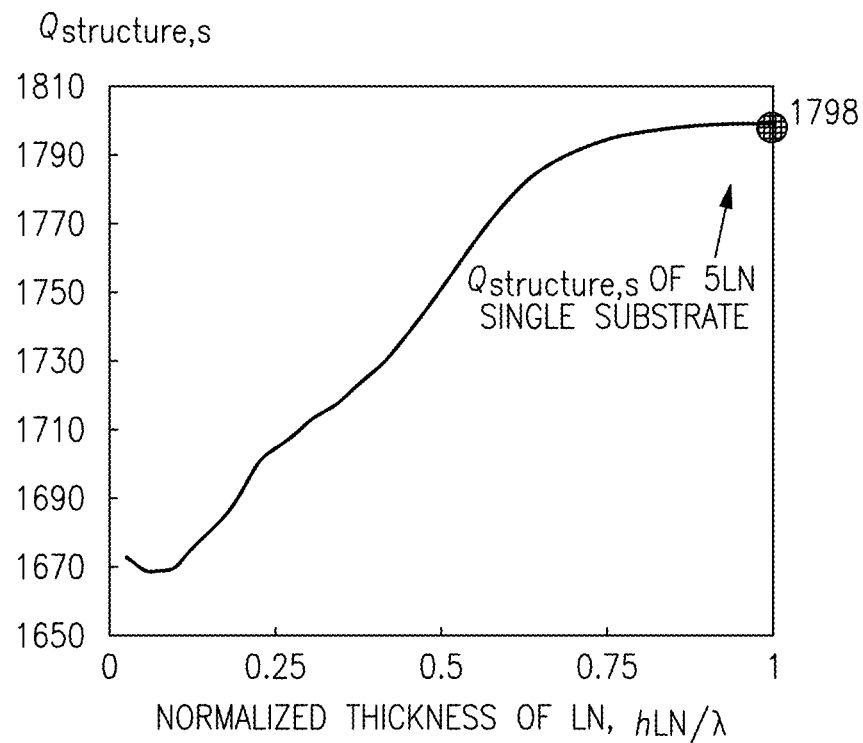
Figure 15D:
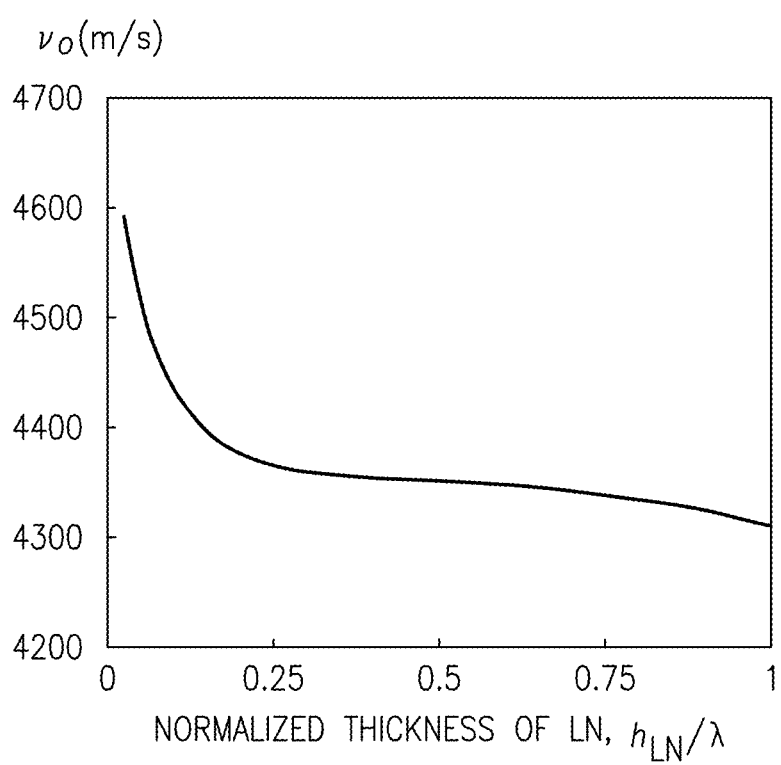
Figure 16A:
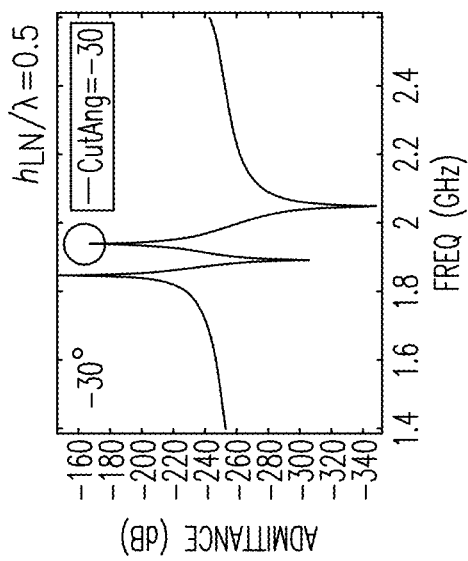
FIGS. 16A to 16K are graphs of admittance over frequency for an elastic wave device of FIG. 1 with an LN piezoelectric layer on a silicon substrate for various cut angles of the LN piezoelectric layer.
Figure 16B:
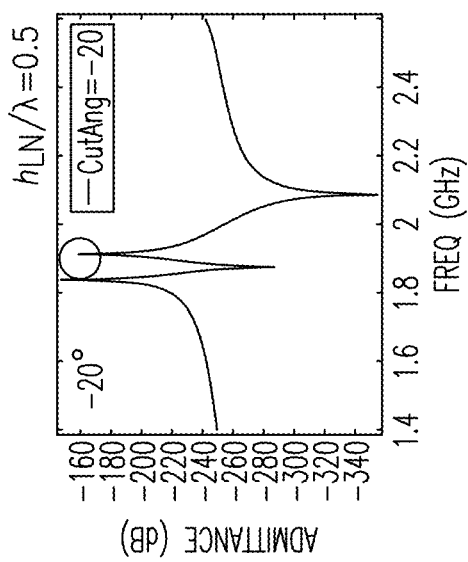
Figure 16C:
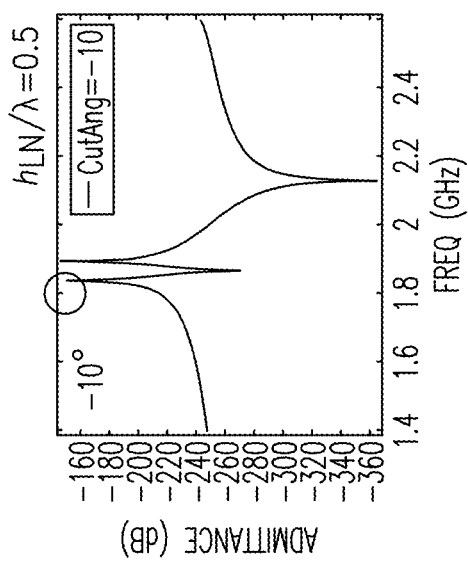
Figure 16D:
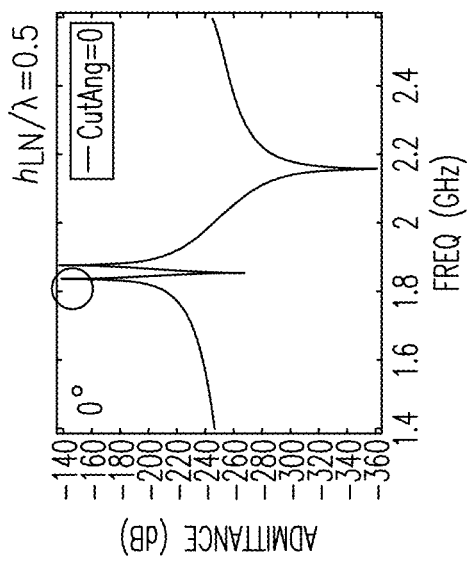
Figure 16E:
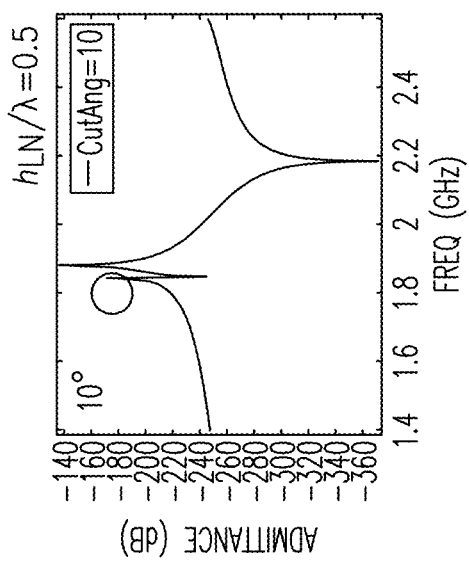
Figure 16F:
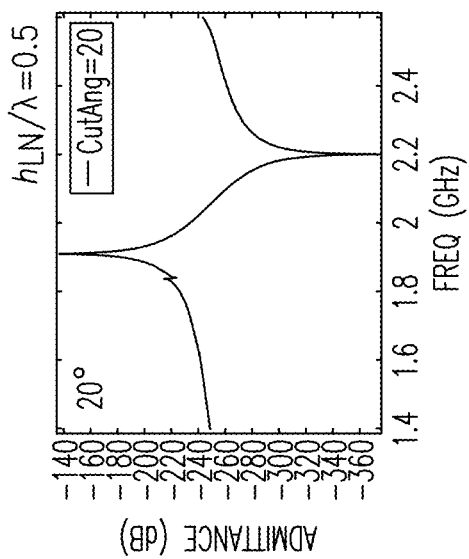
Figure 16G:
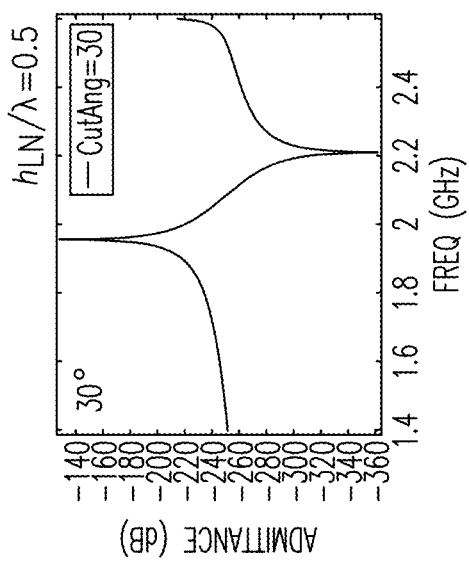
Figure 16H:
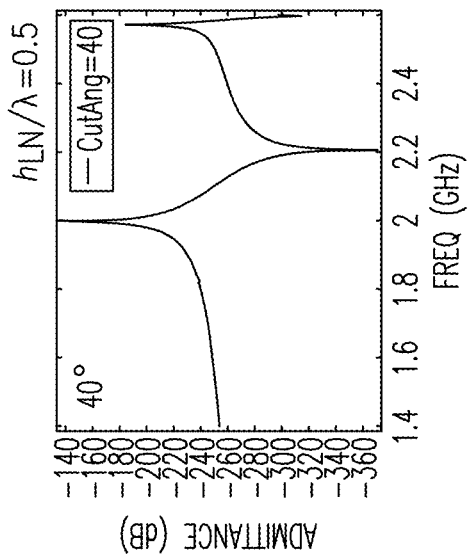
Figure 16I:
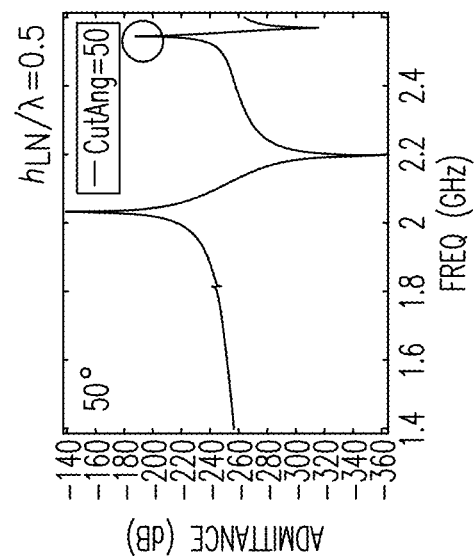
Figure 16J:
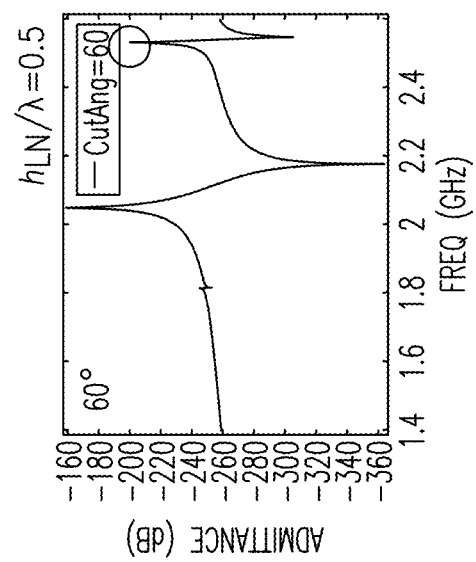
Figure 16K:
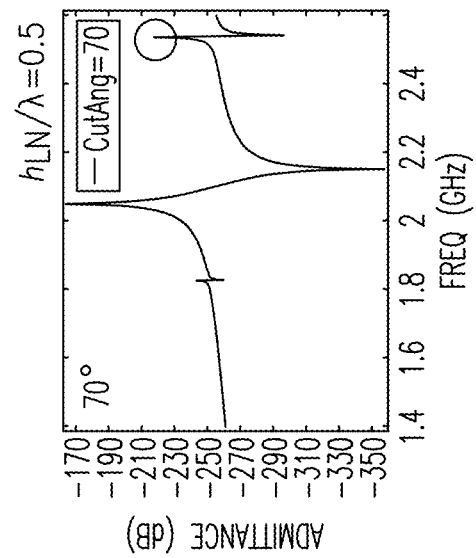

FIGS. 15A to 15D are graphs for simulations of an elastic wave device 10 with an LN piezoelectric layer and a silicon substrate as a high velocity layer that show relationships between thickness of the LN layer and various parameters. FIG. 15A illustrates $k^2$ as a function of thickness of the LN layer. FIG. 15B illustrates Qp versus thickness of the LN layer. FIG. 15B illustrates relatively high Qp values for LN thicknesses in a range from 0.35λ to 0.8λ. The electromechanical coupling coefficient $k^2$ is also relatively high for LN thicknesses in a range from 0.35λ to 0.8λ. FIG. 15C illustrates Qs versus thickness of the LN layer. FIG. 15D illustrates $v_0$ versus thickness of the LN layer.

FIGS. 16A to 16K illustrate admittance over frequency for an elastic wave device 10 with an LN piezoelectric layer having a thickness of 0.5λ and a silicon substrate as a high velocity layer for various cut angles of LN. As shown in FIGS. 16A to 16E, Rayleigh spurious responses can be present for cut angles of −30°, −20°, −10°, 0°, and 10°. As shown in FIGS. 16H to 16K, $S_0$ Lamb spurious responses can be present for cut angles of 40°, 50°, 60°, and 70°. The frequency responses for cut angles of 20° and 30° shown in FIGS. 16F and 16G do not include significant Rayleigh spurious responses or $S_0$ Lamb spurious responses. Accordingly, a cut angle in a range from about 15° to 35° can be advantageous.

FIG. 17A is a graph for simulations of an elastic wave device 10 with a silicon substrate as a high velocity layer that shows relationships between thickness of the LN or LT piezoelectric layer and $k^2$ for certain cut angles. FIG. 17A shows that $k^2$ can be significantly higher for an LN piezoelectric layer with a cut angle of 5° compared to an LT piezoelectric layer with cut angle of 42° or an LN piezoelectric layer with a cut angle of 128°.

FIG. 17B is a graph for simulations of an elastic wave device 10 with a silicon substrate as a high velocity layer that shows relationships between thickness of the LN or LT piezoelectric layer and $v_0$ for certain cut angles. FIG. 17B shows that $v_0$ can be higher for an LN piezoelectric layer with a cut angle of 5° compared to an LT piezoelectric layer with cut angle of 42° or an LN piezoelectric layer with a cut angle of 128°.

Figure 18A:
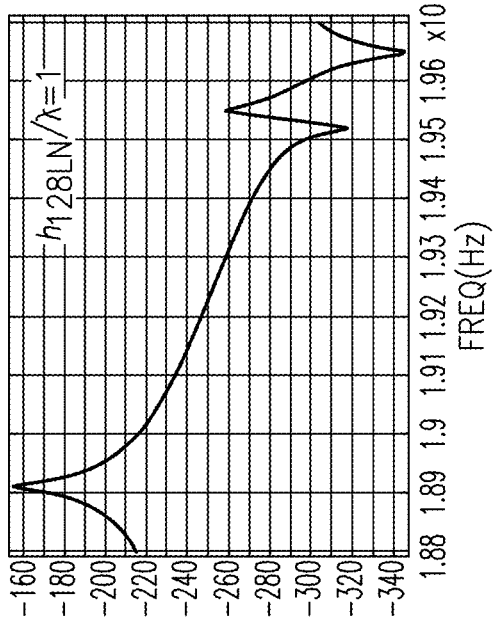
FIG. 18A to 18C are graphs for simulations of an elastic wave device of FIG. 1 with an LN piezoelectric layer having a $128°$ cut angle on a silicon substrate.
Figure 18C:
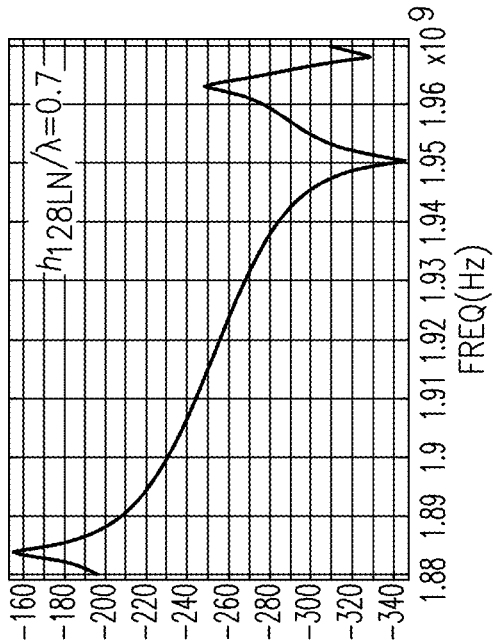
Figure 18B:
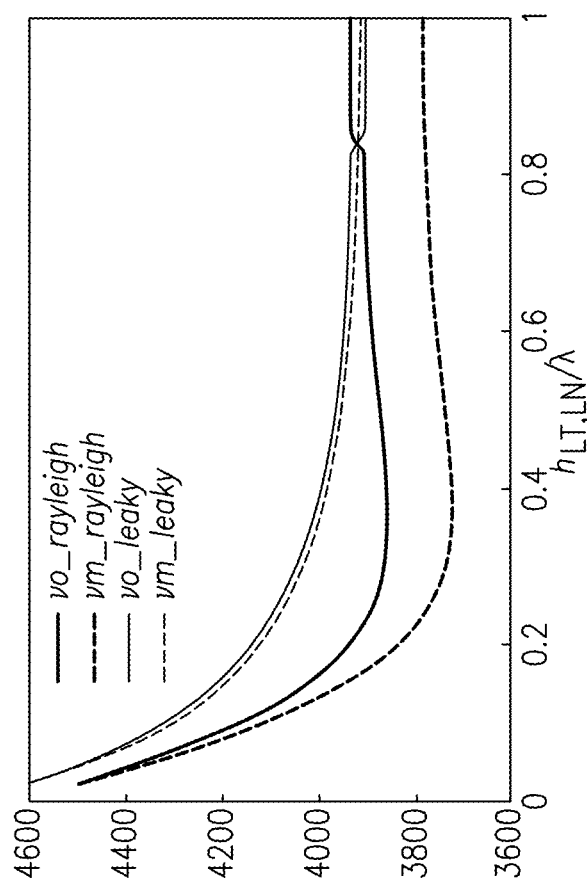

FIG. 18A to 18C are graphs for simulations of an elastic wave device 10 with an LN piezoelectric layer having a 128° cut angle and a silicon substrate as a high velocity layer. FIG. 18A illustrates a frequency response for a LN layer having a thickness of 0.7λ. FIG. 18B illustrates a frequency response for a LN layer having a thickness of 1λ. FIG. 18C illustrates a frequency response for a LN layer having a theoretically infinite thickness.

Figure 19:
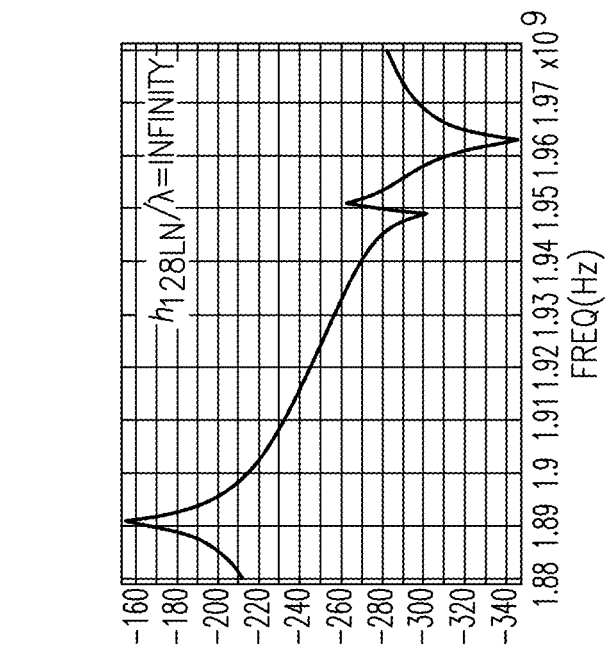
FIG. 19 is a graph of velocity of the elastic wave device of FIG. 1 as a function of thickness of the piezoelectric layer.

FIG. 19 illustrates relationships between velocity of the elastic wave device 10 and thickness of the piezoelectric layer.

Figure 20B:
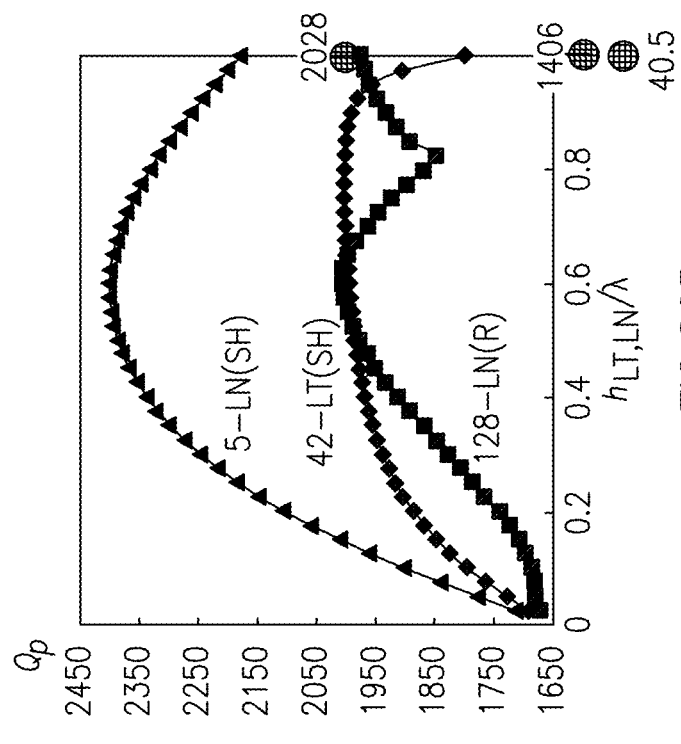
FIGS. 20A and 20B are graphs for simulations of Q as a function of thickness of the piezoelectric layer of an elastic wave device of FIG. 1 for certain piezoelectric layers on a silicon substrate.
Figure 20A:
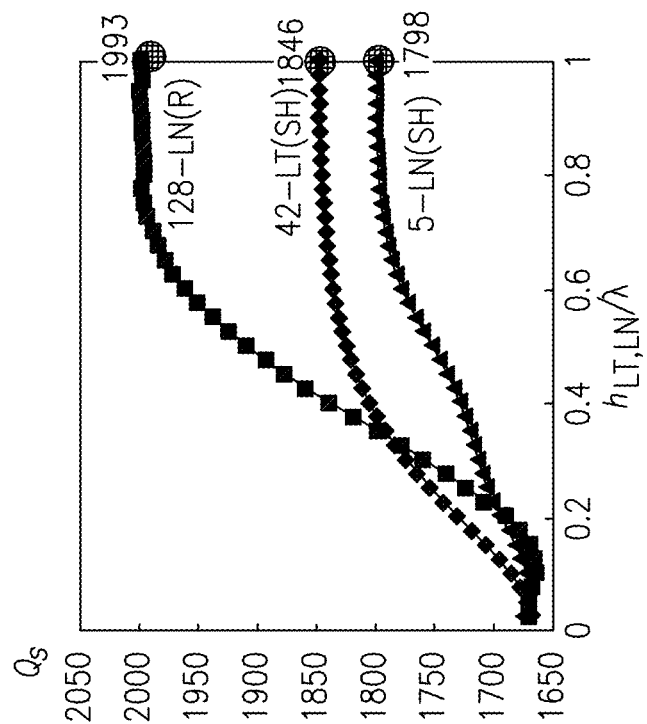

FIGS. 20A and 20B are graphs for simulations of Q as a function of thickness of the piezoelectric layer of an elastic wave device 10 for certain piezoelectric layers, in which a silicon substrate is the high velocity layer. FIG. 20A is a graph of Qs as a function of thickness of certain piezoelectric layers. FIG. 20B is a graph of Qp as a function of thickness of certain piezoelectric layers. The dots on FIGS. 20A and 20B represent Qs and Qp values, respectively, for elastic wave devices that are similar except they do not include a silicon substrate.

Figure 21:
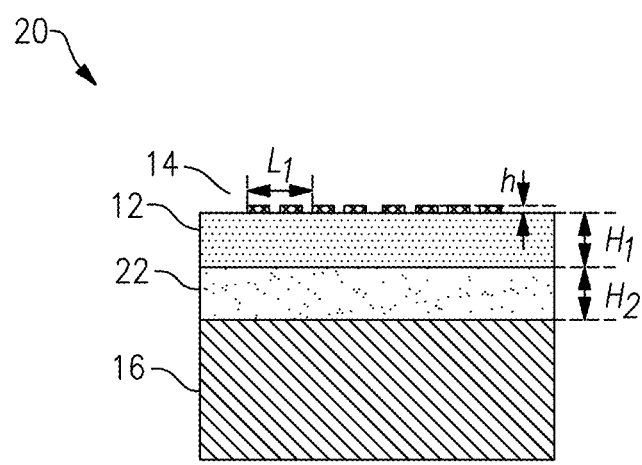
FIG. 21 is a cross-sectional view of an elastic wave device according to an embodiment.

FIG. 21 is a cross-sectional view of an elastic wave device 20 according to an embodiment. As illustrated, the elastic wave device 20 includes a piezoelectric layer 12, an IDT electrode 14, and a high velocity layer 16, and a temperature compensating layer 22. The elastic wave device 20 is like the elastic wave device 10 of FIG. 1 except that a temperature compensating layer 22 is disposed between the piezoelectric layer 12 and the high velocity layer 16. As illustrated, the temperature compensating layer 22 has a first side in physical contact with the piezoelectric layer 12 and a second side in physical contact with the high velocity layer 16. The temperature compensating layer 22 can improve the TCF of the elastic wave device 20 relative to the elastic wave device 10.

The temperature compensating layer 22 can bring the TFC of the elastic wave device 20 closer to zero than the TCF of a similar elastic wave device that does not include the temperature compensating layer. The temperature compensating layer 22 can have a positive temperature coefficient of frequency. For instance, the temperature compensating layer 22 can be a silicon dioxide ($SiO_2$) layer. The temperature compensating layer 22 can alternatively be a tellurium dioxide ($TeO_2$) layer or a SiOF layer. The temperature compensating layer 22 can include any suitable combination of $SiO_2$, $TeO_2$, and/or SiOF. The temperature compensating layer 22 can have a lower bulk velocity than a velocity of the elastic wave generated by the IDT electrode 14. The temperature compensating layer 22 can be a dielectric layer. The temperature compensating layer 22 can have a lower acoustic impedance than the piezoelectric layer 12. The temperature compensating layer 22 can have a lower acoustic impedance than the high velocity layer 16. The illustrated temperature compensating layer 22 has a thickness $H_2$.

The elastic wave device 20 of FIG. 21 can have a higher quality factor than an elastic wave device that consists of an IDT electrode on a piezo electric layer. For instance, an elastic wave device 20 with an LT or LN piezoelectric layer on silicon dioxide on silicon can have a quality factor in a range from about 2000 to 5000. As an example, an elastic wave device 20 can have a quality factor of about 3000 and a corresponding elastic wave device that consists of an IDT electrode on a piezoelectric layer can have a quality factor of about 1000. The quality factor may be process dependent.

FIGS. 22A to 28B are graphs of simulations of an elastic wave device 20 having a lithium tantalate piezoelectric layer with a 42° cut angle (42LT), a high velocity layer that is a silicon substrate, and a temperature compensating layer that is a silicon dioxide layer.

FIG. 22A is a graph of $k^2$ as a function of 42LT thickness for various thicknesses of the silicon dioxide layer. A maximum $k^2$ of about 12.5% in this graph corresponds to a 42LT thickness of about 0.15λ and a silicon dioxide thickness of 0.2λ.

FIG. 22B is a graph of $v_{P\text{-}OPEN}$ as a function of 42LT thickness for various thicknesses of the silicon dioxide layer. FIG. 22B indicates that Vp dispersion is almost flat for a silicon dioxide thickness of about 0.05λ to 0.1λ.

FIG. 23A illustrates a relationship between Qs and 42LT thicknesses for various silicon dioxide layer thicknesses. A maximum Qs of about 1865 in this graph corresponds to a 42LT thickness of about 0.7λ and a silicon dioxide thickness of about 0.5λ. FIG. 23B illustrates a relationship between Qp and 42LT thicknesses for various silicon dioxide layer thicknesses. A maximum Qp of about 2015 in this graph corresponds to a 42LT thickness of about 0.65λ and a silicon dioxide thickness of about 0.25λ. The dots in FIGS. 23A and 23B indicate that a similar elastic wave device without the silicon substrate and the silicon dioxide layer has Qs of 1846 and Qp of 1406, respectively. Accordingly, the silicon substrate and the silicon dioxide layer can improve Qs and Qp. As indicated by these graphs, Qp can be improved more than Qs by the silicon substrate and the silicon dioxide layer.

Figure 24B:
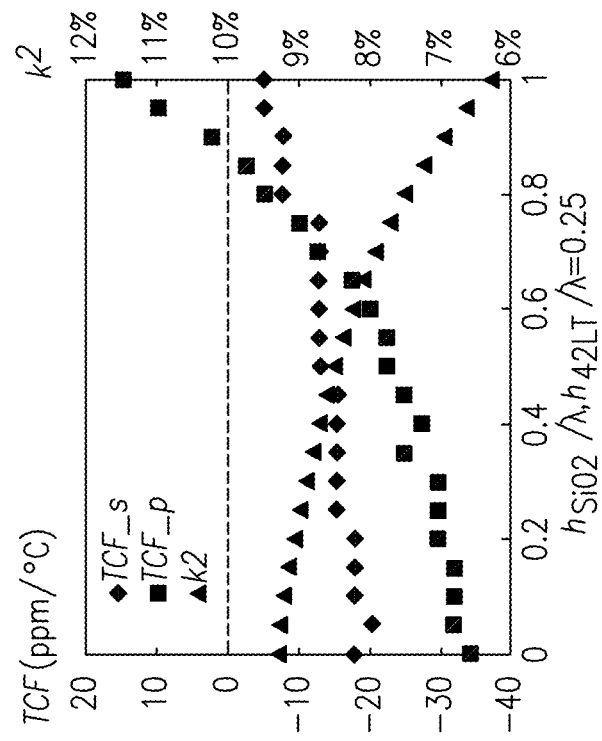
FIGS. 24A and 24B illustrate relationships between (1) TCF and thickness of the silicon dioxide layer and (2) $k^2$ and thickness of the silicon dioxide layer of the elastic wave device of FIG. 21.
Figure 24A:
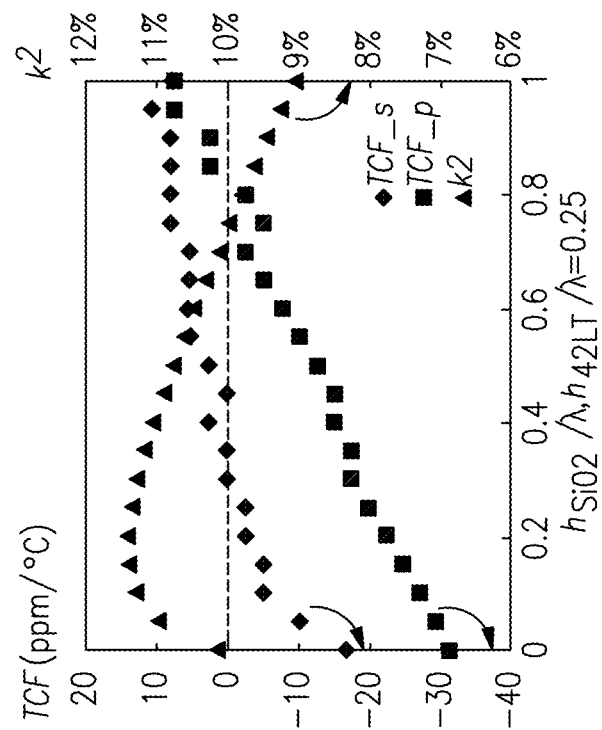

FIGS. 24A and 24B illustrate relationships between (1) TCF and thickness of the silicon dioxide layer and (2) $k^2$ and thickness of the silicon dioxide layer. FIG. 24A corresponds to 42LT with a thickness of 0.25λ. An average TCF of 0 occurs at a silicon dioxide thickness of about 0.7λ in FIG. 24A. FIG. 24B corresponds to 42LT with a thickness of 0.5λ. An average TCF of 0 occurs at a silicon dioxide thickness of about 0.9λ in FIG. 24B.

Figure 25A:
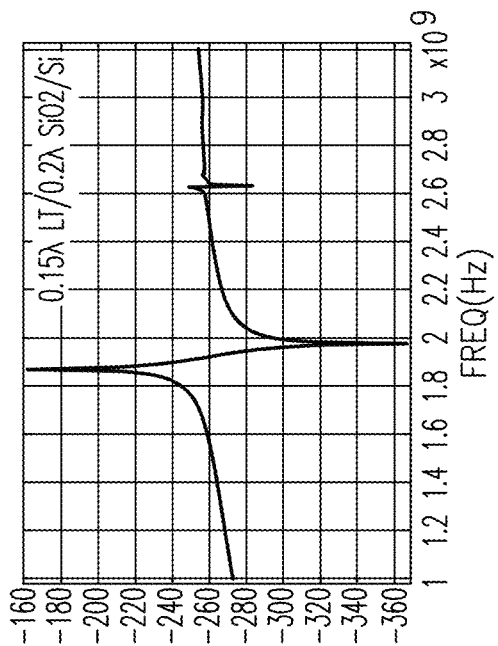
FIGS. 25A to 25C illustrate spurious modes in frequency responses for various 42LT and silicon dioxide thicknesses of the elastic wave device of FIG. 21.
Figure 25C:
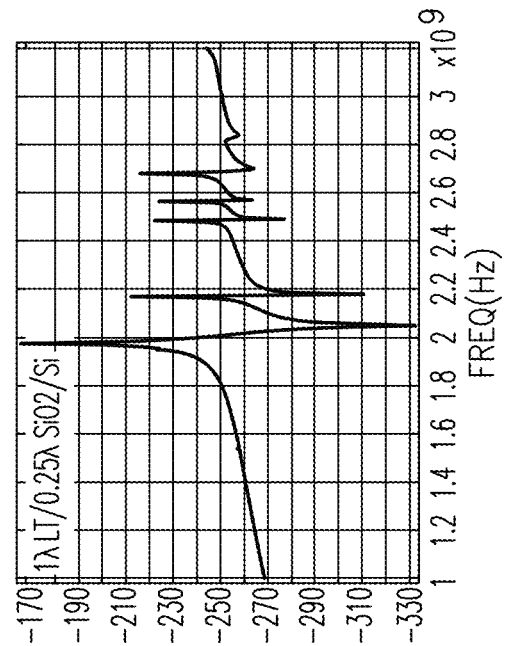
Figure 25B:
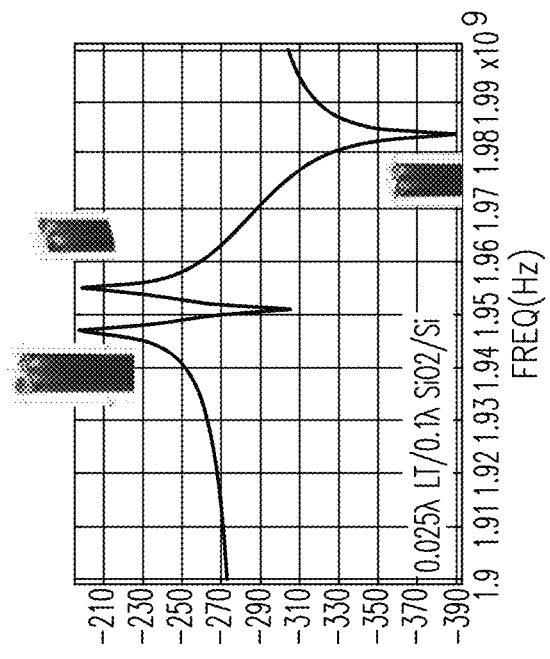

FIGS. 25A to 25C illustrate spurious modes in frequency responses for various 42LT and silicon dioxide thicknesses. FIG. 25A shows a relatively clean frequency response for a 42LT layer with a thickness of 0.15λ and a silicon dioxide thickness of 0.2λ. FIG. 25B shows a Rayleigh wave in a pass band when the 42LT layer has a thickness of less than 0.03λ. FIG. 25C shows a plate wave in a pass band when the 42LT layer has a thickness of greater than 0.8λ. The passband can be relatively clean when the 42LT layer has a thickness in a range from about 0.03λ to 0.8λ.

Figure 26A:
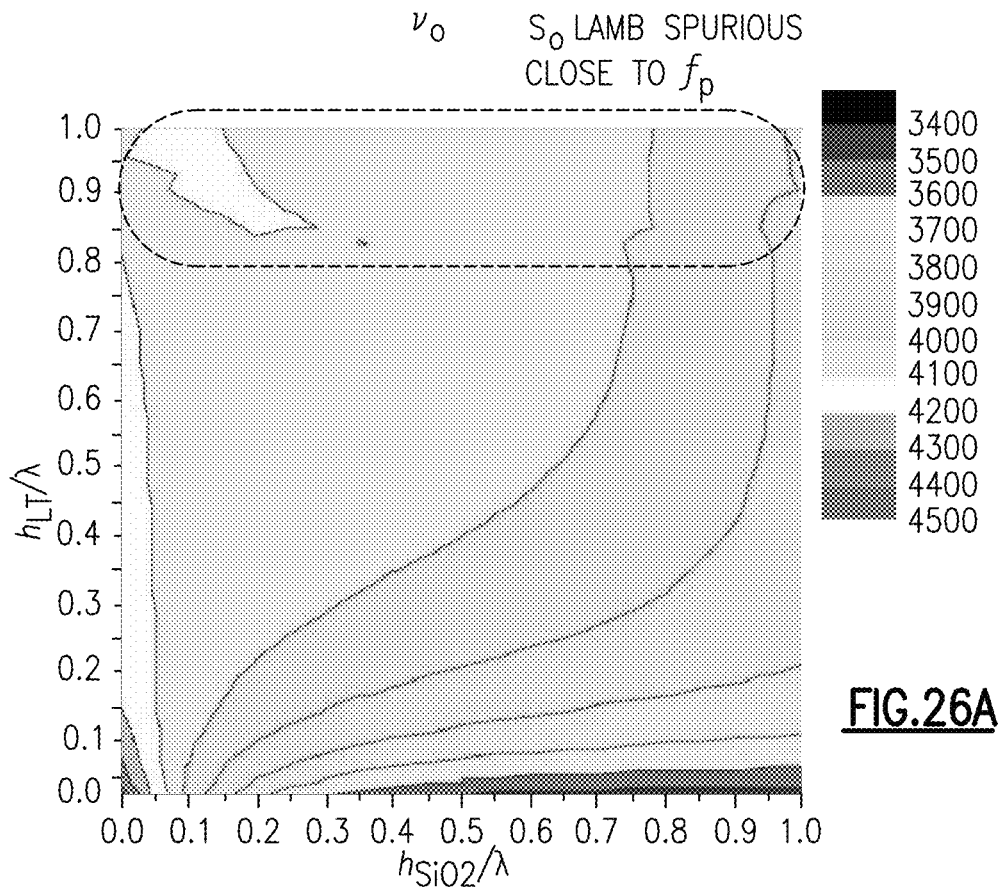
FIG. 26A is a contour plot for Vo for the elastic wave device of FIG. 21.
Figure 26B:
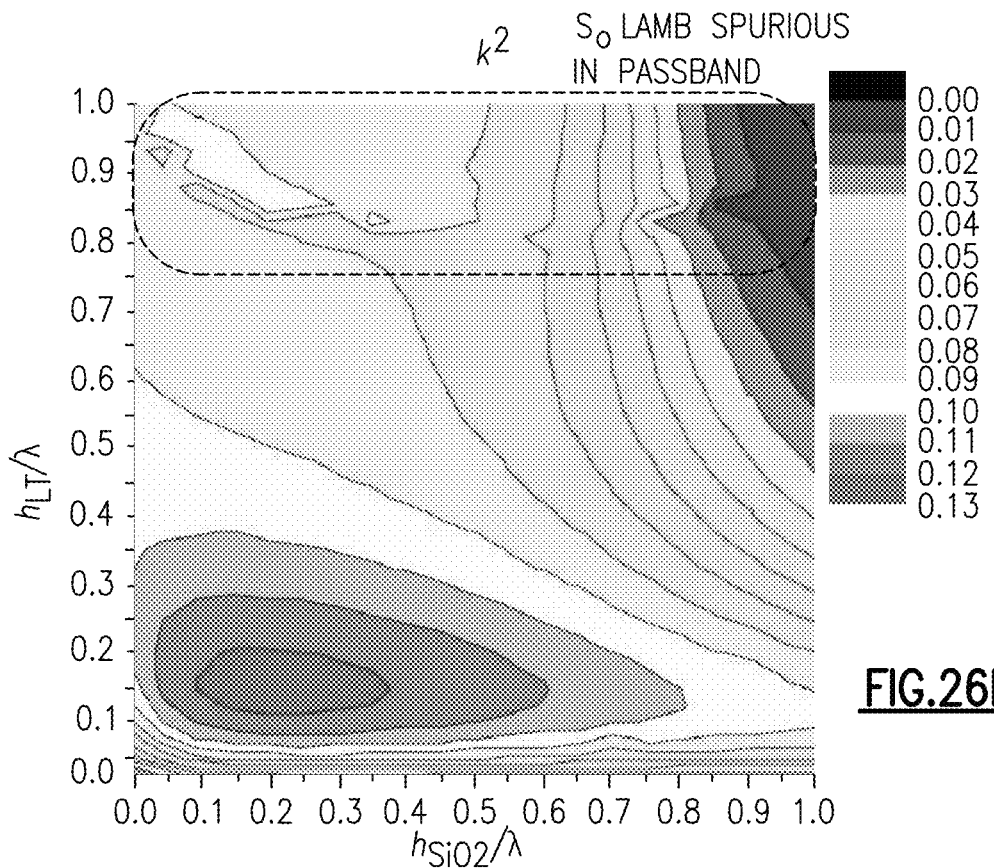
FIG. 26B is a contour plot for $k^2$ for the elastic wave device of FIG. 21.

FIG. 26A is a contour plot for Vo. FIG. 26B is a contour plot for $k^2$. FIG. 26B indicates a maximum $k^2$ of about 12.5% for a 42LT thickness of about 0.15λ and a silicon dioxide thickness of about 0.2λ.

Figure 27A:
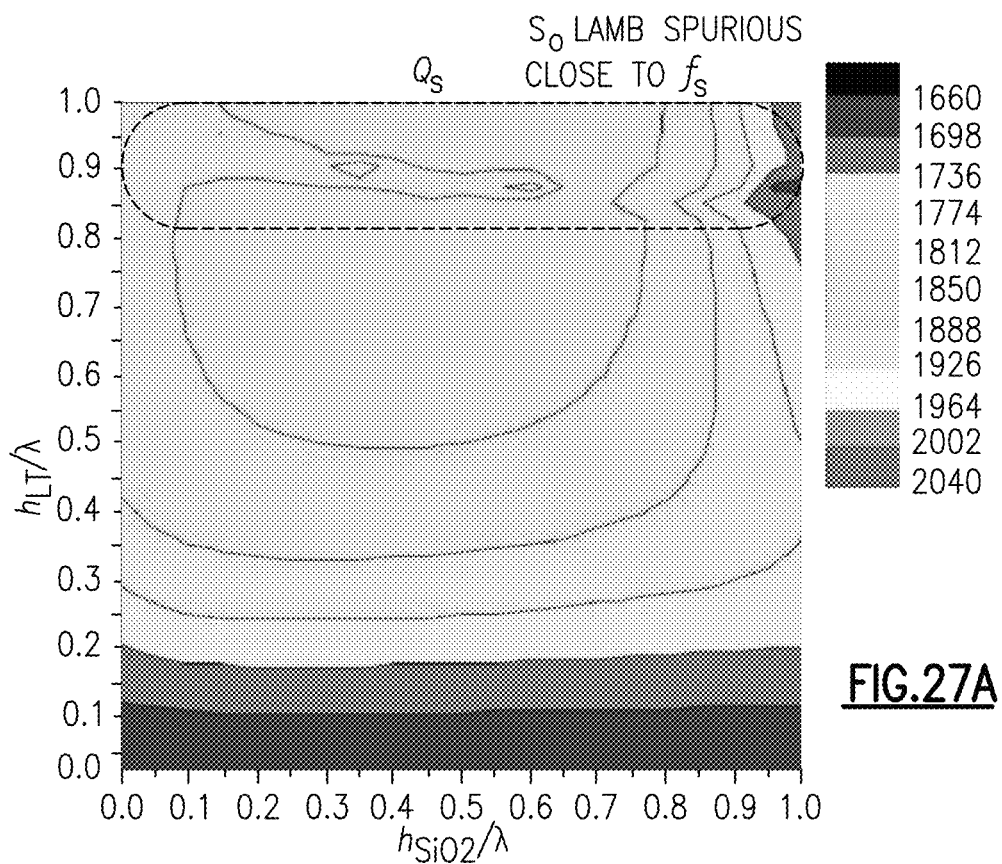
FIG. 27A is a contour plot for Qs for the elastic wave device of FIG. 21.
Figure 27B:
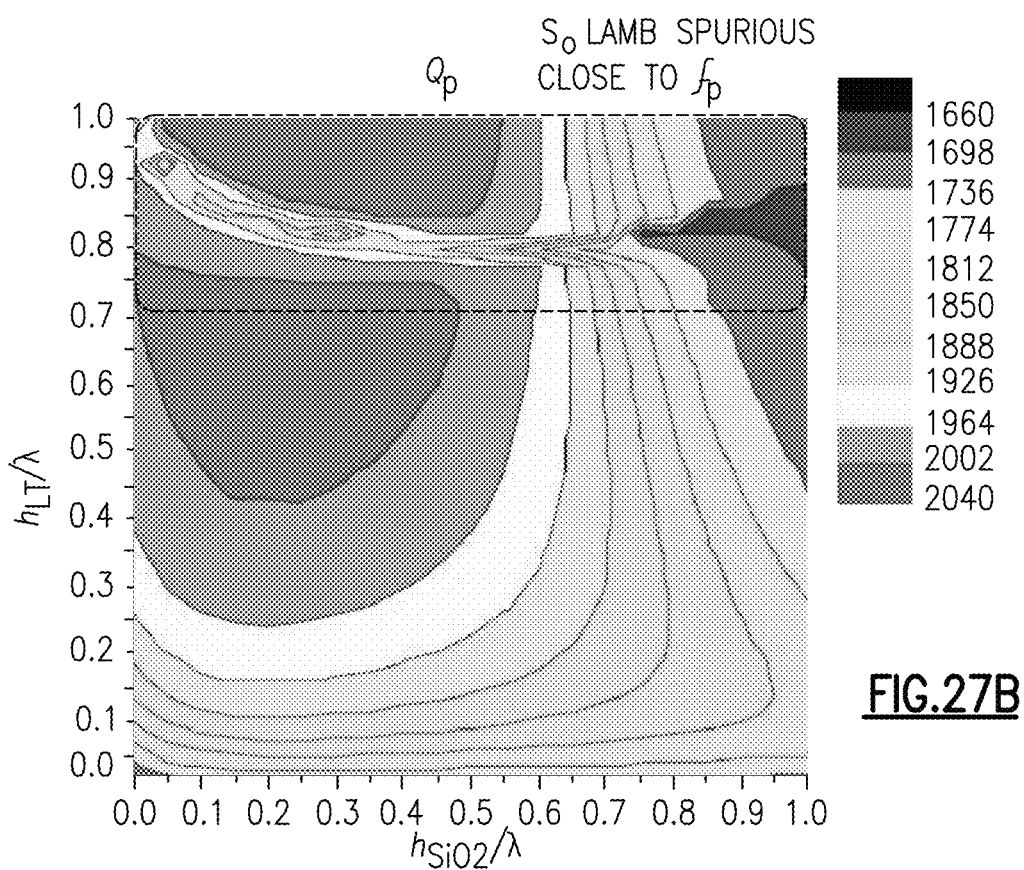
FIG. 27B is a contour plot for Qp for the elastic wave device of FIG. 21.

FIG. 27A is a contour plot for Qs. FIG. 27A indicates a maximum Qs of about 1865 for a 42LT thickness of about 0.7λ and a silicon dioxide thickness of about 0.5λ. FIG. 27B is a contour plot for Qp. FIG. 27B indicates a maximum Qp of about 2015 for a 42LT thickness of about 0.65λ and a silicon dioxide thickness of about 0.25λ.

Figure 28A:
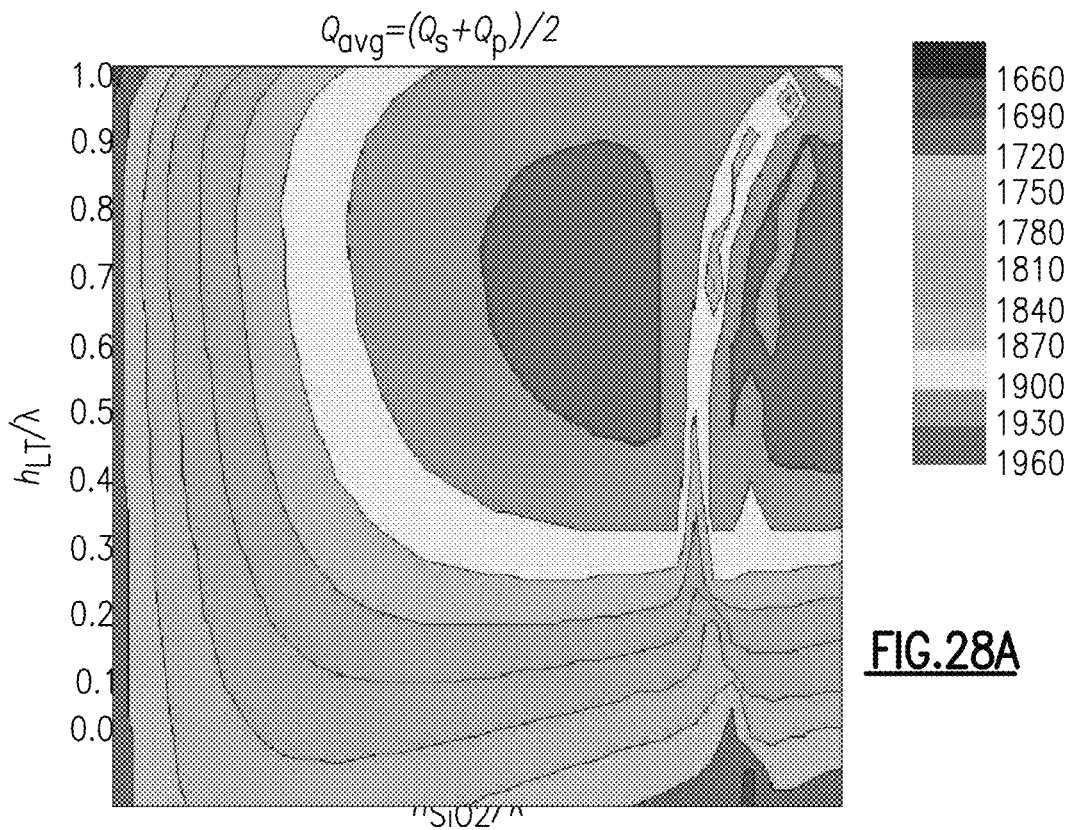
FIG. 28A is a contour plot for Qavg for the elastic wave device of FIG. 21.
Figure 28B:
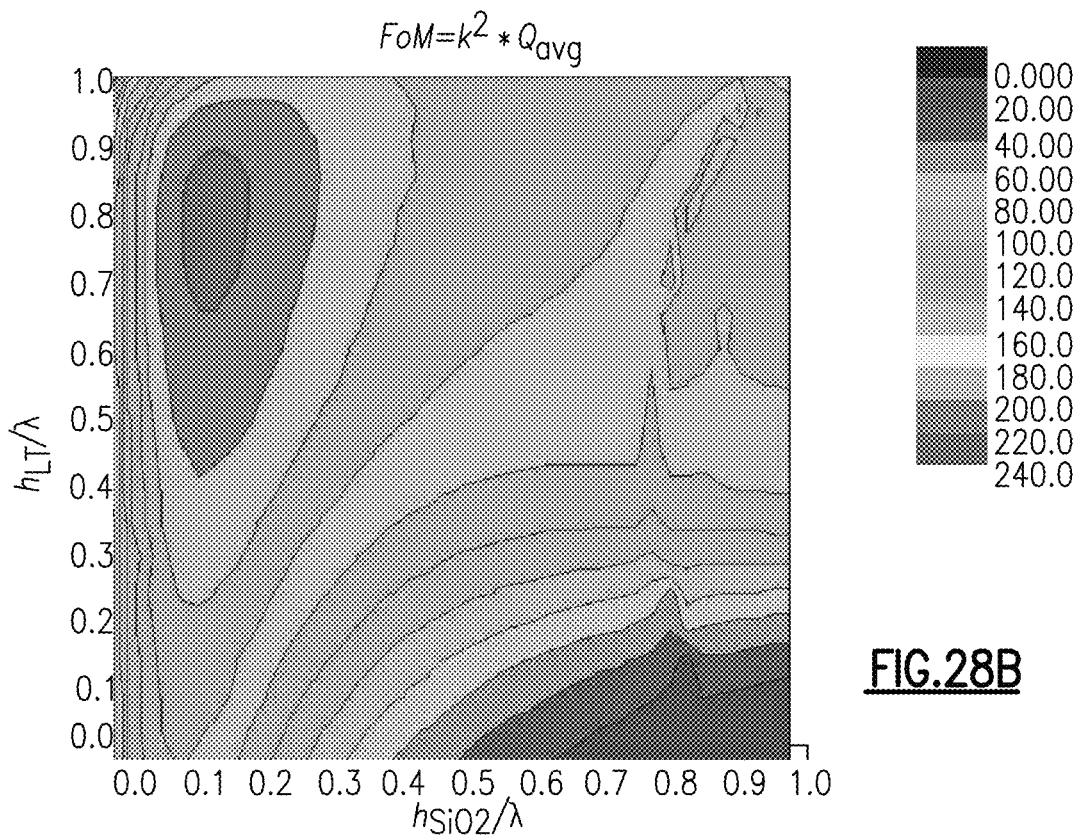
FIG. 28B is a contour plot for FOM for the elastic wave device of FIG. 21.

FIG. 28A is a contour plot for Qavg. Qavg can be an average of Qp and Qs. FIG. 28A indicates a maximum Qavg of about 1935 for a 42LT thickness of about 0.65λ and a silicon dioxide thickness of about 0.3λ. FIG. 28B is a contour plot for FOM. FIG. 28B indicates a maximum FOM of about 225 for a 42LT thickness of about 0.175, and a silicon dioxide thickness of about 0.2λ.

In the elastic wave device 20 of FIG. 21, Qp can be boosted relative to a similar elastic wave device without the temperature compensating layer and the high velocity layer. This can be due to displacement being confined to the surface of the piezoelectric layer 12 of the elastic wave device 20. FIGS. 29A to 29D illustrate displacement being confined to the surface of the piezoelectric layer for 42LT and 5LN piezoelectric layers in the elastic wave device 20 while displacement is not as confined to the surface in similar elastic wave devices without a high velocity layer and a temperature compensating layer.

FIGS. 30A to 36B are graphs of simulations of an elastic wave device 20 having a lithium niobate piezoelectric layer with a 5° cut angle (5LN), a high velocity layer that is a silicon substrate, and a temperature compensating layer that is a silicon dioxide layer.

FIG. 30A is a graph of $k^2$ as a function of 5LN thickness for various thicknesses of the silicon dioxide layer. A maximum $k^2$ of about 29.5% in this graph corresponds to a 5LN thickness of about 0.5λ and a silicon dioxide thickness of 0.05λ.

FIG. 30B is a graph of $v_{P\text{-}OPEN}$ as a function of 5LN thickness for various thicknesses of the silicon dioxide layer.

FIG. 31A illustrates a relationship between Qs and 5LN thicknesses for various silicon dioxide layer thicknesses. A maximum Qs of about 1815 in this graph corresponds to a 5LN thickness of about 0.7λ and a silicon dioxide thickness of about 0.9λ. FIG. 31B illustrates a relationship between Qp and 5LN thicknesses for various silicon dioxide layer thicknesses. A maximum Qp of about 2460 in this graph corresponds to a 5LN thickness of about 0.55λ and a silicon dioxide thickness of about 0.2λ. The dots in FIGS. 31A and 31B indicate that a similar elastic wave device without the silicon substrate and the silicon dioxide layer has Qs of 1798 and Qp of 40.5, respectively. Accordingly, the silicon substrate and the silicon dioxide layer can boost Qp significantly in the elastic wave device 20 with a 5LN piezoelectric layer.

Figure 32B:
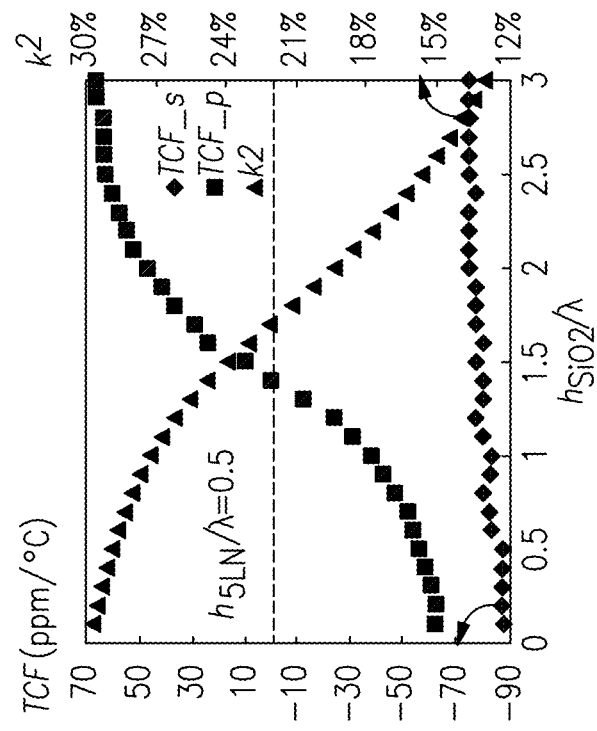
FIGS. 32A and 32B illustrate relationships between (1) TCF and thickness of the silicon dioxide layer and (2) $k^2$ and thickness of the silicon dioxide layer.
Figure 32A:
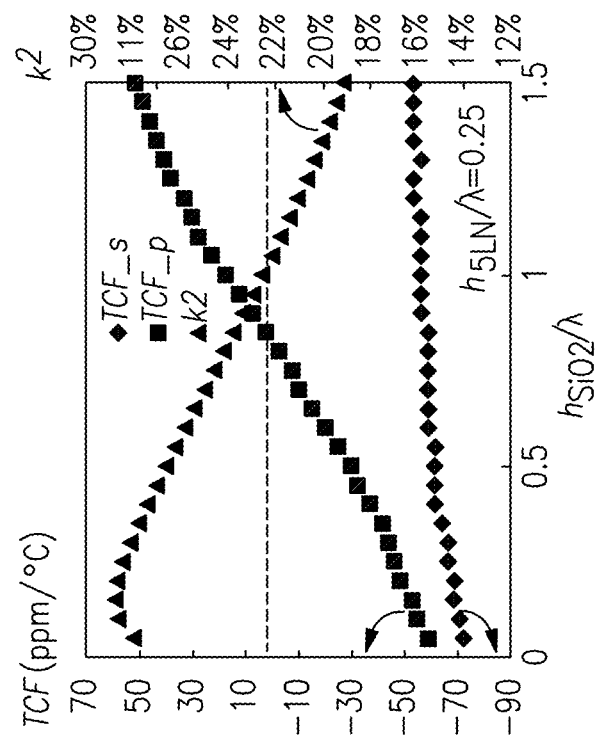

FIGS. 32A and 32B illustrate relationships between (1) TCF and thickness of the silicon dioxide layer and (2) k2 and thickness of the silicon dioxide layer. FIG. 32A corresponds to a 5LN with a thickness of 0.25λ. FIG. 32B corresponds to a 5LN with a thickness of 0.5λ.

Figure 33A:
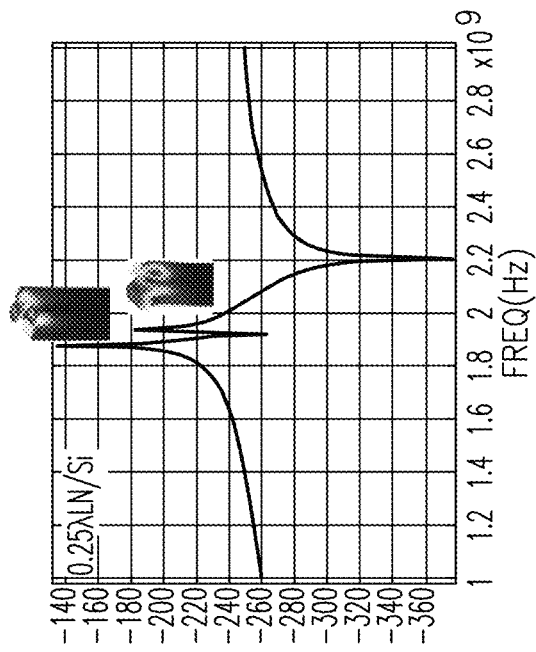
FIGS. 33A to 33C illustrate spurious modes in frequency responses for various 5LN elastic wave devices.
Figure 33C:
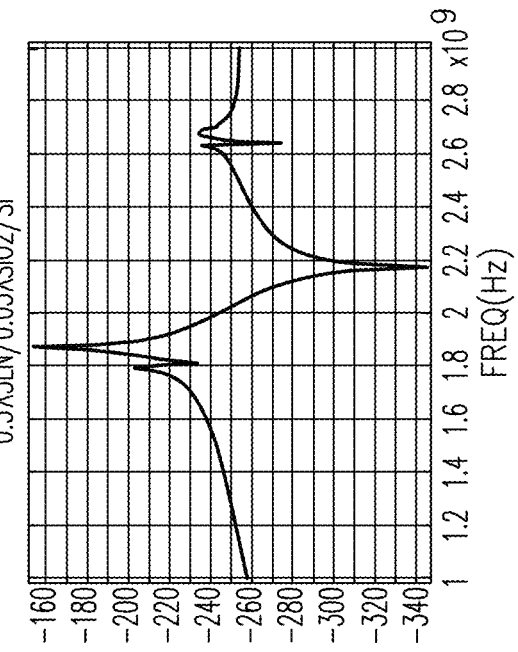
Figure 33B:
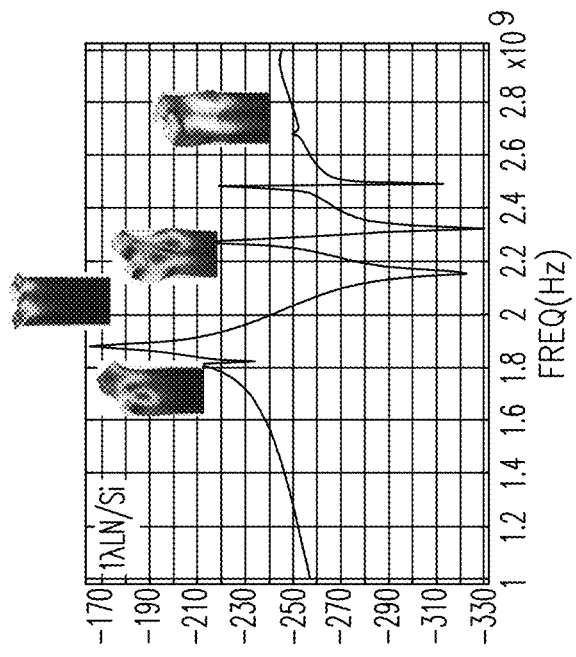

FIGS. 33A to 33C illustrate spurious modes in frequency responses for various 5LN elastic wave devices. FIGS. 33A and 33B relate to 5LN/Si elastic wave devices. FIG. 33C relates to a 5LN/SiO$_2$/Si elastic wave device. FIG. 33A shows a Rayleigh wave in a pass band when the 5LN layer has a thickness of less than 0.3λ. FIG. 33B shows a plate mode response in a pass band when the 5LN layer has a thickness of greater than 0.9λ. FIG. 33C shows a relatively clean frequency response for a 5LN layer with a thickness of 0.5λ and a silicon dioxide layer with a thickness of 0.05λ. A relatively clean passband can be achieved with a 5LN layer with a thickness in a range from about 0.3λ to 0.8λ.

Figure 34A:
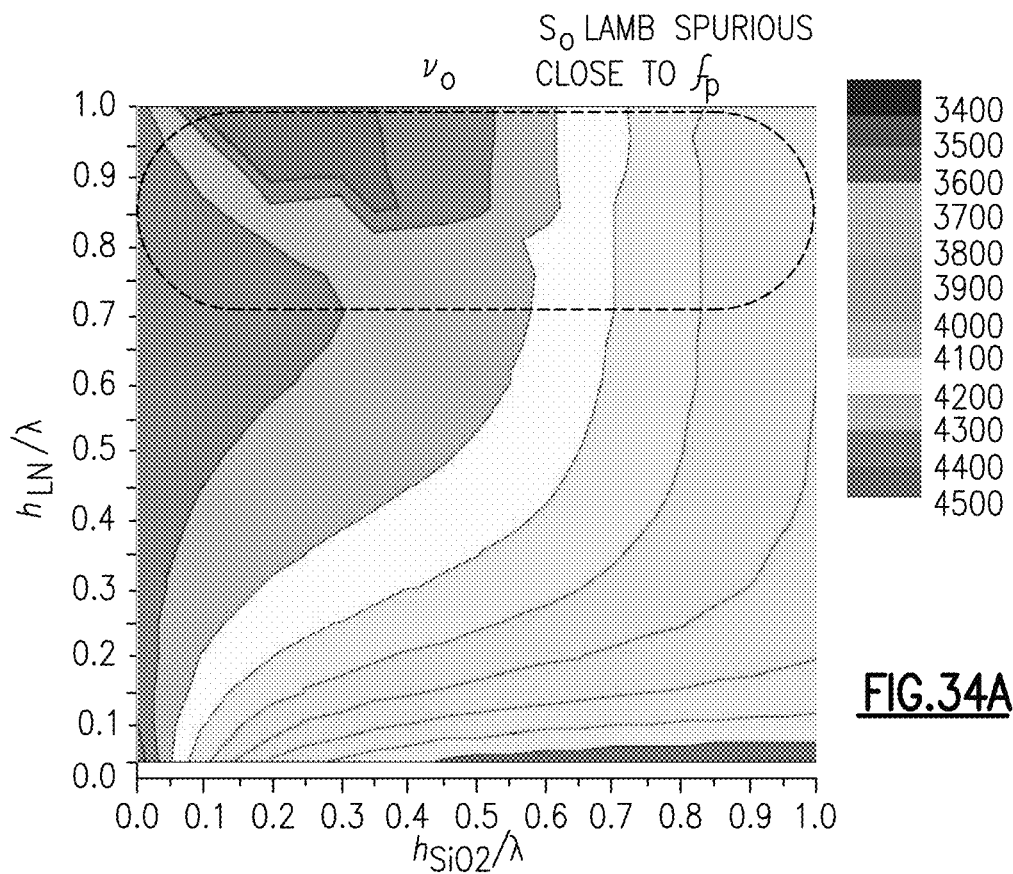
FIG. 34A is a contour plot for Vo for the elastic wave device of FIG. 21.
Figure 34B:
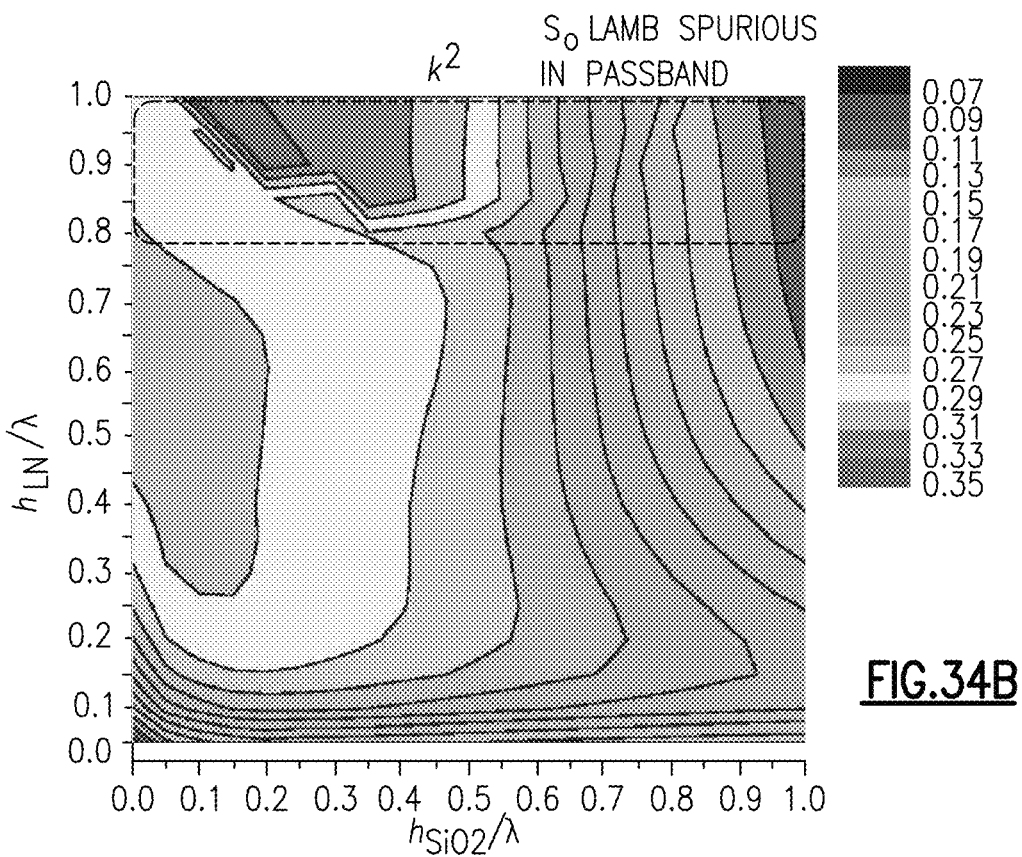
FIG. 34B is a contour plot for $k^2$ for the elastic wave device of FIG. 21.

FIG. 34A is a contour plot for Vo. FIG. 34B is a contour plot for $k^2$. FIG. 34B indicates a maximum $k^2$ of about 29.5% for a 5LN thickness of about 0.5λ and a silicon dioxide thickness of about 0.05λ.

Figure 35A:
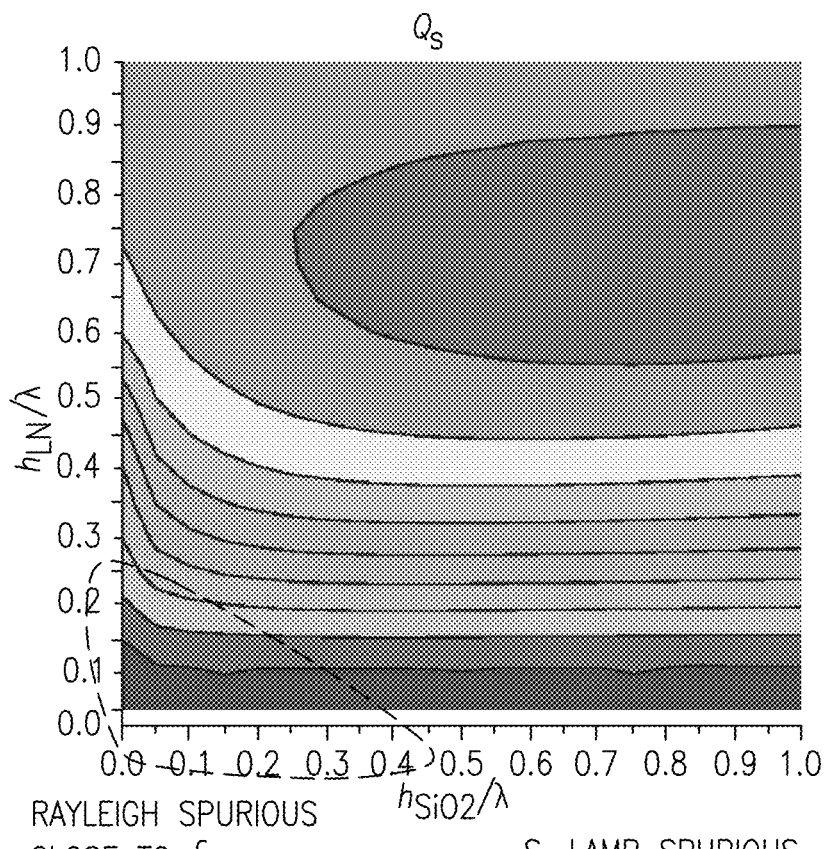
FIG. 35A is a contour plot for Qs for the elastic wave device of FIG. 21.
Figure 35B:
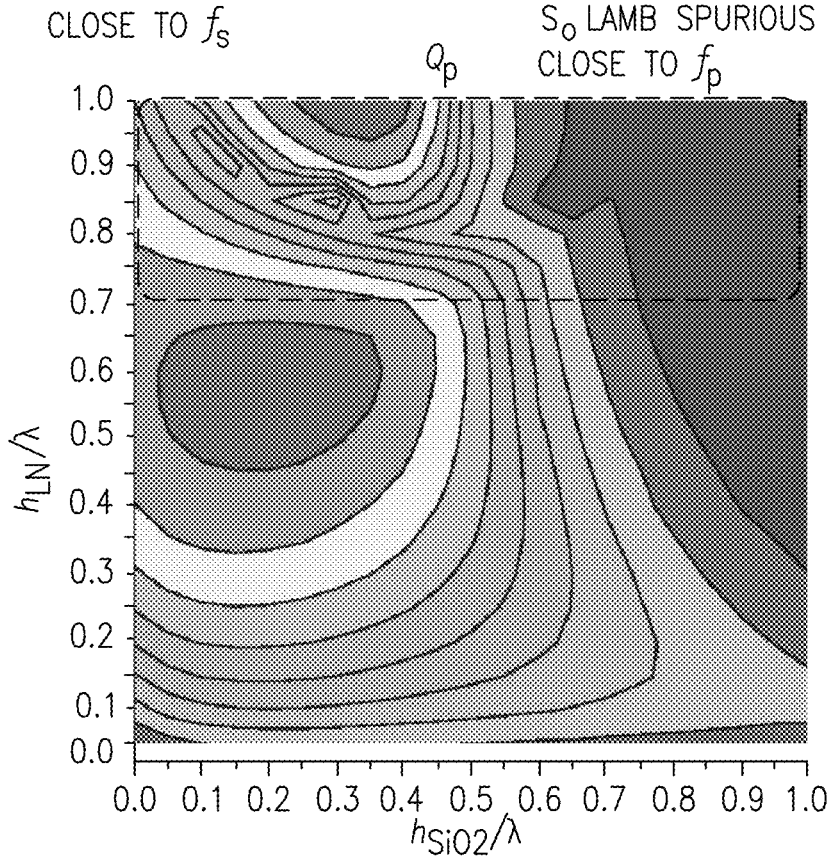
FIG. 35B is a contour plot for Qp for the elastic wave device of FIG. 21.

FIG. 35A is a contour plot for Qs. FIG. 35A indicates a maximum Qs of about 1815 for a 5LN thickness of about 0.7λ and a silicon dioxide thickness of about 0.9λ. FIG. 35B is a contour plot for Qp. FIG. 35B indicates a maximum Qp of about 2460 for a 5LN thickness of about 0.55, and a silicon dioxide thickness of about 0.2λ.

Figure 36A:
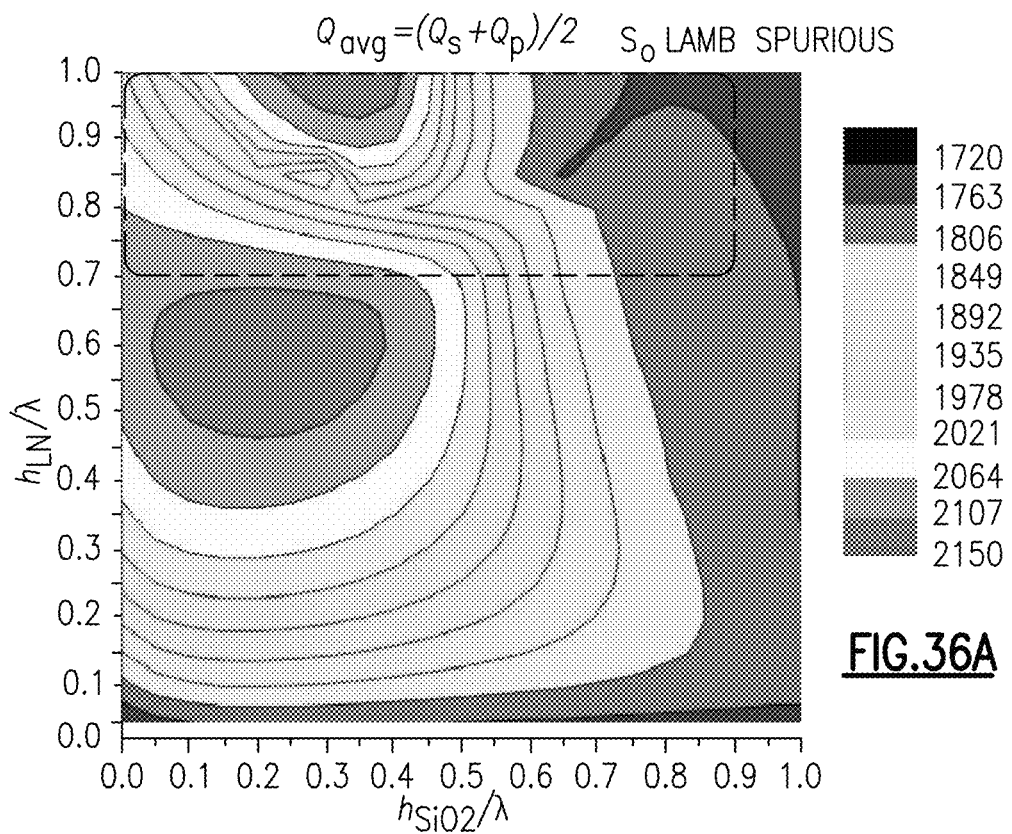
FIG. 36A is a contour plot for Qavg for the elastic wave device of FIG. 21.
Figure 36B:
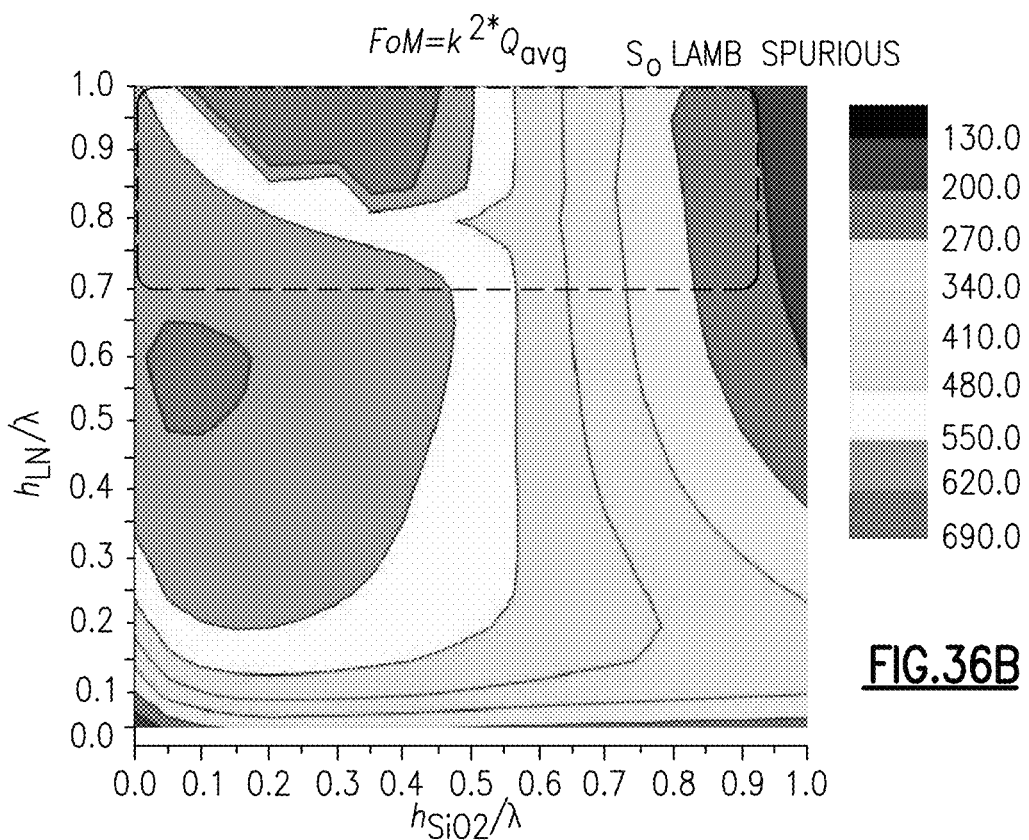
FIG. 36B is a contour plot for FOM for the elastic wave device of FIG. 21.

FIG. 36A is a contour plot for Qavg. FIG. 36A indicates a maximum Qavg of about 2130 for a 5LN thickness of about 0.6λ and a silicon dioxide thickness of about 0.26λ. FIG. 36B is a contour plot for FOM. FIG. 36B indicates a maximum FOM of about 625 for a 5LN thickness of about 0.55, and a silicon dioxide thickness of about 0.1λ.

FIGS. 37A to 37F are graphs that compare various parameters for elastic wave devices with a silicon dioxide layer in various positions. These graphs each include curves that correspond to elastic wave devices with (1) an aluminum IDT electrode over a 5LN piezoelectric layer over a silicon substrate, (2) an aluminum IDT electrode over a 5LN piezoelectric layer over a silicon dioxide layer over a silicon substrate, (3) a silicon dioxide layer over an aluminum IDT electrode over a 5LN piezoelectric layer over a silicon substrate, and (4) an aluminum IDT electrode over a silicon dioxide layer over a 5LN piezoelectric layer over a silicon substrate. These simulations sweep thickness of the 5LN piezoelectric layer and set the thickness of the silicon dioxide layer at 0.1λ.

Figure 37E:
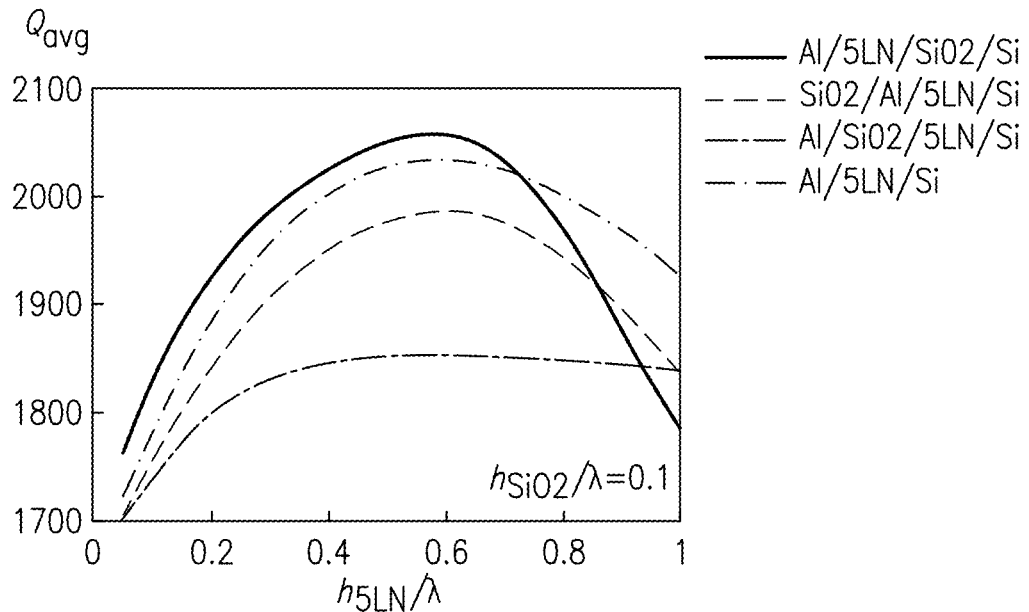
Figure 37F:
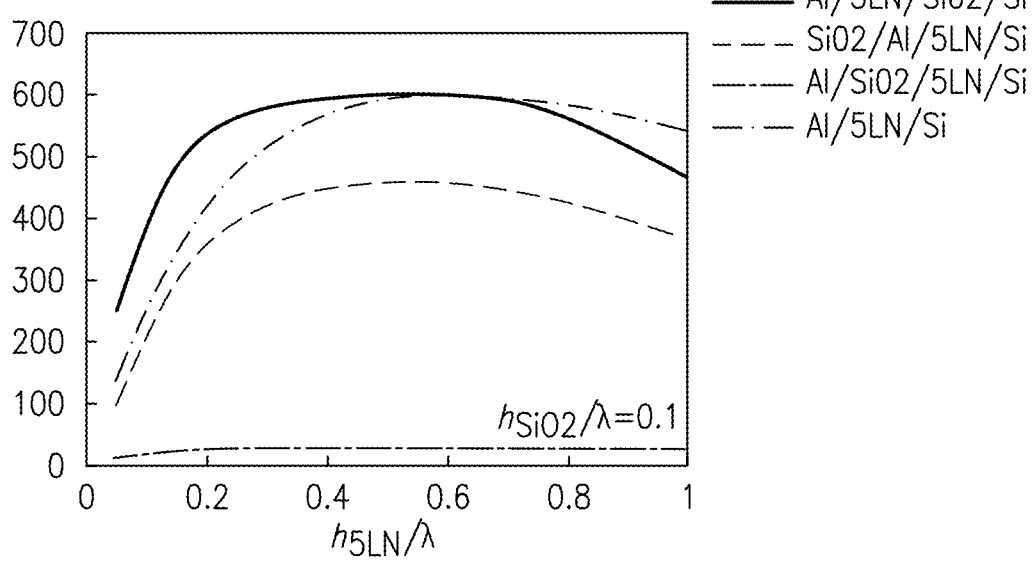

FIG. 37A is a graph of Vo. This graph indicates that low-velocity silicon dioxide is least involved in wave propagation. FIG. 37B is a graph of $k^2$. FIG. 37B indicates that $k^2$ is particularly low when a silicon dioxide layer is disposed between an IDT electrode and a 5LN layer. FIG. 37C is a graph of Qp. FIG. 37D is a graph of Qs. FIG. 37D indicates that the Al/5LN/SiO$_2$/Si elastic wave has the best Qp. This can be due to the largest reflection on the SiO$_2$/Si interface to prevent leakage into the silicon substrate. FIG. 37E is a graph of Qavg. FIG. 37F is a graph of FOM. These graphs indicate that SiO$_2$/Al/5LN/Si can be used as an alternative to 5LN/SiO$_2$/Si, with slightly lower $k^2$ and Q.

Figure 38A:
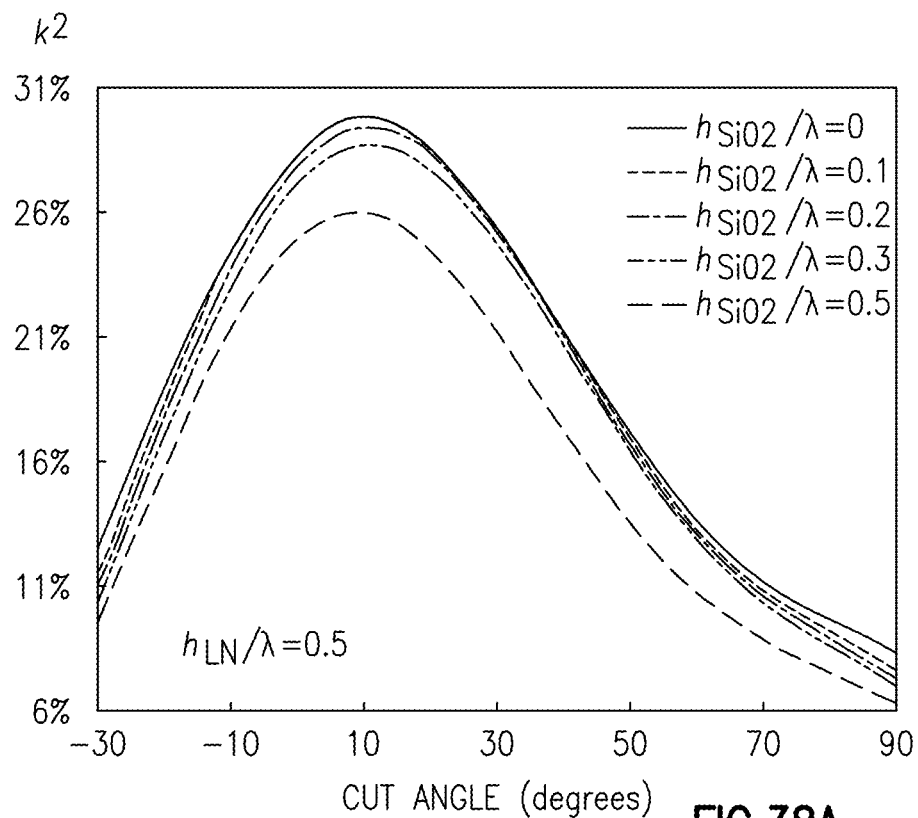
FIG. 38A is graph of $k^2$ as a function of a cut angle of an LN layer in an elastic wave device of FIG. 21 that includes an LN piezoelectric on a silicon substrate with a silicon dioxide layer disposed therebetween.

FIG. 38A is graph of $k^2$ as a function of a cut angle of an LN layer in an elastic wave device 20 that includes an LN piezoelectric layer having a thickness of 0.5λ, a high velocity layer that is a silicon substrate, and a temperature compensating layer that is a silicon dioxide layer. Different curves on this graph correspond to different silicon dioxide layer thicknesses. FIG. 38A indicates a maximum $k^2$ of about 30% at a cut angle of 10° and a silicon dioxide thickness of 0.

Figure 38B:
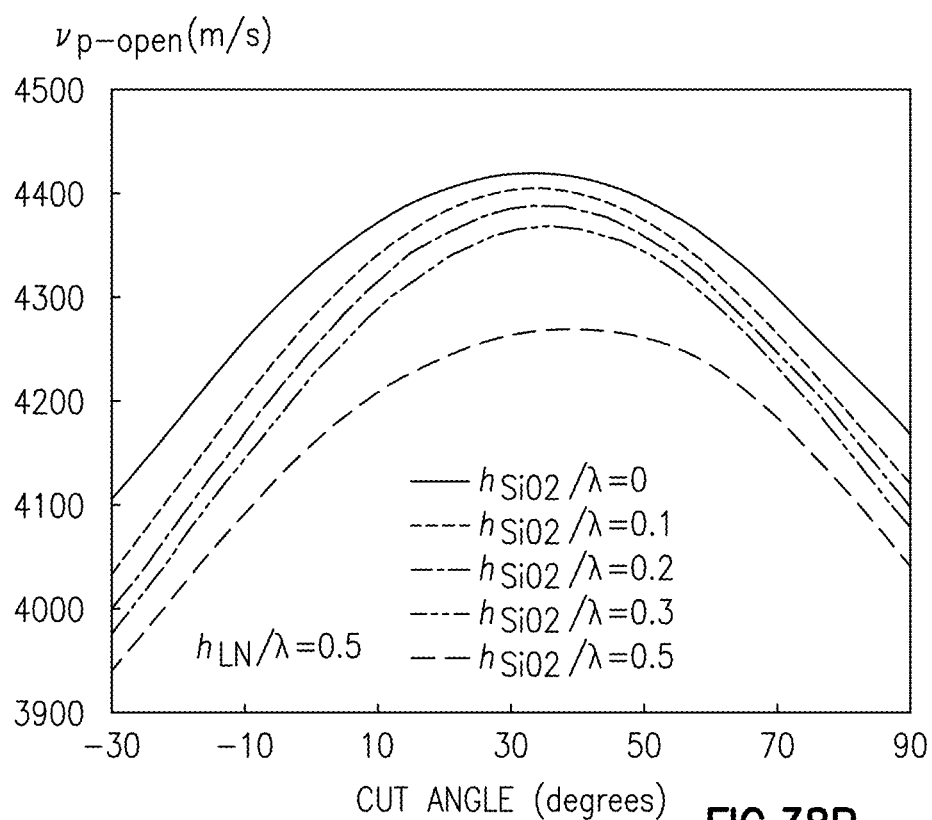
FIG. 38B is graph of $v_{P\text{-}OPEN}$ as a function of a cut angle of an LN layer in an elastic wave device of FIG. 21 that includes an LN piezoelectric on a silicon substrate with a silicon dioxide layer disposed therebetween.

FIG. 38B is graph of $v_{P\text{-}OPEN}$ as a function of a cut angle of an LN layer in an elastic wave device 20 that includes an LN having a thickness of 0.5λ, a high velocity layer that is a silicon substrate, and a temperature compensating layer that is a silicon dioxide layer. Different curves on this graph correspond to different silicon dioxide layer thicknesses. FIG. 38B indicates a maximum $v_0$ of about 4420 m/s at a cut angle of 35° and a silicon dioxide thickness of 0.

Figure 38C:
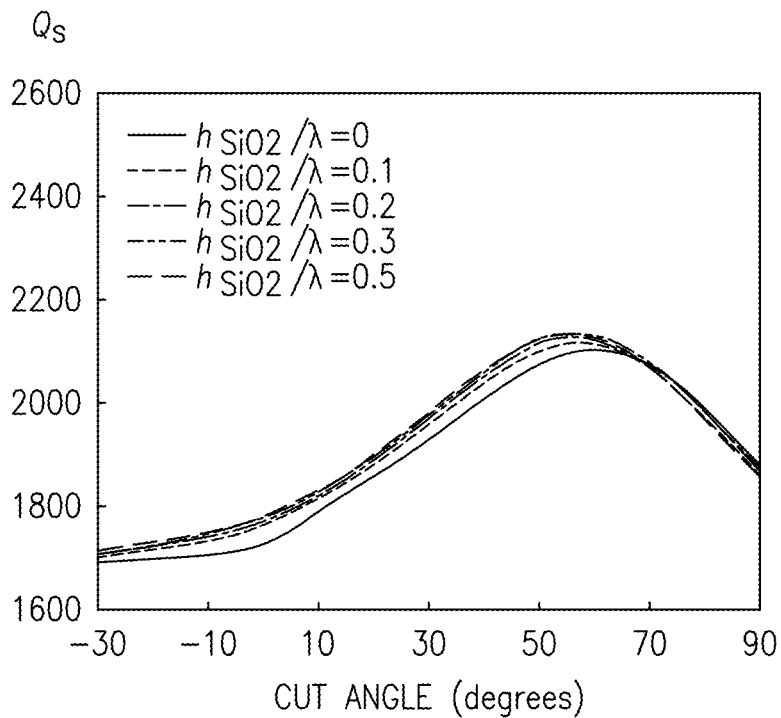
FIG. 38C is graph of Qs as a function of a cut angle of an LN layer in an elastic wave device of FIG. 21 that includes that includes an LN piezoelectric on a silicon substrate with a silicon dioxide layer disposed therebetween.

FIG. 38C is graph of Qs as a function of a cut angle of an LN layer in an elastic wave device 20 that includes an LN having a thickness of 0.5λ, a high velocity layer that is a silicon substrate, and a temperature compensating layer that is a silicon dioxide layer. Different curves on this graph correspond to different silicon dioxide layer thicknesses. FIG. 38C indicates a maximum Qs of about 2135 at a cut angle of 55° and a silicon dioxide thickness of 0.3λ.

Figure 38D:
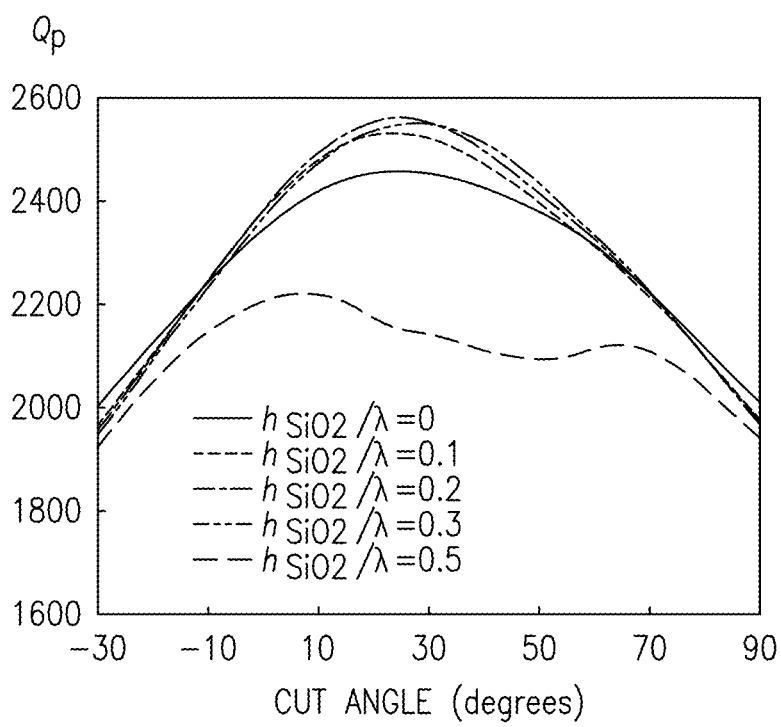
FIG. 38D is graph of Qp as a function of a cut angle of an LN layer in an elastic wave device of FIG. 21 that includes an LN piezoelectric on a silicon substrate with a silicon dioxide layer disposed therebetween.
Figure 39A:
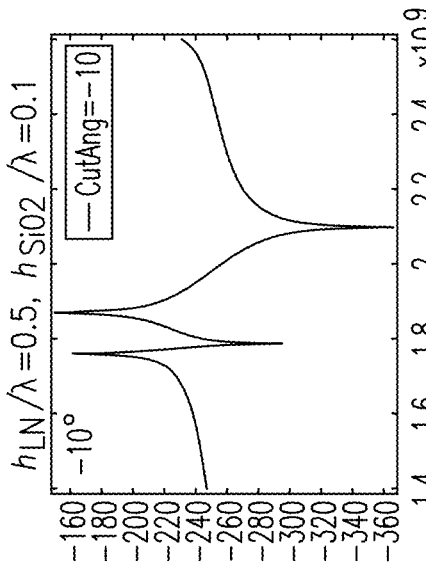
FIGS. 39A to 39L illustrate admittance over frequency for various cut angles of LN pf an elastic wave device of FIG. 21 an that includes an LN piezoelectric on a silicon substrate with a silicon dioxide layer disposed therebetween.
Figure 39B:
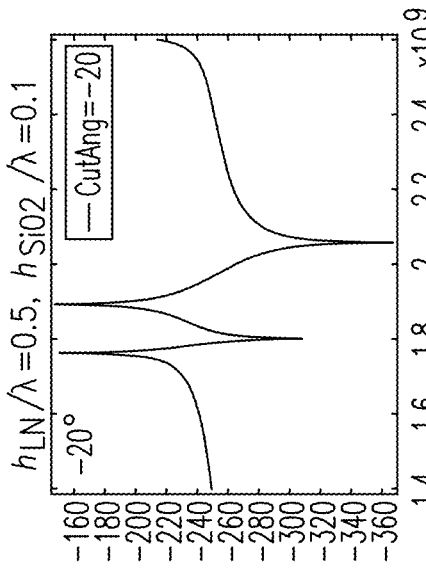
Figure 39C:
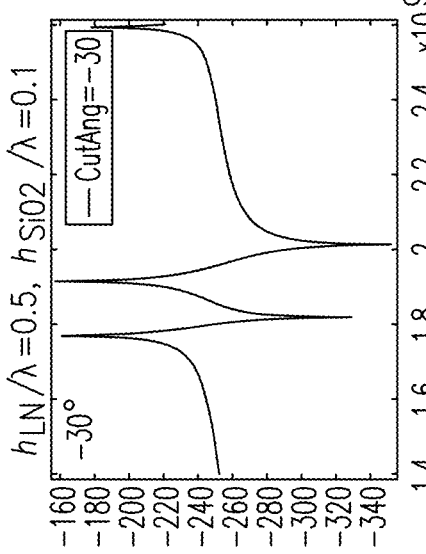
Figure 39D:
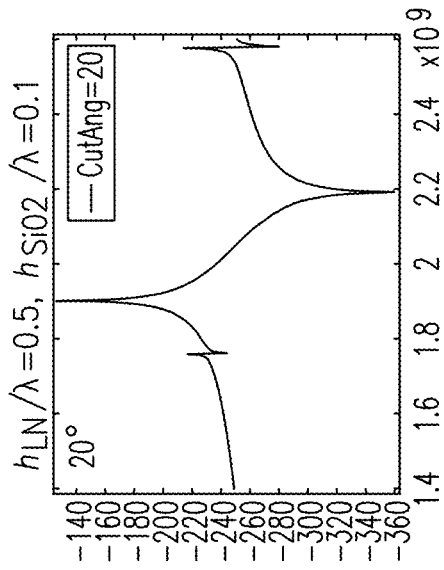
Figure 39E:
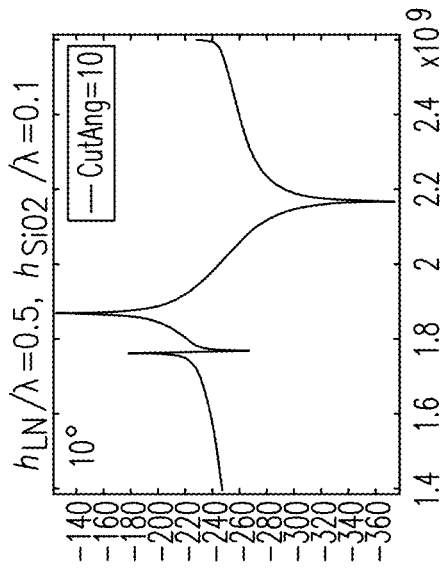
Figure 39F:
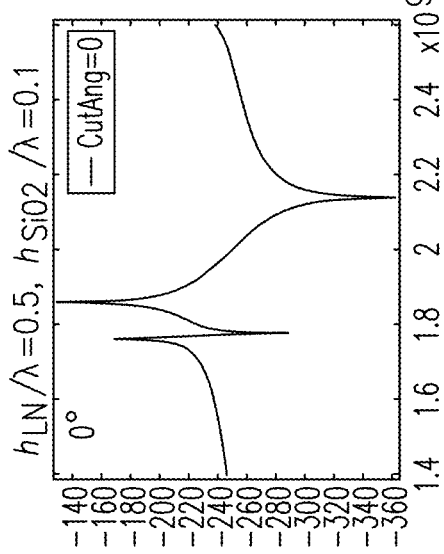
Figure 39G:
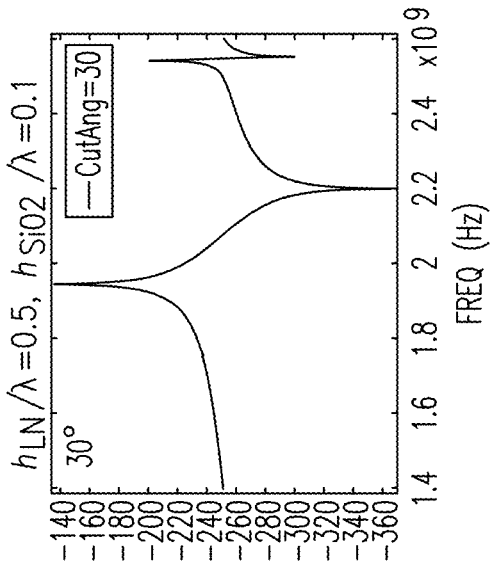
Figure 39H:
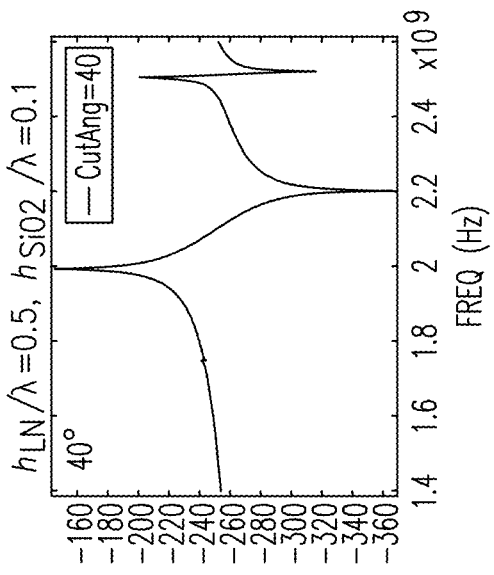
Figure 39I:
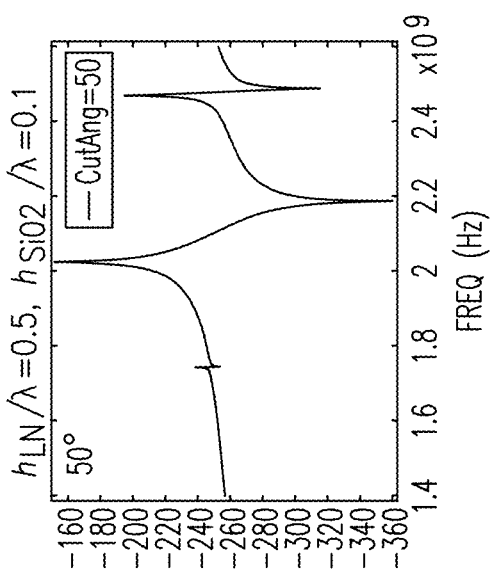
Figure 39J:
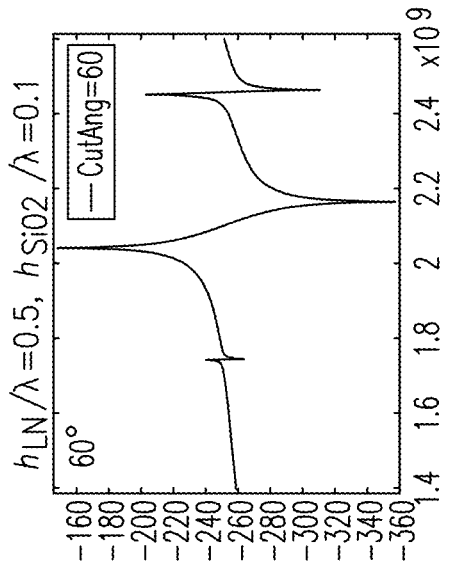
Figure 39K:
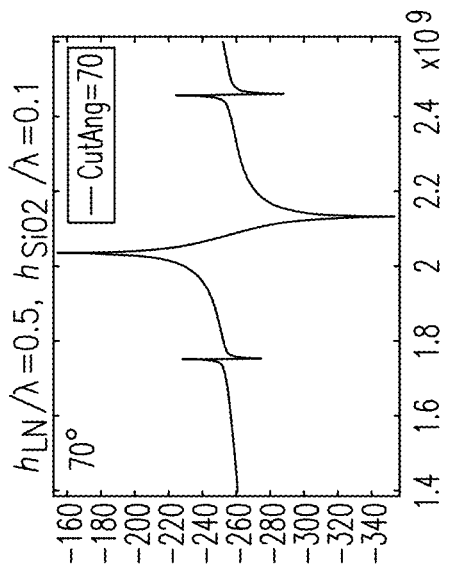
Figure 39L:
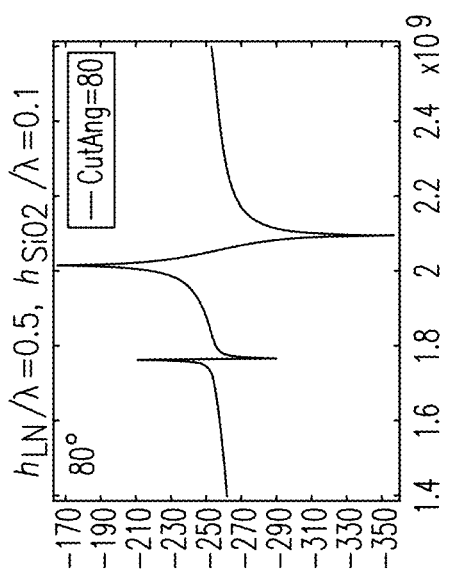

FIG. 38D is graph of Qp as a function of a cut angle of an LN layer in an elastic wave device 20 that includes an LN having a thickness of 0.5λ, a high velocity layer that is a silicon substrate, and a temperature compensating layer that is a silicon dioxide layer. Different curves on this graph correspond to different silicon dioxide layer thicknesses. FIG. 38D indicates a maximum Qp of about 2560 at a cut angle of 25° and a silicon dioxide thickness of 0.25λ.

FIGS. 39A to 39L illustrate admittance over frequency for an elastic wave device 20 with an LN piezoelectric layer having a thickness of 0.5λ, temperature compensating layer that is a silicon dioxide layer having a thickness of 0.1λ, and a high velocity layer that is a silicon substrate for various cut angles of LN.

Figure 40:
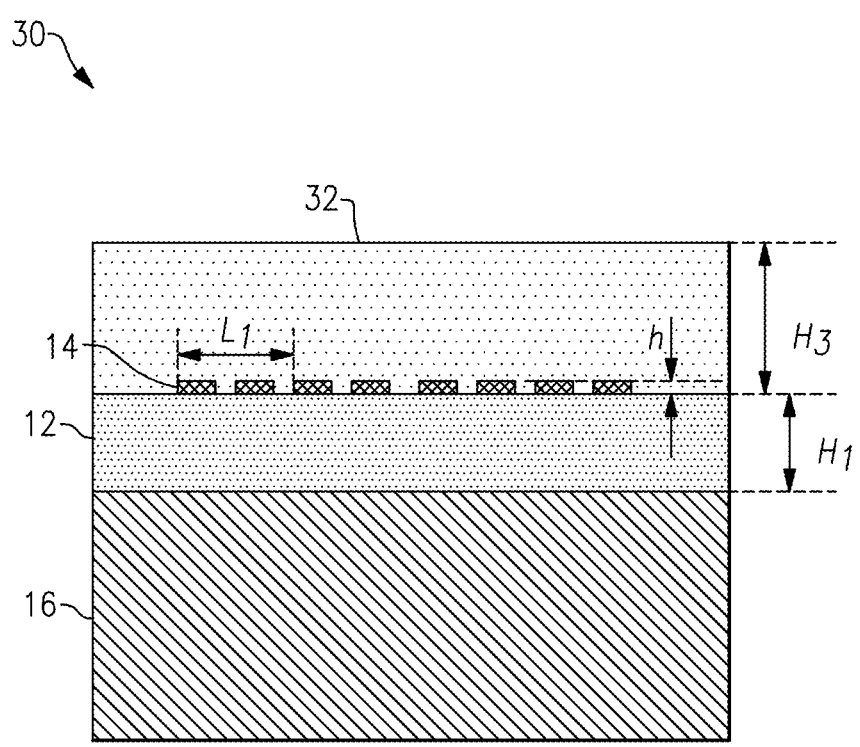
FIG. 40 is a cross-sectional view of an elastic wave device according to an embodiment.

FIG. 40 is a cross-sectional view of an elastic wave device 30 according to an embodiment. As illustrated, the elastic wave device 30 includes a piezoelectric layer 12, an IDT electrode 14, a high velocity layer 16, and a temperature compensating layer 32. The elastic wave device 30 is like the elastic wave device 10 of FIG. 1 except that a temperature compensating layer 32 is included over the IDT electrode 14 such that the IDT electrode 14 is between the piezoelectric layer 12 and the temperature compensating layer 32. As illustrated, the temperature compensating layer 32 covers the IDT electrode 14 opposite the piezoelectric layer 12. The temperature compensating layer 32 can improve the TCF of the elastic wave device 30 relative to the elastic wave device 10.

The temperature compensating layer 32 can bring the TFC of the elastic wave device 30 closer to zero than the TCF of a similar elastic wave device that does not include the temperature compensating layer. The temperature compensating layer 32 can have a positive temperature coefficient of frequency. For instance, the temperature compensating layer 32 can be a silicon dioxide ($SiO_2$) layer. The temperature compensating layer 32 can alternatively be a tellurium dioxide ($TeO_2$) layer or a SiOF layer. The temperature compensating layer 32 can include any suitable combination of $SiO_2$, $TeO_2$, and/or SiOF. The temperature compensating layer 32 can have a lower bulk velocity than a velocity of the elastic wave generated by the IDT electrode 14. The temperature compensating layer 32 can be a dielectric layer. The temperature compensating layer 32 can have a lower acoustic impedance than the piezoelectric layer 12. The temperature compensating layer 32 can have a lower acoustic impedance than the high velocity layer 16. The illustrated temperature compensating layer 32 has a thickness $H_3$.

Figure 41A:
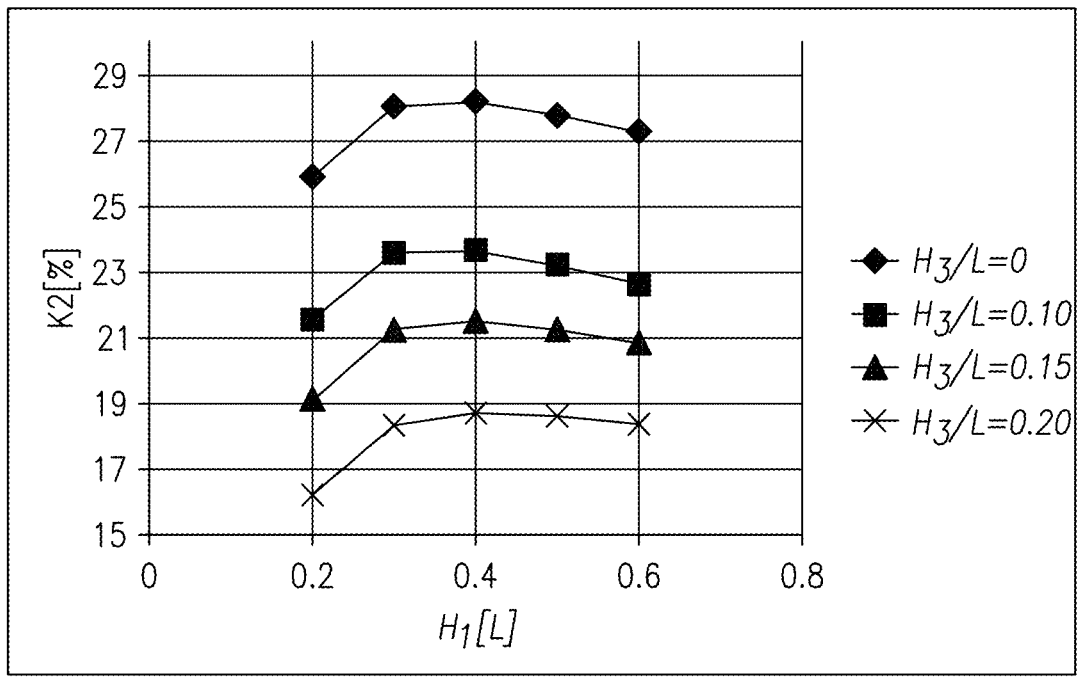
FIGS. 41A and 41B are graphs of simulations of an elastic wave device of FIG. 40 having a lithium niobate piezoelectric layer, a high velocity layer, and a dielectric layer over the IDT electrode.
Figure 41B:
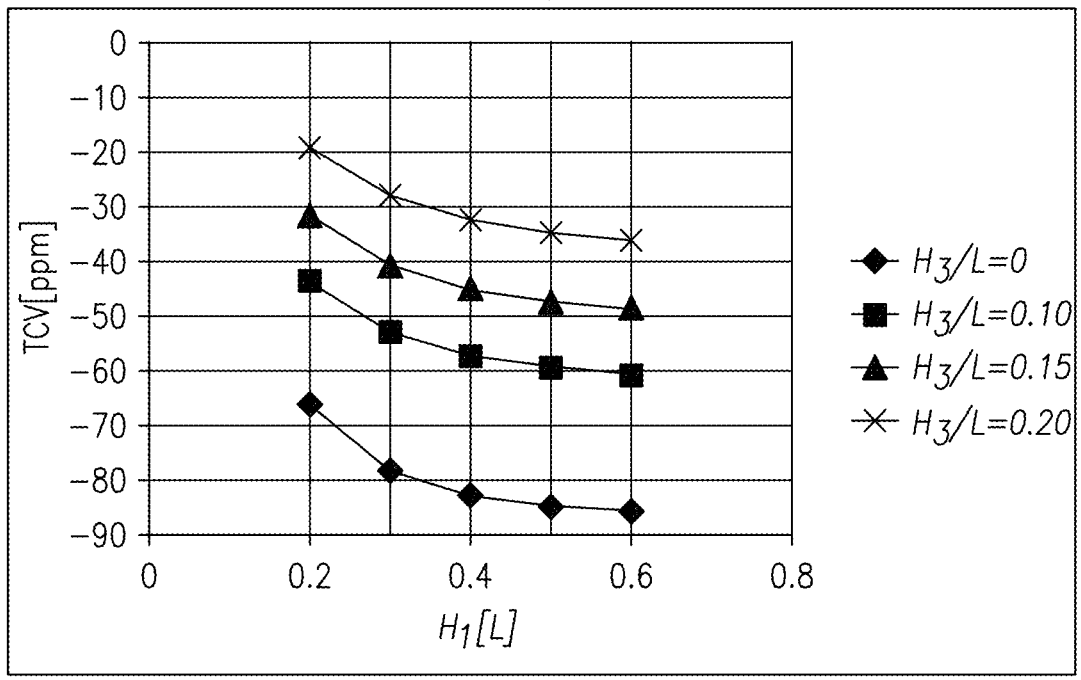

FIGS. 41A and 41B are graphs of simulations of an elastic wave device 30 having a lithium niobate piezoelectric layer, a high velocity layer, and a temperature compensating layer over the IDT electrode. FIG. 41A is a graph of $k^2$ as a function of LN thickness for various thicknesses of the dielectric layer. FIG. 41B is a graph of temperature coefficient of velocity (TCV) as a function of LN thickness for various thicknesses of the temperature compensating layer.

Figure 42A:
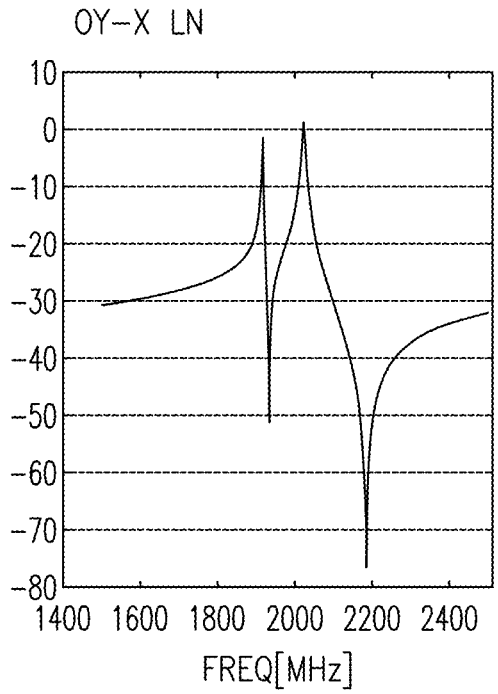
FIGS. 42A to 42D are graphs of simulations of an elastic wave device of FIG. 40 that includes silicon dioxide over a LN piezoelectric layer on a silicon substrate.
Figure 42B:
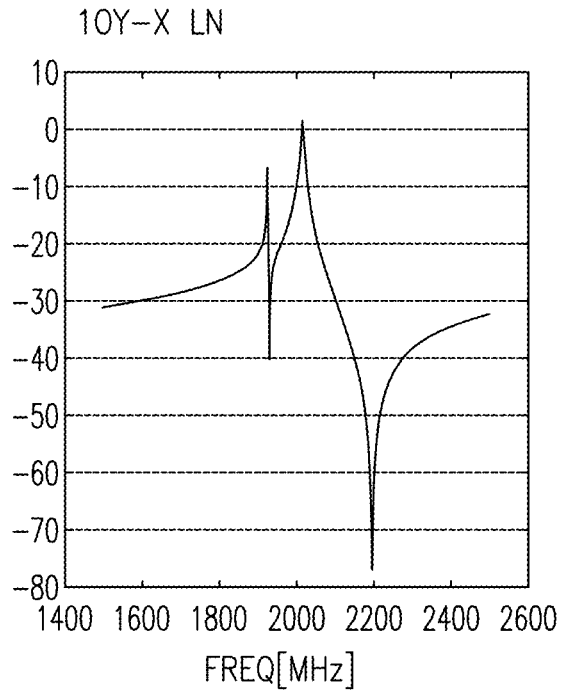
Figure 42C:
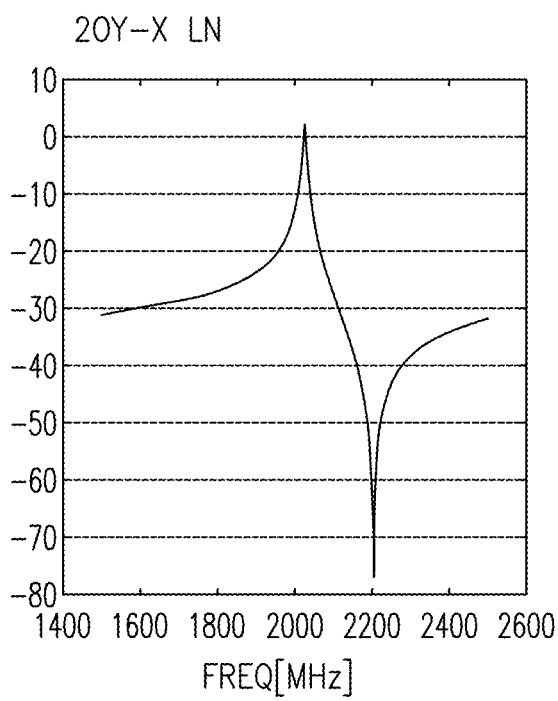
Figure 42D:
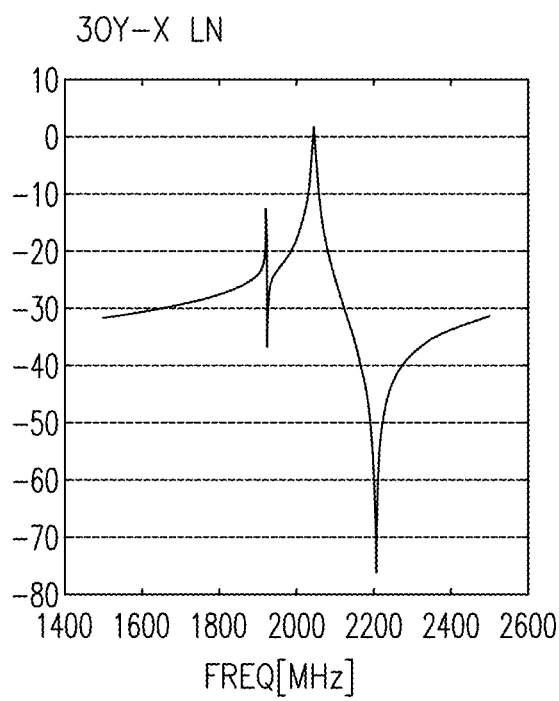

FIGS. 42A to 42D are graphs of simulations of an elastic wave device 30 configured to generate an elastic wave having a wavelength of 2.0 um, in which the elastic wave device 30 includes a high velocity layer that is a silicon substrate, an IDT electrode having a height of 160 nm (0.08λ), an $SiO_2$ temperature compensating layer with a thickness of 0.4 um (0.2λ) over the IDT electrode, and a lithium niobate piezoelectric layer with a thickness of 0.5 um (0.25λ). FIGS. 42A to 42D correspond to different cut angles of the lithium niobate piezoelectric layer. In particular, FIG. 42A corresponds to a cut angle of 0°, FIG. 42B corresponds to a cut angle of 10°, FIG. 42C corresponds to a cut angle of 20°, and FIG. 42D corresponds to a cut angle of 30°. As shown in FIG. 42C, a Rayleigh spur can be suppressed for a cut angle of 20°. A cut angle in a range from about 15° to 25° can be desirable in an elastic wave device 30 with a LN piezoelectric layer on a silicon substrate.

FIGS. 43A to 45B are graphs of simulations of an elastic wave device 30 having a lithium niobate piezoelectric layer with a 5° cut angle (5LN), a high velocity layer that is a silicon substrate, and a temperature compensating layer that is a silicon dioxide layer.

Figure 43A:
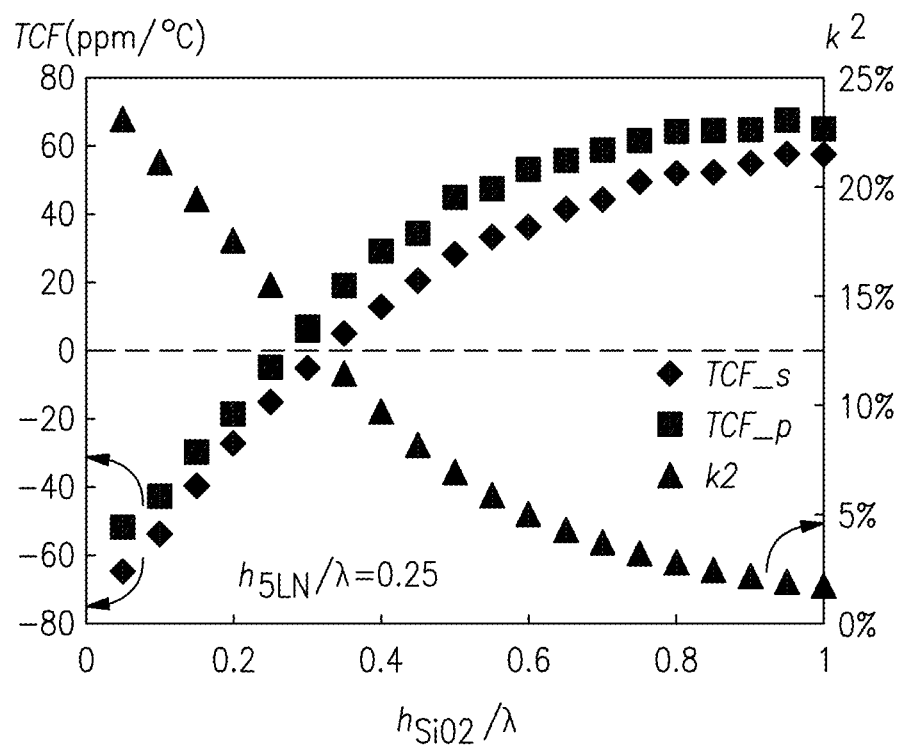
FIGS. 43A and 43B illustrate relationships between (1) TCF and thickness of the silicon dioxide layer and (2) $k^2$ and thickness of the silicon dioxide layer for an elastic wave device of FIG. 40 with a 5LN piezoelectric layer.
Figure 43B:
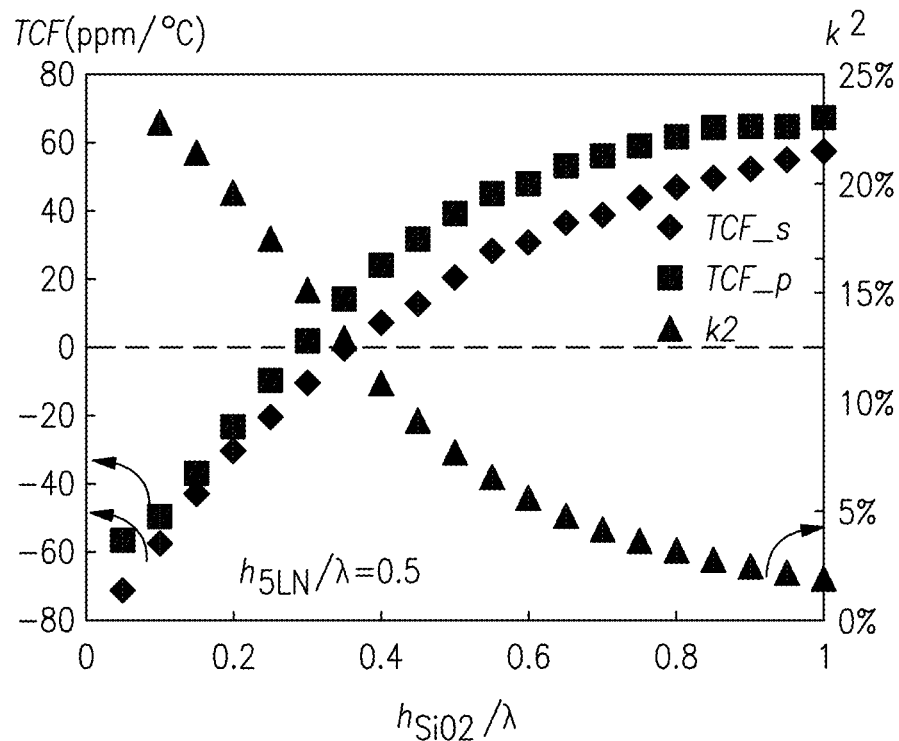

FIGS. 43A and 43B illustrate relationships between (1) TCF and thickness of the silicon dioxide layer and (2) $k^2$ and thickness of the silicon dioxide layer. FIG. 43A corresponds to a 5LN piezoelectric layer with a thickness of 0.25λ. An average TCF of 0 is indicated at a silicon dioxide thickness of about 0.3λ in FIG. 43A. FIG. 43B corresponds to a 5LN piezoelectric layer with a thickness of 0.5λ. An average TCF of 0 is indicated at a silicon dioxide thickness of about 0.3λ in FIG. 43B. These simulations suggest that a silicon dioxide of around 0.3λ can achieve a desirable TCF in such devices.

Figure 44A:
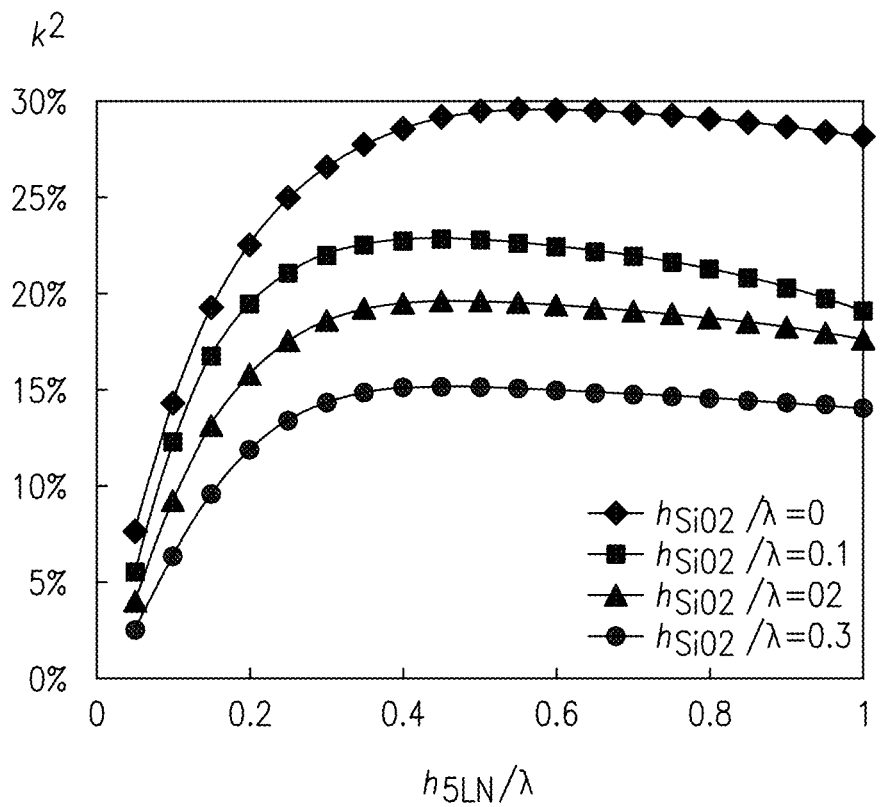
FIG. 44A is a graph of $k^2$ as a function of 5LN thickness for various thicknesses of a silicon dioxide layer of an elastic wave device of FIG. 40.
Figure 44B:
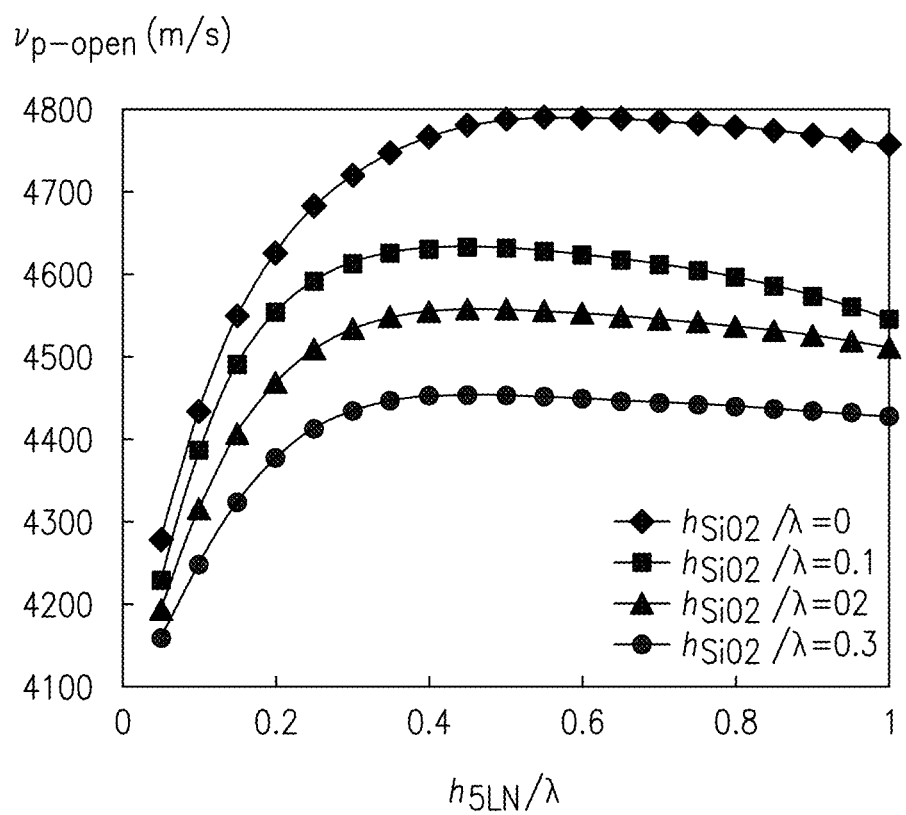
FIG. 44B is a graph of $v_{P\text{-}OPEN}$ as a function of 5LN thickness for various thicknesses of a silicon dioxide layer of an elastic wave device of FIG. 40.

FIG. 44A is a graph of $k^2$ as a function of 5LN thickness for various thicknesses of the silicon dioxide layer. This graph suggests that having a silicon dioxide layer over the IDT electrode on a 5LN layer can reduce $k^2$. FIG. 44B is a graph of $v_{P-OPEN}$ as a function of 5LN thickness for various thicknesses of the silicon dioxide layer.

Figure 45A:
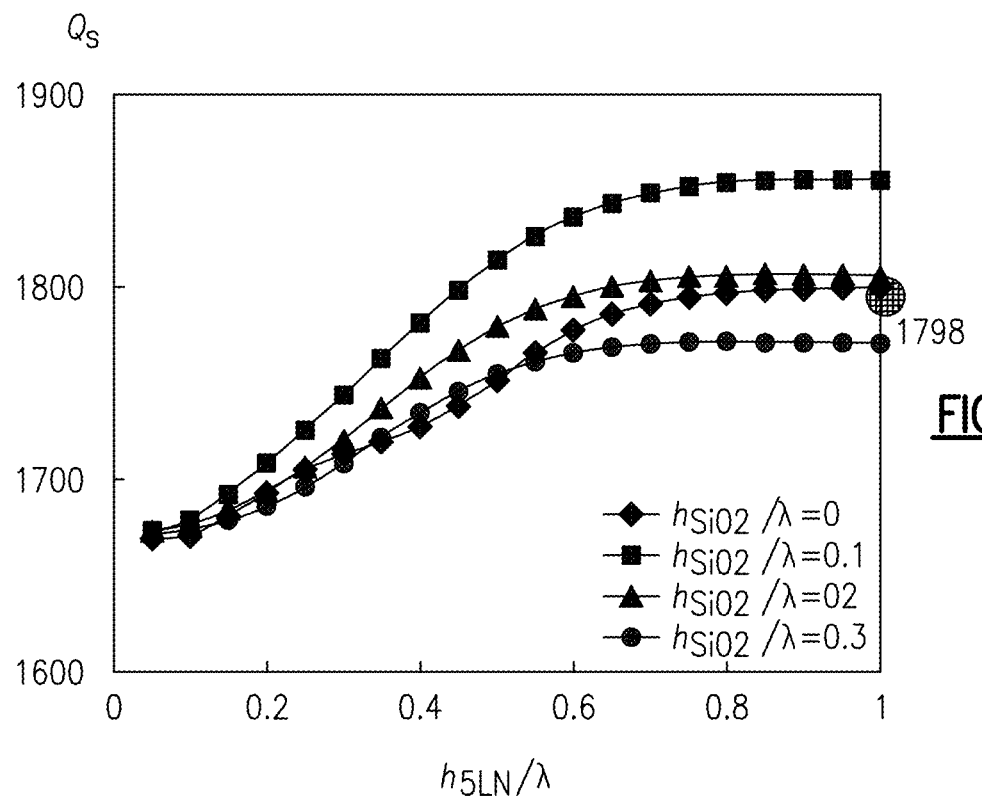
FIG. 45A illustrates a relationship between Qs and 5LN thickness for various silicon dioxide layer thicknesses an elastic wave device of FIG. 40.
Figure 45B:
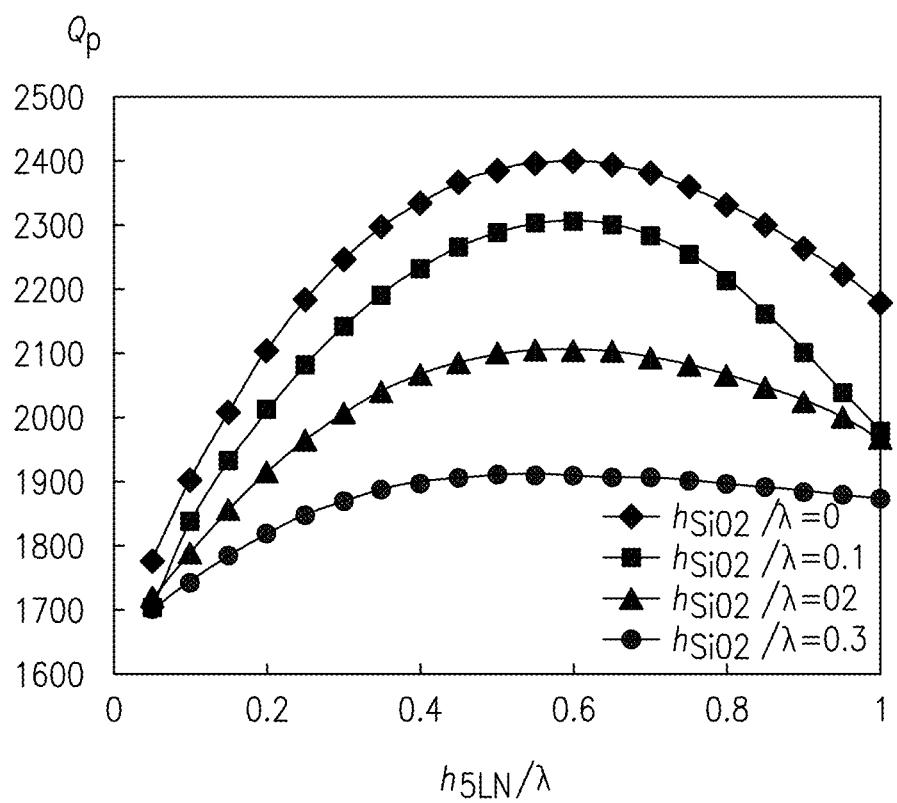
FIG. 45B illustrates a relationship between Qp and 5LN thicknesses for various silicon dioxide layer thicknesses an elastic wave device of FIG. 40.

FIG. 45A illustrates a relationship between Qs and 5LN thickness for various silicon dioxide layer thicknesses. FIG. 45B illustrates a relationship between Qp and 5LN thicknesses for various silicon dioxide layer thicknesses. The dots in FIGS. 45A and 45B indicate that a similar elastic wave device without the silicon substrate and the silicon dioxide layer has Qs of 1798 and Qp of 40.5, respectively. Accordingly, the silicon substrate and the silicon dioxide of the elastic wave device 30 of FIG. 40 layer can boost Qp significantly in the elastic wave device 20 with a 5LN piezoelectric layer. Comparing FIG. 45B to FIG. 31B indicates that having a silicon dioxide layer over the IDT electrode on a 5LN layer may not increase Qp as much as including a silicon dioxide layer between a 5LN layer and a silicon substrate.

FIGS. 46A to 48B are graphs of simulations of an elastic wave device 30 having a lithium tantalate piezoelectric layer with a 42° cut angle (42LT), a high velocity layer that is a silicon substrate, and a temperature compensating layer that is a silicon dioxide layer.

Figure 46A:
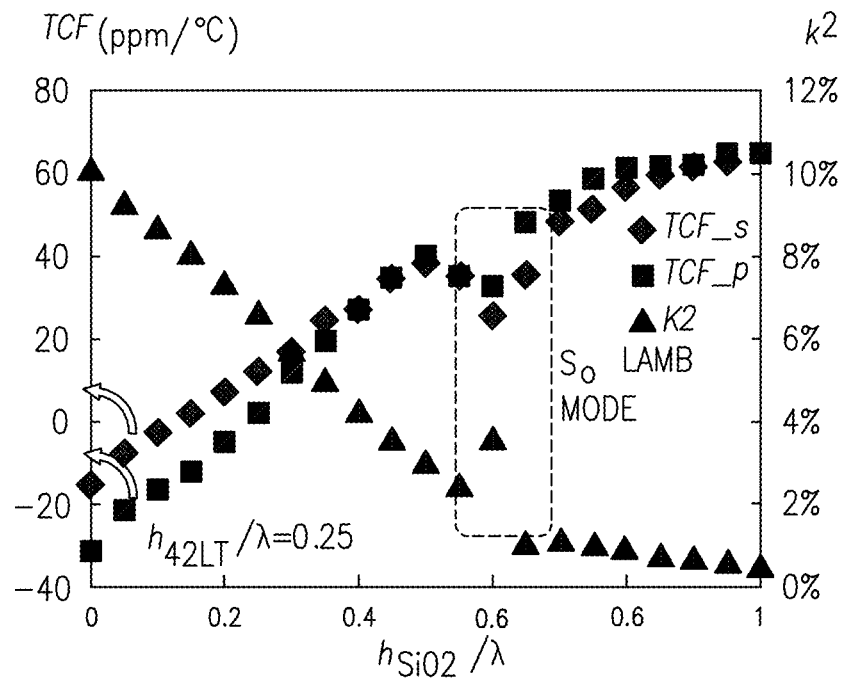
FIGS. 46A and 46B illustrate relationships between (1) TCF and thickness of a silicon dioxide layer and (2) $k^2$ and thickness of the silicon dioxide layer for an elastic wave device of FIG. 40 with a 42LN piezoelectric layer.
Figure 46B:
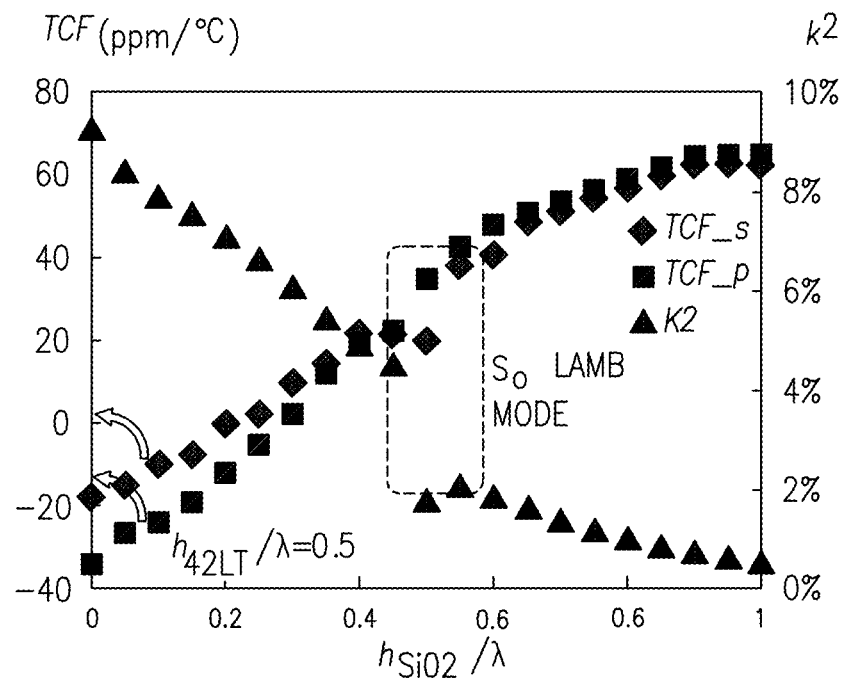

FIGS. 46A and 46B illustrate relationships between (1) TCF and thickness of the silicon dioxide layer and (2) $k^2$ and thickness of the silicon dioxide layer. FIG. 46A corresponds to a 42LT piezoelectric layer with a thickness of 0.25λ. An average TCF of 0 is indicated at a silicon dioxide thickness of about 0.2λ in FIG. 46A. FIG. 46B corresponds to a 42LT piezoelectric layer with a thickness of 0.5λ. An average TCF of 0 is indicated at a silicon dioxide thickness of about 0.25λ in FIG. 46B. These simulations suggest that a silicon dioxide of less than about 0.25λ can achieve a desirable TCF in such devices.

Figure 47A:
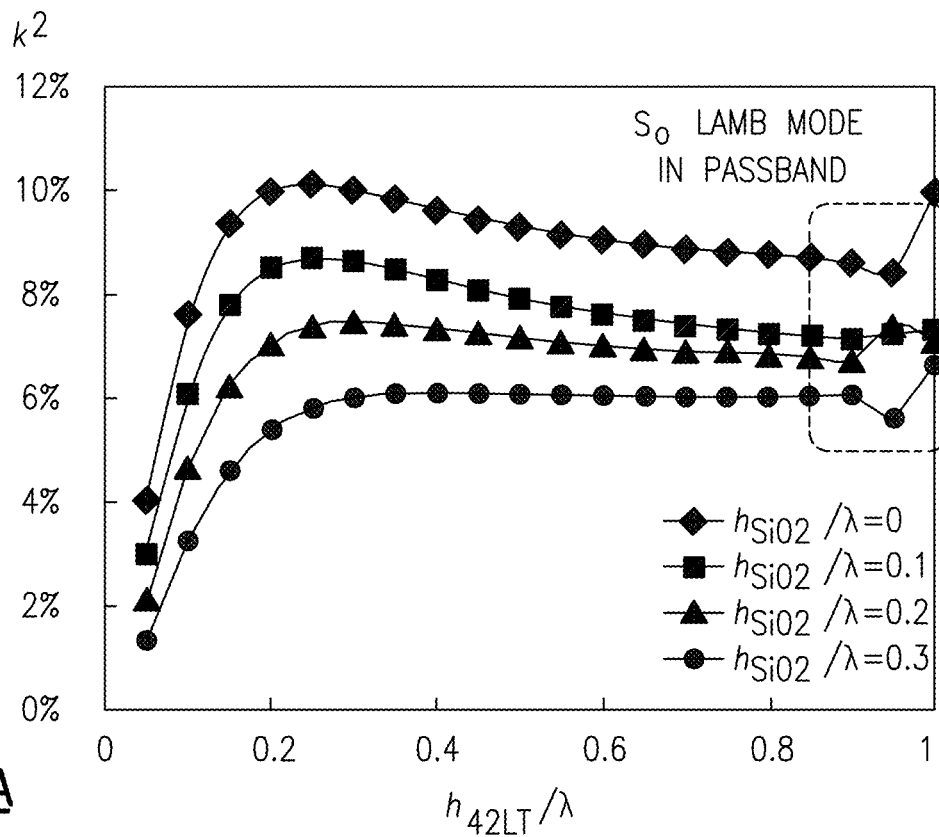
FIG. 47A is a graph of $k^2$ as a function of 42LT thickness for various thicknesses of a silicon dioxide layer of an elastic wave device of FIG. 40.
Figure 47B:
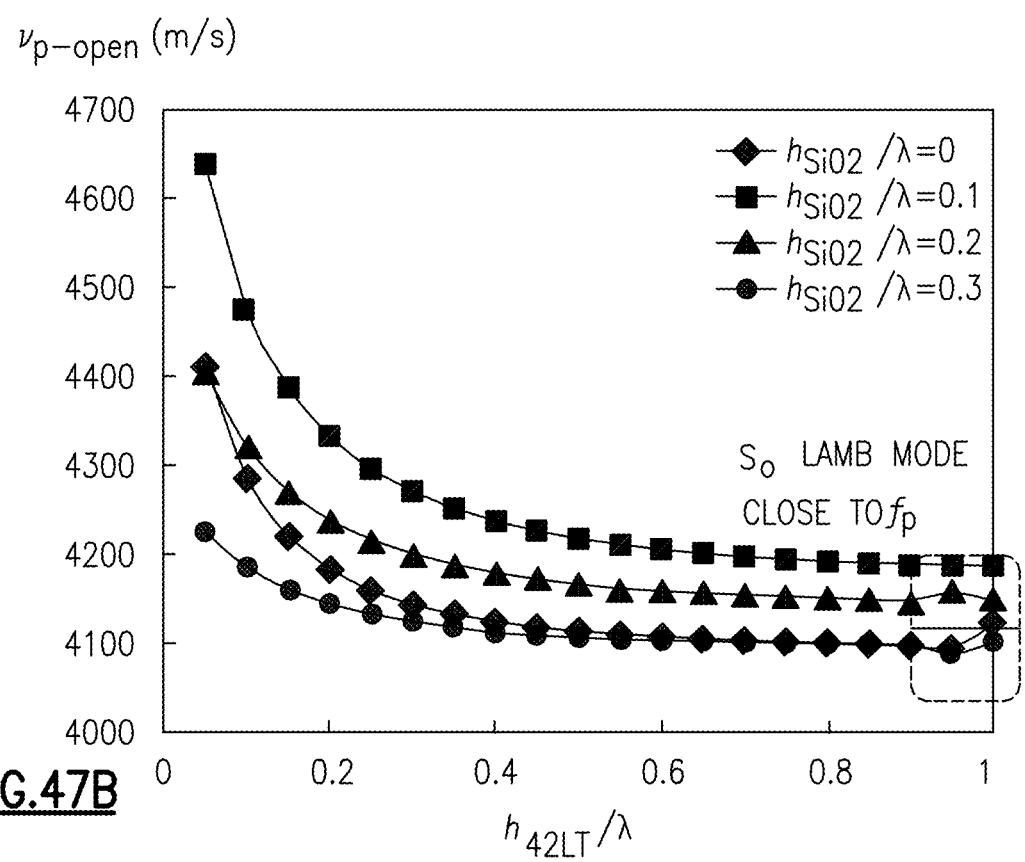
FIG. 47B is a graph of $v_{P\text{-}OPEN}$ as a function of 42LT thickness for various thicknesses of the silicon dioxide layer of an elastic wave device of FIG. 40.

FIG. 47A is a graph of $k^2$ as a function of 42LT thickness for various thicknesses of the silicon dioxide layer. This graph suggests that having a silicon dioxide layer over the IDT electrode on a 42LT layer can reduce $k^2$. FIG. 47B is a graph of $v_{P\text{-}OPEN}$ as a function of 42LT thickness for various thicknesses of the silicon dioxide layer.

Figure 48B:
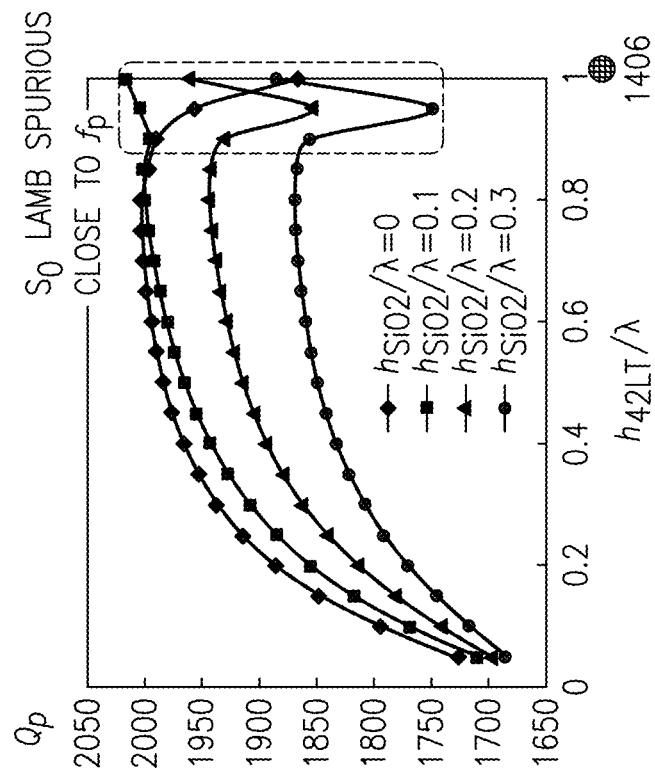
FIG. 48B illustrates a relationship between Qp and 42LT thicknesses for various silicon dioxide layer thicknesses of an elastic wave device of FIG. 40.
Figure 48A:
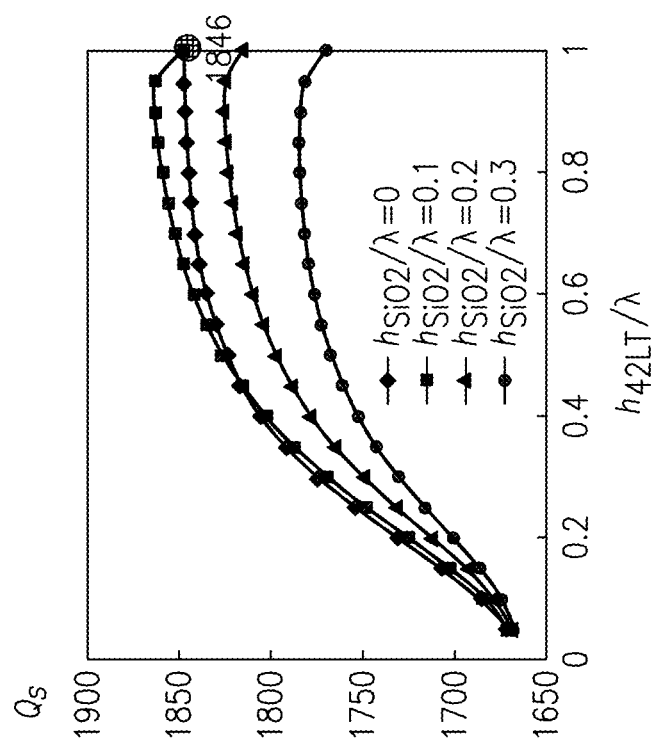
FIG. 48A illustrates a relationship between Qs and 42LT thickness for various silicon dioxide layer thicknesses of an elastic wave device of FIG. 40.

FIG. 48A illustrates a relationship between Qs and 42LT thickness for various silicon dioxide layer thicknesses. FIG. 48B illustrates a relationship between Qp and 42LT thicknesses for various silicon dioxide layer thicknesses. FIG. 48B indicates that having a silicon dioxide layer over the IDT electrode and a silicon substrate can increase Qp relative to a similar elastic wave device without the silicon substrate and silicon dioxide layer. This graph also illustrates that it can be desirable to have the 42LT layer thickness be less than about 0.8λ in certain instances.

Figure 49A:
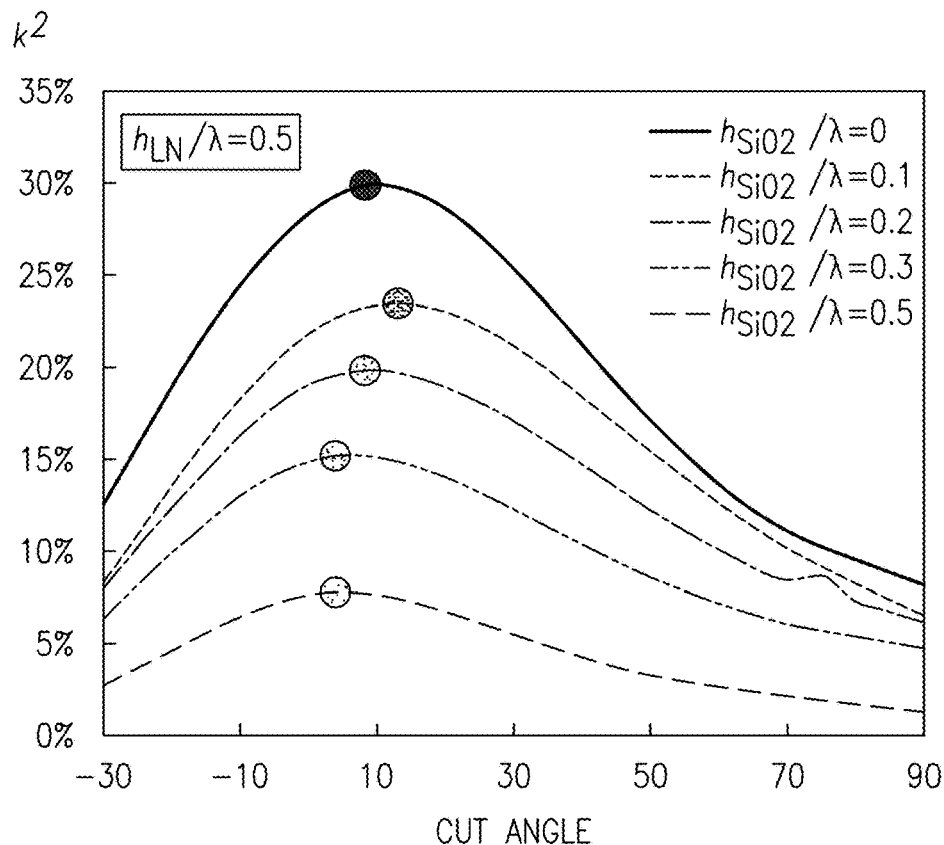
FIG. 49A is graph of $k^2$ as a function of a cut angle of an LN layer in an elastic wave device of FIG. 40 that includes a silicon dioxide layer over an LN piezoelectric layer on a silicon substrate.

FIG. 49A is graph of $k^2$ as a function of a cut angle of an LN layer in an elastic wave device 30 that includes an LN piezoelectric layer having a thickness of 0.5λ, a high velocity layer that is a silicon substrate, and a temperature compensating layer that is a silicon dioxide layer. Different curves on this graph correspond to different silicon dioxide layer thicknesses. FIG. 49A indicates a maximum $k^2$ of about 30% at a cut angle of 10° and a silicon dioxide thickness of 0.

Figure 49B:
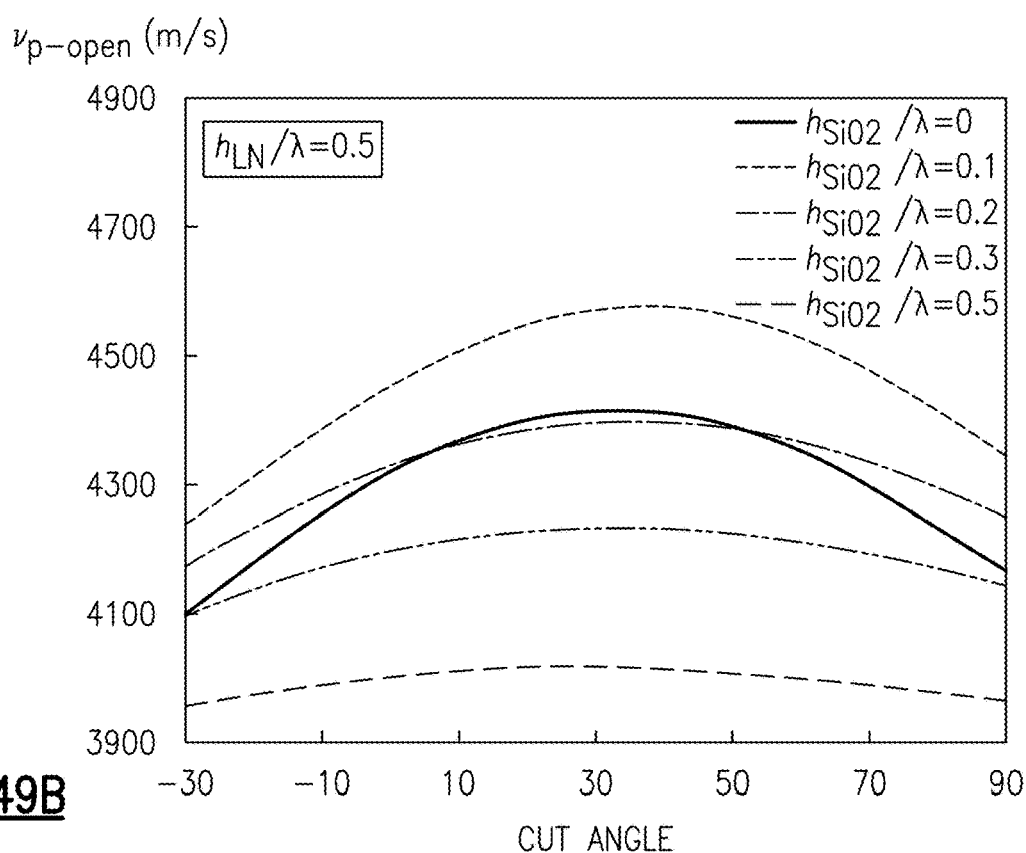
FIG. 49B is graph of $v_{P\text{-}OPEN}$ as a function of a cut angle of an LN layer in an elastic wave device of FIG. 40 that includes a silicon dioxide layer over an LN piezoelectric layer on a silicon substrate.

FIG. 49B is graph of $v_{P\text{-}OPEN}$ as a function of a cut angle of an LN layer in an elastic wave device 30 that includes an LN having a thickness of 0.5λ, a high velocity layer that is a silicon substrate, and a temperature compensating layer that is a silicon dioxide layer. Different curves on this graph correspond to different silicon dioxide layer thicknesses. FIG. 49B indicates a maximum $v_0$ of about 4580 m/s at a cut angle of 40° and a silicon dioxide thickness of 0.2λ.

Figure 49C:
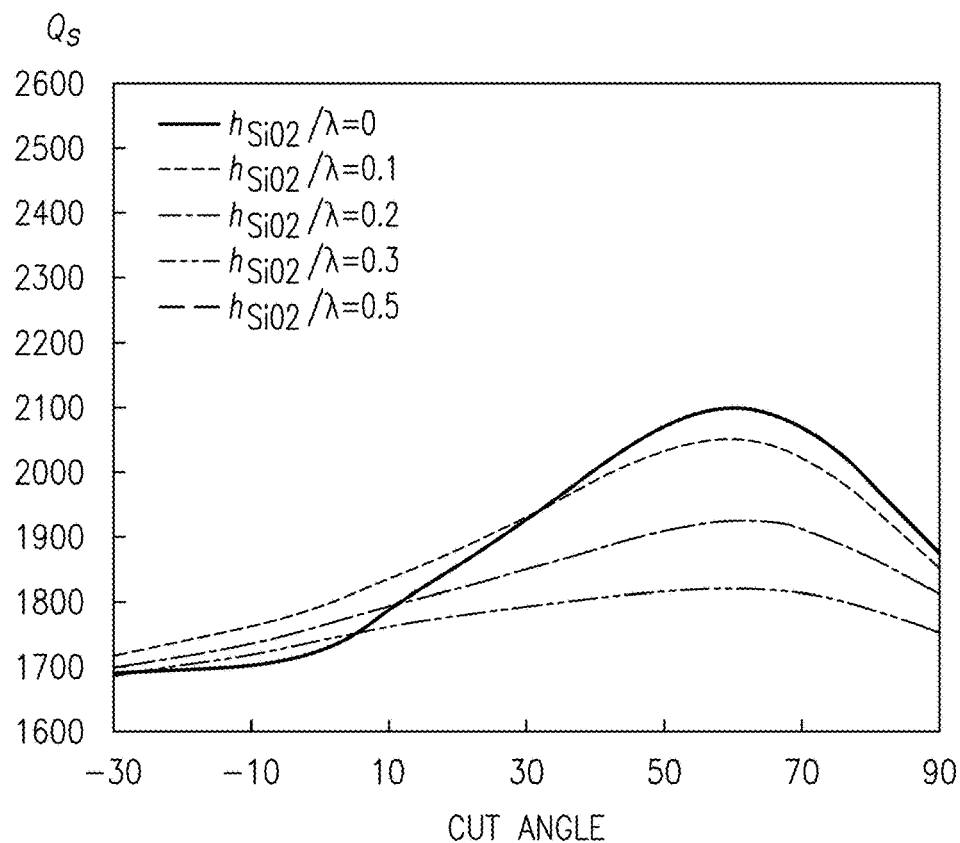
FIG. 49C is graph of Qs as a function of a cut angle of an LN layer in an elastic wave device of FIG. 40 that includes a silicon dioxide layer over an LN piezoelectric layer on a silicon substrate.

FIG. 49C is graph of Qs as a function of a cut angle of an LN layer in an elastic wave device 30 that includes an LN having a thickness of 0.5λ, a high velocity layer that is a silicon substrate, and a temperature compensating layer that is a silicon dioxide layer. Different curves on this graph correspond to different silicon dioxide layer thicknesses. FIG. 49C indicates a maximum Qs of about 2100 at a cut angle of 60° and a silicon dioxide thickness of 0.

Figure 49D:
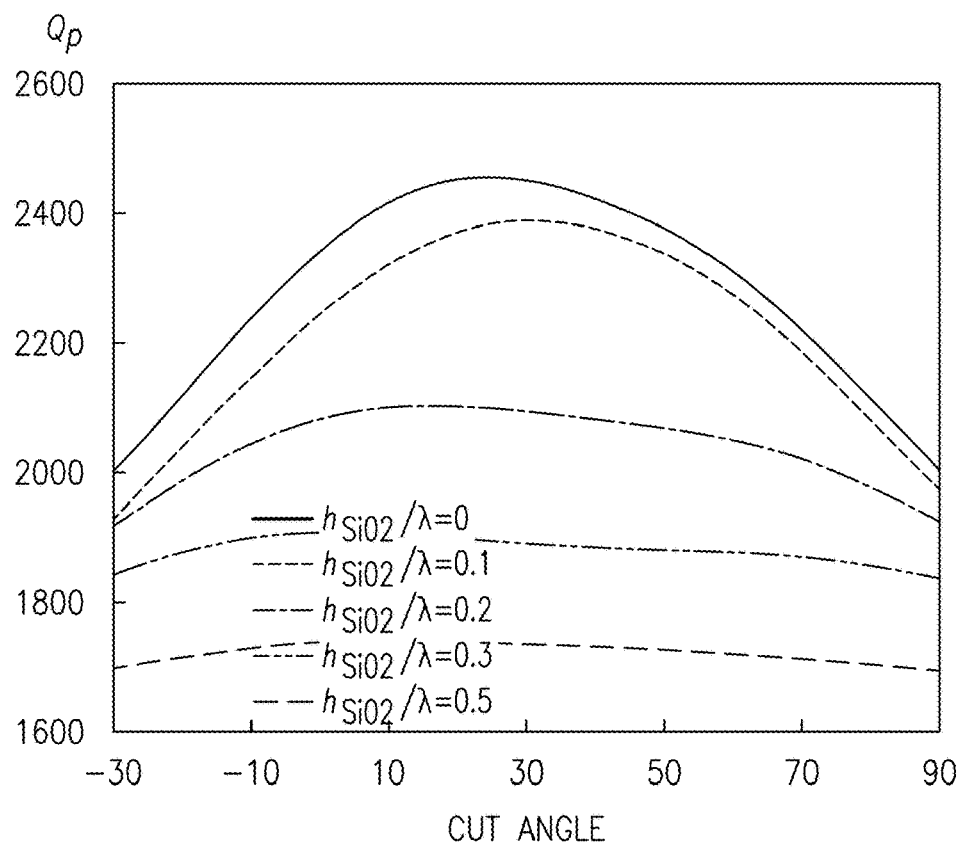
FIG. 49D is graph of Qp as a function of a cut angle of an LN layer in an elastic wave device of FIG. 40 that includes a silicon dioxide layer over an LN piezoelectric layer on a silicon substrate.

FIG. 49D is graph of Qp as a function of a cut angle of an LN layer in an elastic wave device 30 that includes an LN having a thickness of 0.5λ, a high velocity layer that is a silicon substrate, and a temperature compensating layer that is a silicon dioxide layer. Different curves on this graph correspond to different silicon dioxide layer thicknesses. FIG. 49D indicates a maximum Qp of about 2560 at a cut angle of 25° and a silicon dioxide thickness of 0.

Figure 50G:
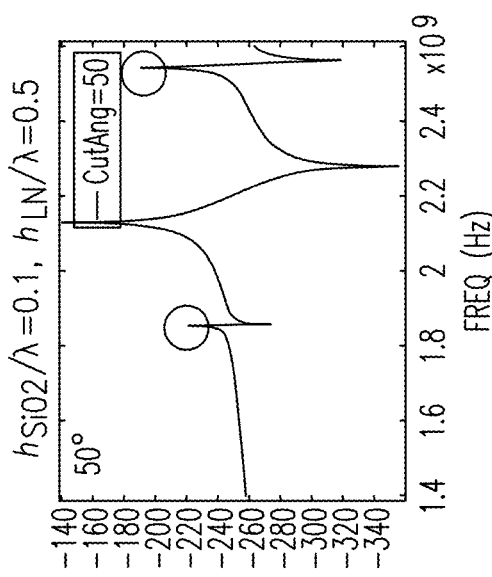
Figure 50H:
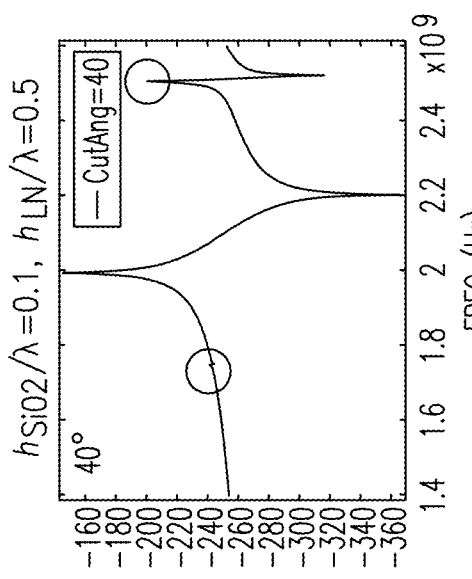
Figure 50I:
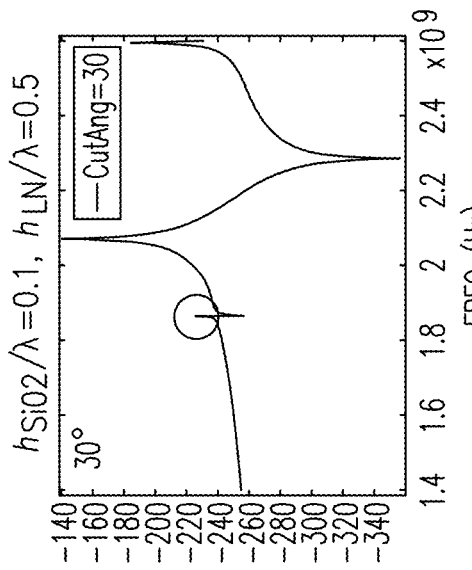
Figure 50J:
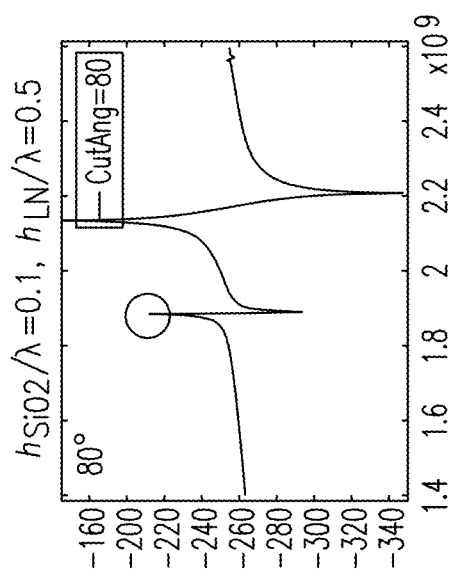
Figure 50K:
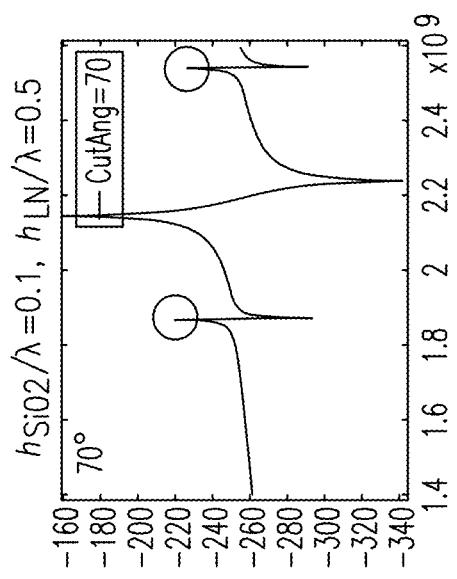
Figure 50L:
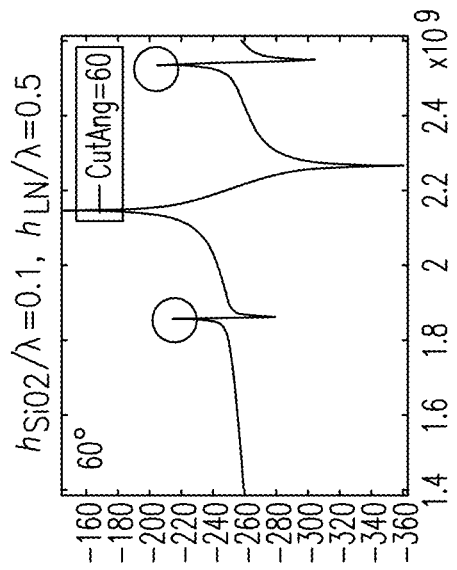

FIGS. 50A to 50L illustrate admittance over frequency for an elastic wave device 30 with an LN piezoelectric layer having a thickness of 0.5λ, temperature compensating layer that is a silicon dioxide layer having a thickness of 0.1λ, and a high velocity layer that is a silicon substrate for various cut angles of LN. FIG. 50F shows a relatively clean frequency clean frequency response without significant spurs for a cut angle of 20°. These graphs indicate that cut angle in a range from about 15° to 25° in such devices can achieve a relatively clean frequency response.

Figure 51:
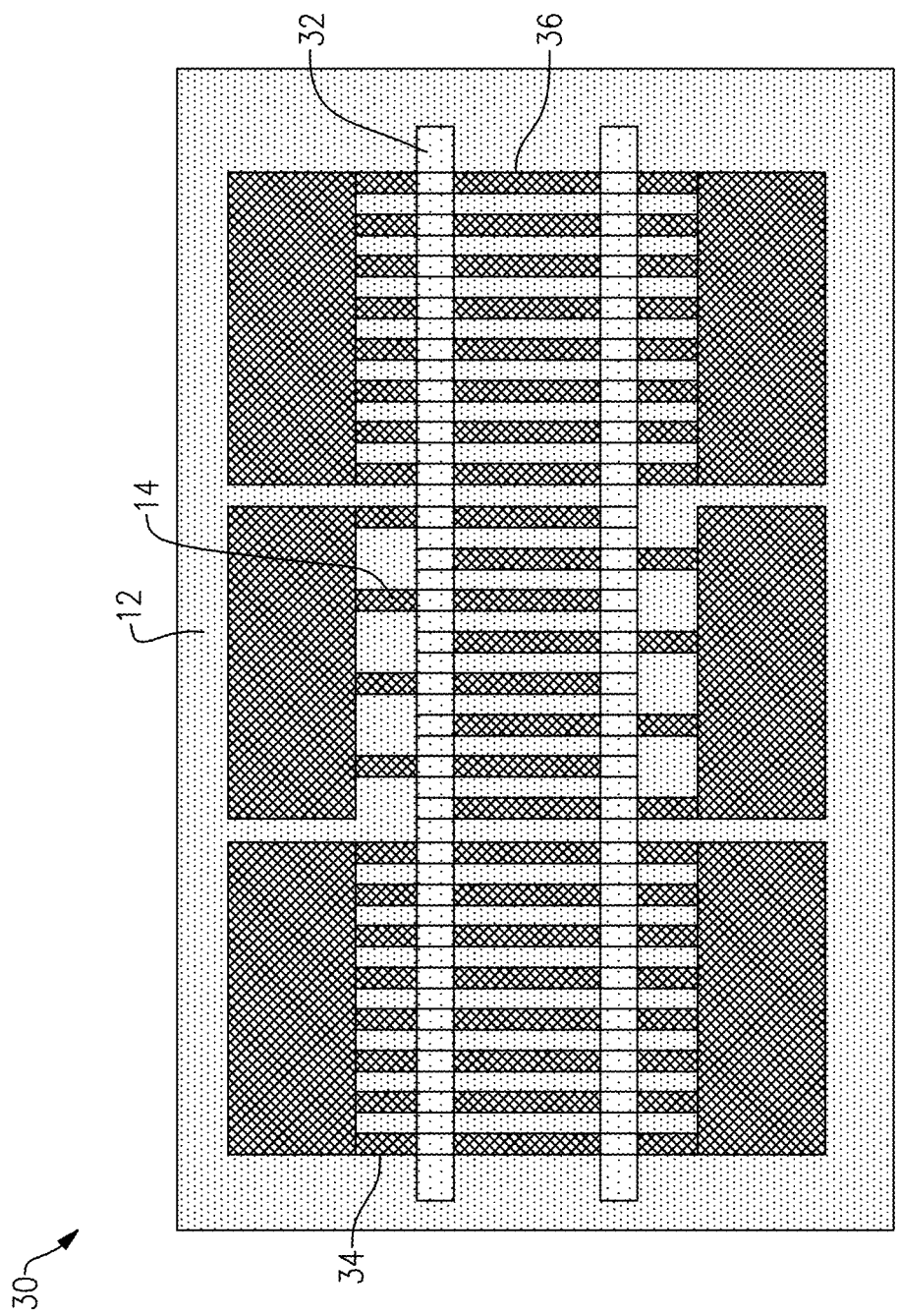
FIG. 51 is a plan view of the elastic wave device of FIG. 40.

FIG. 51 is a plan view of the elastic wave device 30 of FIG. 40. FIG. 51 illustrates that the IDT electrode 14 can be positioned between a first grating reflector 34 and a second grating reflector 36. The IDT electrode 14, the first grading reflector 34, and the second grating reflector 36 can function as a surface acoustic wave resonator. Any of the elastic wave devices 10, 20, or 40 can be similarly implemented. FIG. 51 illustrates that any of the temperature compensating layers discussed herein can be included above and/or below a portion of an IDT electrode.

Figure 52:
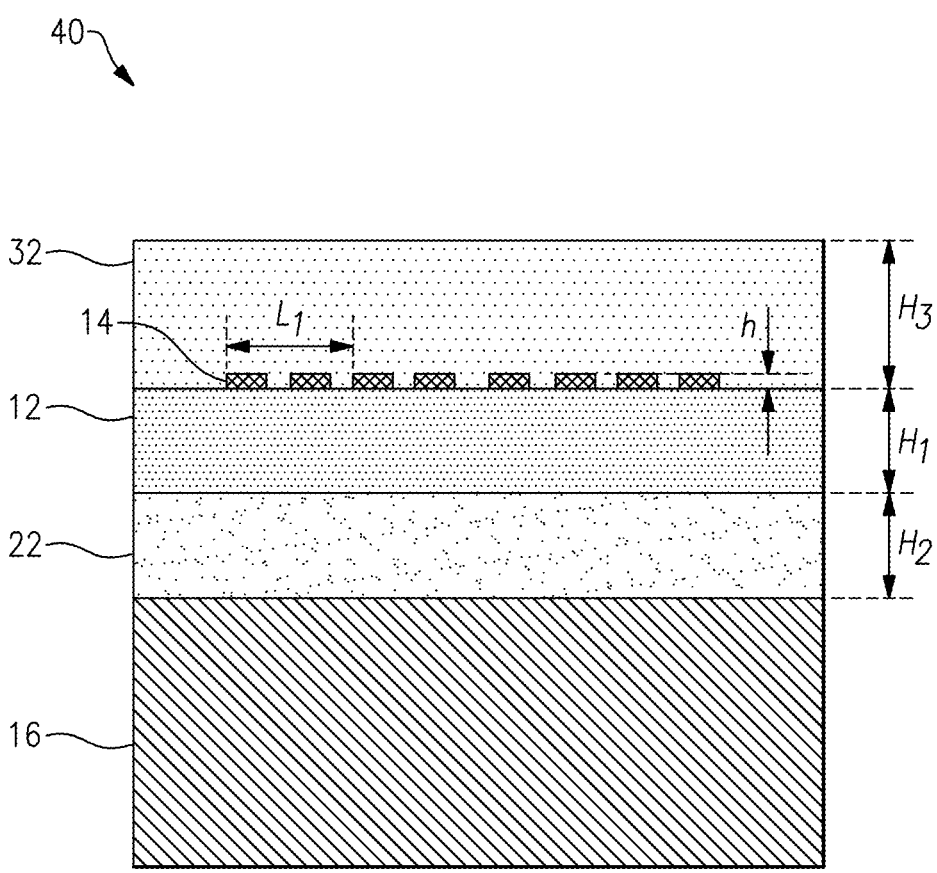
FIG. 52 is a cross-sectional view of an elastic wave device according to another embodiment.

FIG. 52 is a cross-sectional view of an elastic wave device 40 according to an embodiment. As illustrated, the elastic wave device 40 includes a piezoelectric layer 12, an IDT electrode 14, a high velocity layer 16, a first temperature compensating layer 22, and a second temperature compensating layer 32. The elastic wave device 40 is like the elastic wave device 20 of FIG. 21 except that the elastic wave device 40 also includes a second temperature compensating layer 32 over the IDT electrode 14 such that the IDT electrode 14 is between the piezoelectric layer 12 and the temperature compensating layer 32. The elastic wave device 40 is like the elastic wave device 30 of FIG. 40 except that the elastic wave device 40 also includes a first temperature compensating layer 22 disposed between the high velocity layer 16 and the piezoelectric layer 12. The elastic wave device 40 can have improved insensitivity for frequency dependence on the piezoelectric layer thickness relative to the elastic wave device 30 of FIG. 40.

Further simulations of LT/Si and LT/SiO$_2$/Si elastic wave devices indicate that such devices have desirable $k^2$ vales for an LT a cut angle in a range from 0° to 30°. These simulations indicate that an LT layer with a cut angle between 10° and 30° can be desirable. A maximum $k^2$ value was observed at a cut angle of about 20°. Other simulations of LT/Si and LT/SiO$_2$/Si elastic wave devices indicate that such devices has have desirable high velocity ($v_0$) vales for such devices with an LT layer with a cut angle in a range from 30° to 40°.

Any of the elastic wave devices discussed herein can be implemented in a filter, a duplexer or other multiplexer, or a frequency multiplexing circuit (e.g., a diplexer or a triplexer).

FIGS. 53A to 53D are examples of filters that can benefit from the principles and advantages of the elastic wave devices discussed herein. By including an elastic wave device in accordance with the principles and advantages discussed herein, such filters can realize improved performance, such as a higher quality factor, relative to filters that include conventional elastic wave devices. Any suitable combination of features of these filters can be implemented together with each other and/or in combination with any other embodiments discussed herein.

Figure 53A:
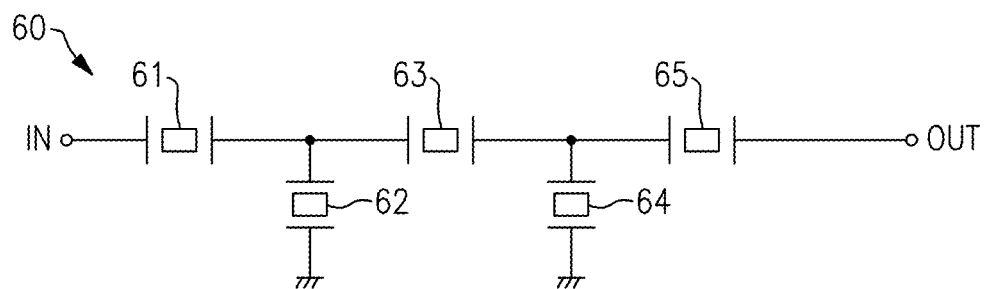
FIG. 53A is a schematic diagram of a filter that includes an elastic wave device according to one or more embodiments.

FIG. 53A is a schematic diagram of a filter 60 that includes an elastic wave device in accordance with the principles and advantages discussed herein. A filter that includes an elastic wave device can be referred to as an elastic device filter. As illustrated, the filter 60 is a ladder filter of that includes series elastic wave devices 61, 63, and 65 and shunt surface acoustic wave devices 62 and 64. Each of the illustrated elastic wave devices can be a resonator. The elastic wave devices 61 to 65 are arranged between an input port In and an output port Out. In some instances, the filter 60 can be a transmit filter in which the input port In is a transmit port and the output port Out is an antenna port. According to some other instances, the filter 60 can be a receive filter in which the input port In is an antenna port and the output port Out is a receive port One or more of the series elastic wave devices 61, 63, and 65 and/or one or more of the shunt surface acoustic wave devices 62 and 64 can be implemented in accordance with any suitable principles and advantages discussed herein. One or more of the elastic wave devices 61 to 65 can be surface acoustic wave devices. A filter that includes one or more surface acoustic wave devices can be referred to as a surface acoustic wave filter. While the filter 60 shows 5 elastic wave device resonators for illustrative purposes, a filter can include any suitable number of elastic device resonators for a particular application. For example, in some applications, an elastic wave device filter can include 3, 4, 6, 7, 9, or more elastic wave devices.

Figure 53B:
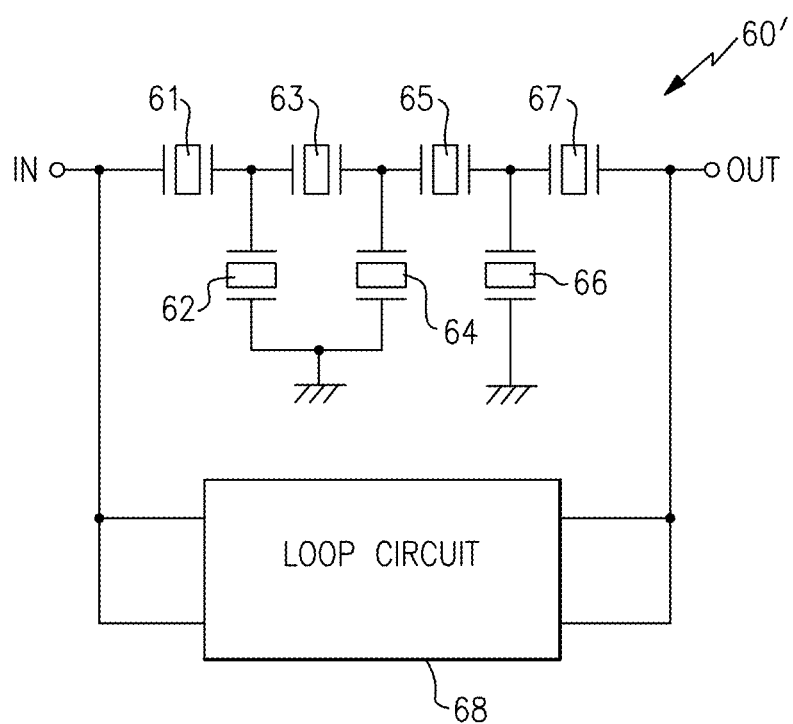
FIG. 53B is a schematic diagram of another filter that includes an elastic wave device according to one or more embodiments.

FIG. 53B is a schematic diagram of a filter 60' that includes an elastic wave device in accordance with the principles and advantages discussed herein. Any of the resonators of the filter 60' can be implemented in accordance with any suitable principles and advantages discussed herein. The filter 60' is like the filter 60 of FIG. 53A except that the filter 60' includes a different number of resonators and also includes a loop circuit. As illustrated, the filter 60' includes an additional shunt surface acoustic wave device 66 and an additional series surface acoustic wave device 67. The filter 60' also includes a loop circuit 68. The loop circuit 68 is connected in parallel with the surface acoustic wave resonators of the ladder circuit in FIG. 53B. The loop circuit 68 can have a passing characteristic that allows a signal having a frequency in a certain frequency band inside a stopband of the ladder circuit of surface acoustic wave resonators to pass through the loop circuit 68. The loop circuit 68 can output a loop signal in response to the input signal at the input port In. The signals propagating through the ladder circuit and the loop circuit can include phase components opposite to each other in the certain frequency band inside the stopband.

Figure 53C:
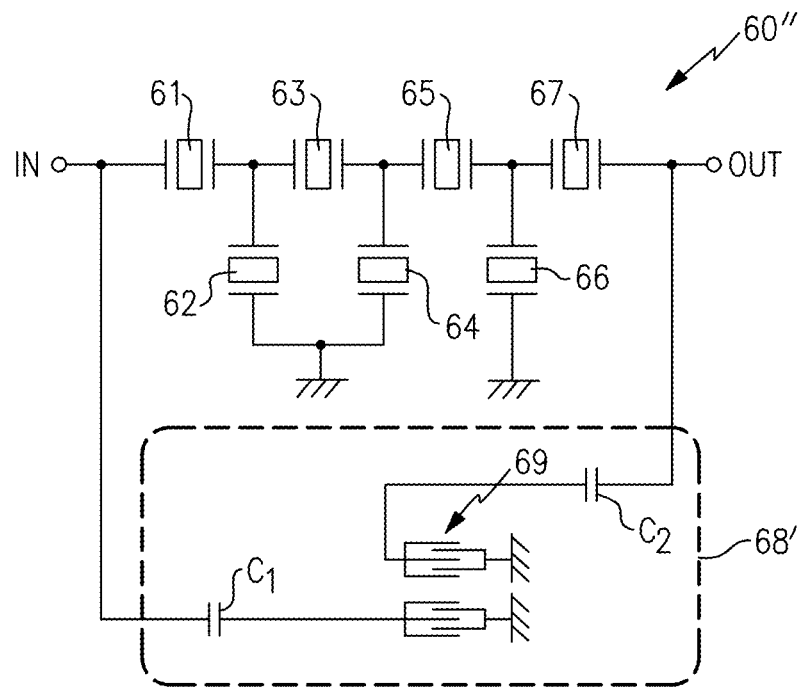
FIG. 53C is a schematic diagram of another filter that includes an elastic wave device according to one or more embodiments.

FIG. 53C is a schematic diagram of a filter 60" that includes an elastic wave device in accordance with the principles and advantages discussed herein. Any of the resonators of the filter 60" can be implemented in accordance with any suitable principles and advantages discussed herein. The filter 60" is like the filter 60' of FIG. 53B except that the filter 60" includes a particular example loop circuit 68'. As shown in FIG. 53C, the loop circuit 68' includes a first capacitor C1, IDT electrodes 69, and a second capacitor C2. The illustrated capacitors and IDT electrodes can be disposed on piezoelectric substrate. The piezoelectric substrate can be the same piezoelectric substrate on which the resonators of the ladder circuit are disposed. Accordingly, such a piezoelectric substrate can correspond to the layer structures shown in FIG. 1, FIG. 21, FIG. 40, or FIG. 52.

IDT electrodes 69 can be arranged as a transversal filter. The passing characteristic in the attenuation band can be adjusted by design of this transversal filter, and the phase characteristic can be adjusted by adjusting a distance between IDT electrodes, so as to provide the loop circuit 68' with the phase characteristic opposite to that of ladder circuit. Each of IDT electrodes 69 can include a pair of comb-shaped electrodes each including electrode fingers that interdigitate with each other. Capacitances of the first and second capacitors C1 and C2, respectively, can be smaller than capacitances of IDT electrodes 69. The capacitance of the first capacitor C1 can be smaller than that of the second capacitor C2. An attenuation amount of the passing characteristic of loop circuit 68' in the attenuation band can be adjusted by adjusting the capacitances of first and second capacitors C1 and C2, respectively. The first and second capacitors C1 and C2 can be arranged so as to allow the attenuation amount of the passing characteristic of the loop circuit 68' to be similar to an attenuation amount of the passing characteristic of ladder circuit.

With the phase characteristic of the loop circuit 68' being opposite to that of ladder circuit, an amplitude characteristic in the attenuation band of the ladder circuit can be substantially canceled. This can consequently increase the attenuation amount in the attenuation band of the ladder circuit. Furthermore, a current that flows into the loop circuit 68' from the ladder circuit can be suppressed by selecting the electrostatic capacitances of first and second capacitors C1 and C2, thereby having the function of protecting IDT electrodes 69 from damage.

Figure 53D:
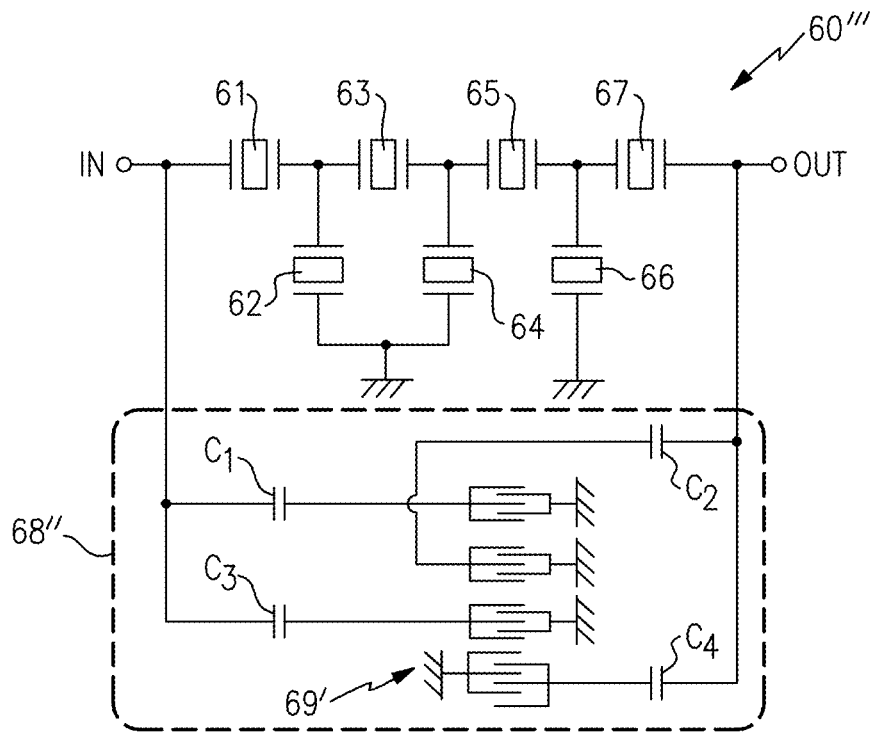
FIG. 53D is a schematic diagram of another filter that includes an elastic wave device according to one or more embodiments.

FIG. 53D is a schematic diagram of a filter 60' that includes an elastic wave device in accordance with the principles and advantages discussed herein. Any of the resonators of the filter 60' can be implemented in accordance with any suitable principles and advantages discussed herein. The filter 60' is like the filter 60" of FIG. 53C except that the filter 60"' includes a different loop circuit. As shown in FIG. 53D, the loop circuit 68" includes additional capacitors and IDT electrodes relative to the loop circuit 68'. In particular, a third capacitor C3, and a fourth capacitor C4 are included in the loop circuit 68". The loop circuit 68" also includes IDT electrodes 69' that includes more IDT electrodes than IDT electrodes 69 of FIG. 53C.

Figure 54A:
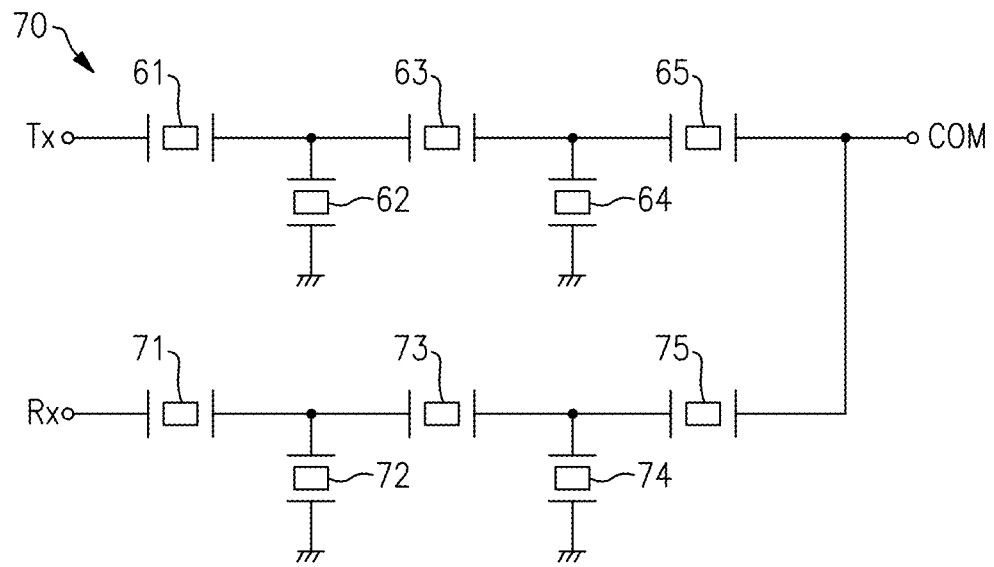
FIG. 54A is a schematic diagram of a duplexer that includes an elastic wave device according to one or more embodiments.
Figure 54B:
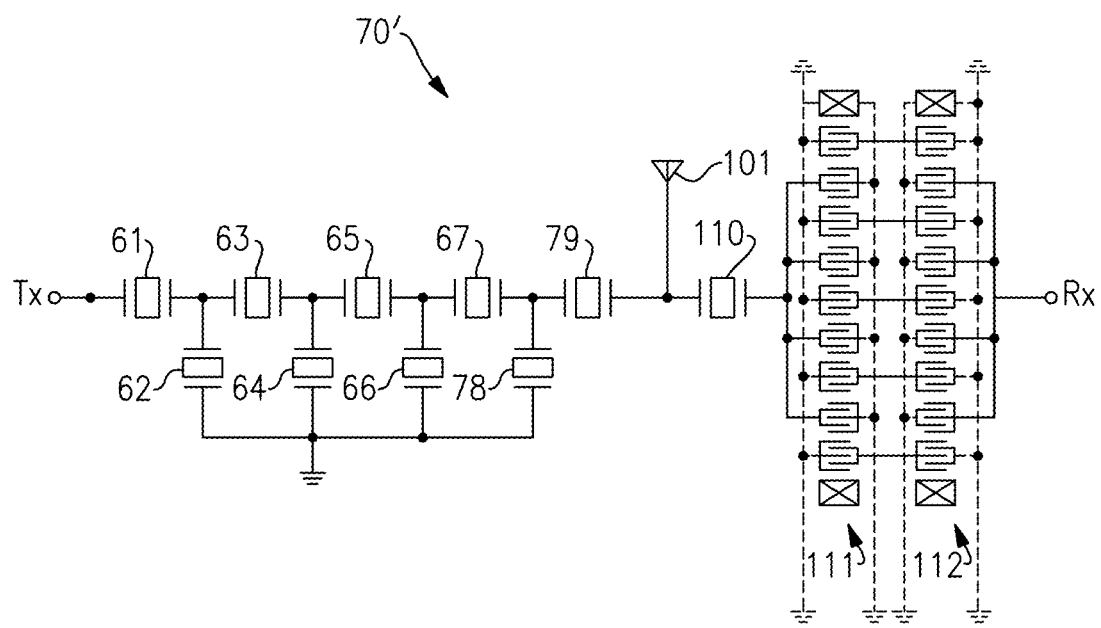
FIG. 54B is a schematic diagram of another duplexer that includes an elastic wave device according to one or more embodiments.
Figure 54C:
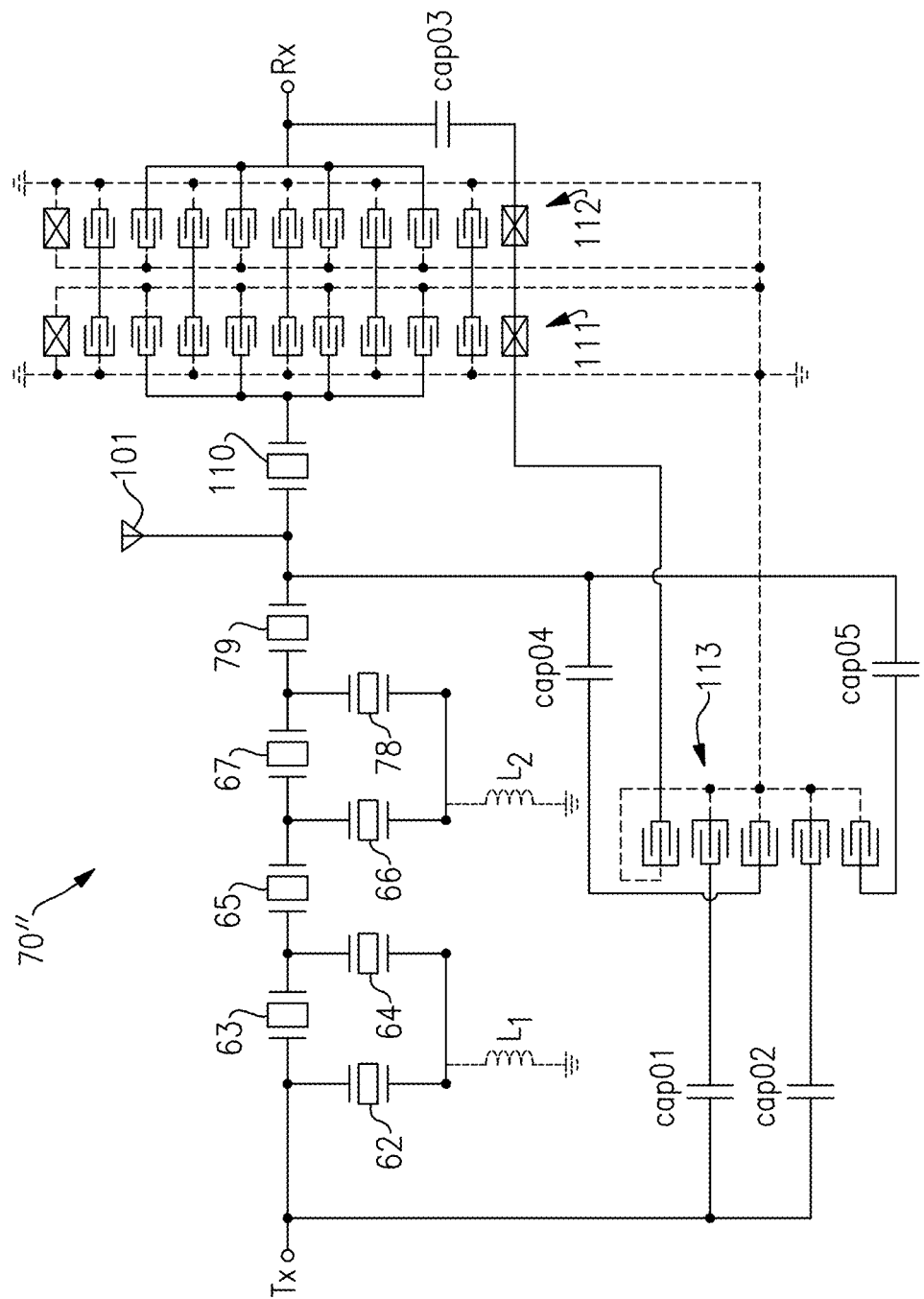
FIG. 54C is a schematic diagram of another duplexer that includes an elastic wave device according to one or more embodiments.

FIGS. 54A to 54C are examples of duplexers that can benefit from the principles and advantages of the elastic wave devices discussed herein. By including an elastic wave device in accordance with the principles and advantages discussed herein, such duplexers can realize improved performance, such as a higher quality factor, relative to duplexers that include other conventional elastic wave devices. Any suitable combination of features of these duplexers can be implemented together with each other and/or in combination with any other embodiments discussed herein.

FIG. 54A is a schematic diagram of a duplexer 70 that includes an elastic device in accordance with the principles and advantages discussed herein. The duplexer 70 includes a transmit filter and a receive filter. The transmit filter and the receive filter are both coupled to a common port COM. The common port COM can be an antenna port. Any suitable number of elastic wave devices can be included in the transmit filter and/or the receive filter of the duplexer 70.

The transmit filter is coupled between a transmit port TX and the common port COM. The transmit filter is configured to filter a signal received at the transmit port TX that propagates to the common port COM. The transmit filter can include any suitable features of the filter 60 of FIG. 53A. As illustrated, the transmit filter includes series elastic wave devices 61, 63, and 65 and shunt surface acoustic wave devices 62 and 64. One or more of the series elastic wave devices 61, 63, and 65 and/or one or more of the shunt surface acoustic wave devices 62 and 64 can be implemented in accordance with any suitable principles and advantages discussed herein.

The receive filter is coupled between the common port COM and the receive port RX. The receive filter is configured to filter a signal received at the common port COM that propagates to the receive port RX. The receive filter can include any suitable features of the filter 60 of FIG. 53A. As illustrated, the receive filter includes series elastic wave devices 71, 73, and 75 and shunt surface acoustic wave devices 72 and 74. One or more of the series elastic wave devices 71, 73, and 75 and/or one or more of the shunt surface acoustic wave devices 72 and 74 can be implemented in accordance with any suitable principles and advantages discussed herein.

Although FIG. 54A illustrates a duplexer 70, one or more elastic wave devices in accordance with any suitable principles and advantages discussed herein can be implemented in any suitable multiplexer. A multiplexer can include any suitable number of acoustic wave filters. For example, the multiplexer can be a quadplexer with four filters, a pentaplexer with five filters, a hexaplexer with six filters, an octoplexer with eight filters, etc. In some instances, a multiplexer can include 2 to 16 elastic wave filters connected at a common node.

FIG. 54B is a schematic diagram of a duplexer 70' that includes an elastic device in accordance with the principles and advantages discussed herein. The duplexer 70' is shown as being connected to an antenna 101. Any of the resonators of the duplexer 70' can be implemented in accordance with any suitable principles and advantages discussed herein. The duplexer 70' is like the duplexer 70 of FIG. 54A except that the duplexer 70' includes a different number of resonators in the transmit filter and includes a different receive filter architecture. As illustrated, the transmit filter of the duplexer 70' includes series SAW resonators 61, 63, 65, 67, and 79 and shunt SAW resonators 62, 64, 66, and 78. The receive filter of the duplexer 70' includes double mode SAW (DMS) resonators 111 and 112. The DMS resonators 111 and 112 are coupled to the antenna 101 by way of the series SAW resonator 110 of the receive filter. The DMS resonators 111 and/or 112 can include an elastic wave device in accordance with any suitable principles and advantages discussed herein.

FIG. 54C is a schematic diagram of a duplexer 70" that includes an elastic device in accordance with the principles and advantages discussed herein. The duplexer 70" is shown as being connected to an antenna 101. Any of the resonators of the duplexer 70" can be implemented in accordance with any suitable principles and advantages discussed herein. The duplexer 70" is like the duplexer 70' of FIG. 54B except that the duplexer 70" additionally includes inductors L1 and L2, capacitors cap01, cap02, cap03, cap04, and cap05, and IDT electrodes 113. The illustrated capacitors and IDT electrodes can implement functionality similar to the loop circuits discussed above. The inductors L1 and L2 provide an inductive path to ground for shunt SAW resonators of the transmit filter.

Figure 55:
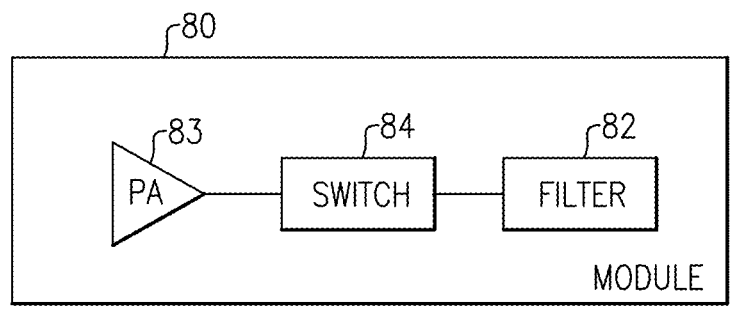
FIG. 55 is a schematic block diagram of a module that includes a power amplifier, a switch, and a filter that includes an elastic wave in accordance with one or more embodiments.
Figure 56:
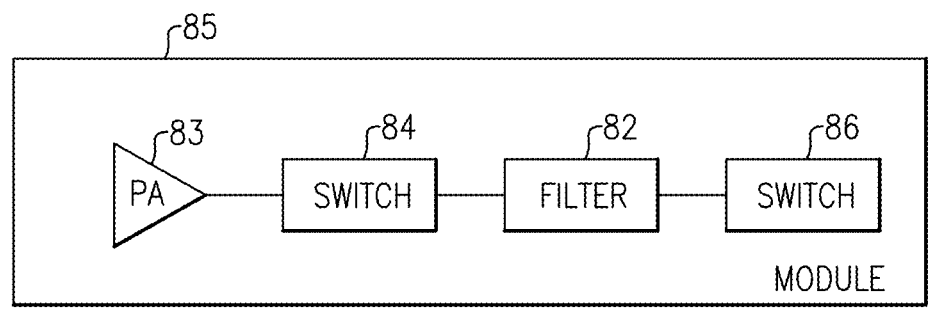
FIG. 56 is a schematic block diagram of a module that includes a power amplifier, switches, and a filter that includes an elastic wave in accordance with one or more embodiments.
Figure 57:
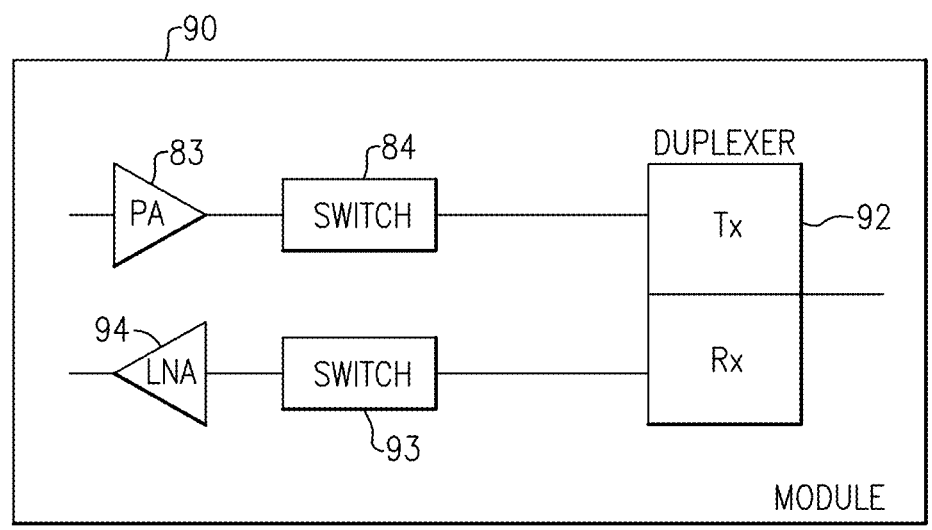
FIG. 57 is a schematic block diagram of a module that includes a power amplifier, a switch, and a duplexer that includes an elastic wave in accordance with one or more embodiments.

A packaged module can include any of the elastic wave devices discussed herein. Some such packaged modules can also include a radio frequency switch and/or a power amplifier. The elastic wave devices discussed herein can be implemented in a variety of packaged modules. Some example packaged modules will now be discussed in which any suitable principles and advantages of the elastic wave devices discussed herein can be implemented. FIGS. 55, 56, and 57 are schematic block diagrams of illustrative packaged modules according to certain embodiments. Any suitable features discussed with reference to any of these packaged modules can be implemented in combination with each other.

FIG. 55 is a schematic block diagram of a module 80 that includes a filter 82, a power amplifier 83, and a switch 84 in accordance with one or more embodiments. The module 80 can include a package that encloses the illustrated elements. The filter 82, a power amplifier 83, and a switch 84 can be disposed on a common packaging substrate. The packaging substrate can be a laminate substrate, for example. The filter 82 can include any suitable number of elastic wave devices implemented in accordance with any suitable principles and advantages of the elastic wave devices discussed herein. The filter 82 can be included in a duplexer or other multiplexer. The switch 84 can be a radio frequency switch. The switch 84 can selectively electrically couple an output of the power amplifier 83 to the filter 82. In some instances, the switch 84 can be a multi-throw switch that can provide the output of the power amplifier to a selected filter of the plurality of filters of the module 80.

FIG. 56 is a schematic block diagram of a module 85 that includes a filter 82, a power amplifier 83, a switch 84, and a second switch 86 in accordance with one or more embodiments. The module 85 is like the module 80 of FIG. 55, except that the module 85 includes an additional switch 86. The additional switch 86 can selectively electrically connect the filter 82 to other RF circuitry. The additional switch 86 can be an antenna switch that can selectively electrically connect the filter 82 to an antenna port.

FIG. 57 is a schematic block diagram of a module 90 that includes a duplexer 92, a power amplifier 83, and a first switch 84, a second switch 93, and a low noise amplifier 94 in accordance with one or more embodiments. The module 90 is like the module 80 of FIG. 55, except in the module 90 a duplexer is illustrated instead of a filter and the module 90 includes receive circuitry. The illustrated receive circuitry includes a switch 93 and a low noise amplifier 94. The low noise amplifier 94 can amplify a radio frequency signal that is provided by a receive filter. The switch 93 can selectively electrically connect the low noise amplifier 94 to the receive filter of the duplexer 92.

Figure 58:
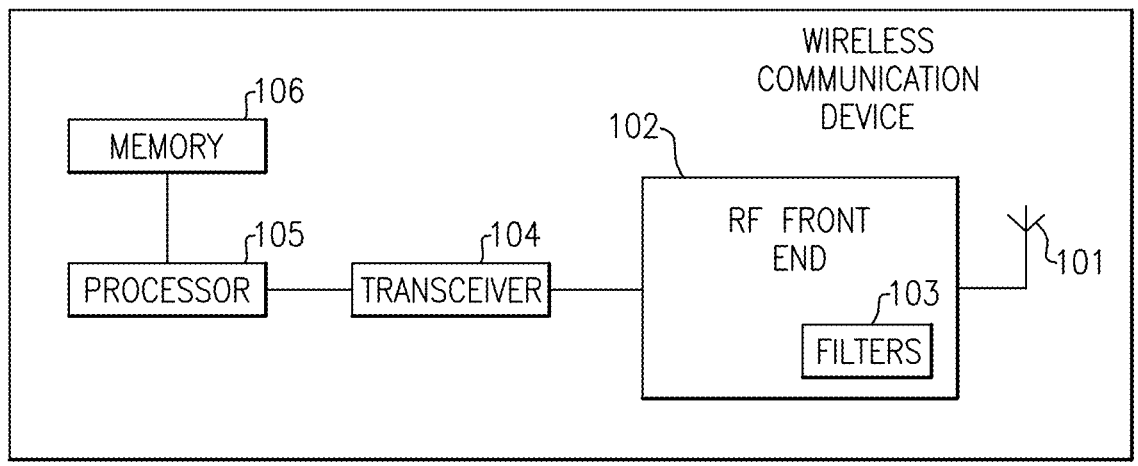
FIG. 58 is a schematic block diagram of a wireless communication device that includes a filter with an elastic wave device in accordance with one or more embodiments.

A wireless communication device, such as a mobile phone, can include one or more elastic wave devices in accordance with any of the principles and advantages discussed herein. FIG. 58 is a schematic block diagram of a wireless communication device 100 that includes any suitable number of elastic wave devices in accordance with one or more embodiments. The wireless communication device 100 can be any suitable wireless communication device. For instance, a wireless communication device 100 can be a mobile phone, such as a smart phone. As illustrated, the wireless communication device 100 includes an antenna 101, an RF front end 102 that includes filters 103, an RF transceiver 104, a processor 105, and a memory 106. The antenna 101 can transmit RF signals provided by the RF front end 102. The antenna 101 can provide received RF signals to the RF front end 102 for processing.

The RF front end 102 can include one or more power amplifiers, one or more low noise amplifiers, one or more RF switches, one or more receive filters, one or more transmit filters, one or more duplexer, or any suitable combination thereof. The RF front end 102 can transmit and receive RF signals associated with any suitable communication standards. Any of the elastic wave devices discussed herein can be implemented in one or more of the filters 103 of the RF front end 102.

The RF transceiver 104 can provide an RF signal to the RF front end 102 for amplification and/or other processing. The RF transceiver 104 can also process an RF signal provided by a low noise amplifier of the RF front end 102. The RF transceiver 104 is in communication with the processor 105. The processor 105 can be a baseband processor. The processor 105 can provide any suitable baseband processing functions for the wireless communication device 100. The memory 106 can be accessed by the processor 105. The memory 106 can store any suitable data for the wireless communication device 100.

Any of the principles and advantages discussed herein can be applied to other systems, modules, chips, elastic wave devices, filters, duplexers, multiplexers, wireless communication devices, and methods not just to embodiments described herein. The elements and operations of the various embodiments described above can be combined to provide further embodiments. Some of the embodiments described above have provided examples in connection with elastic wave devices, such as SAW resonators. However, the principles and advantages of the embodiments can be used in connection with any other systems, apparatus, or methods that benefit could from any of the teachings herein. Any of the principles and advantages discussed herein can be implemented in association with radio frequency circuits configured to process signals in a range from about 30 kHz to 300 GHz, such as in a range from about 450 MHz to 6 GHz. For instance, any of the filters discussed herein can filter signals in a range from about 30 kHz to 300 GHz, such as in a range from about 450 MHz to 6 GHz.

The performance of elastic wave devices discussed herein can be desirable in RF systems that support carrier aggregation and/or multi-input and multi-output (MIMO) communications. User demand for downlink capacity can be insatiable for multimedia content streaming. To increase capacity, different data-streams can be sent using multiple antennas and/or downlink carrier aggregation can be implemented by combining the channel bandwidth available from different frequency bands and/or different frequency sub bands. With elastic wave devices discussed herein, such RF systems can have enhanced performance.

Figure 59:
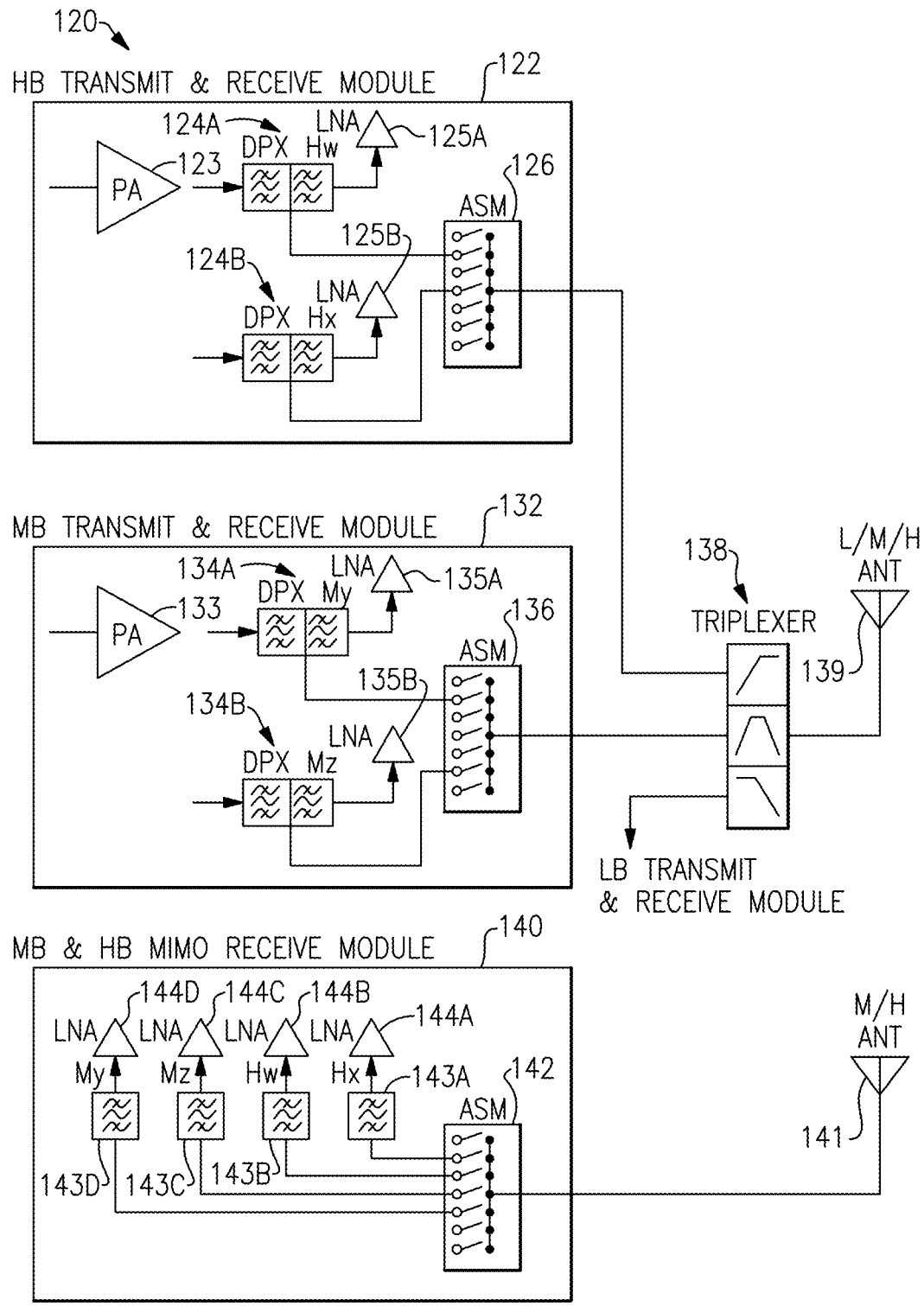
FIG. 59 is a schematic diagram of a radio frequency system that includes a filter with an elastic wave device in accordance with one or more embodiments.

FIG. 59 is a schematic diagram of an RF system 120 that includes a filter with an elastic wave device in accordance with one or more embodiments. RF system 120 supports carrier aggregation and MIMO functionality. As illustrated, the RF system 120 includes a first antenna 139, a second antenna 141, and an RF front end. The illustrated RF front end includes a high band transmit and receive module 122, a mid band transmit and receive module 132, a high band and mid band receive module 140 and a triplexer 138. Although not illustrated in FIG. 59, the RF front end also includes a low band transmit and receive module. The illustrated RF system 120 can transmit and receive signals of a variety of frequency bands, including low band (LB), mid band (MB), and high band (HB) signals. For example, the RF system 120 can process one or more LB signals having a frequency of 1 GHz or less, one or more MB signals having a frequency between 1 GHz and 2.3 GHz, and one or more HB signals having a frequency greater than 2.3 GHz. Examples of LB frequencies include, but are not limited to, Band 8, Band 20, and Band 26. Examples of MB frequencies include, but are not limited to, Band 1, Band 3, and Band 4. Examples of HB frequencies include, but are not limited to, Band 7, Band 38, and Band 41.

In the illustrated RF system 120, the high band transmit and receive module 122 is electrically coupled to the first antenna 139 by way of triplexer 138. The first antenna 139 is implemented to handle LB, MB and HB signals. The first antenna 139 can transmit and receive carrier aggregated signals. The illustrated high band transmit and receive module 122 includes a power amplifier 123, duplexers 124A and 124B, low noise amplifiers 125A and 125B, and antenna switch 126. Filters of these duplexers can be arranged to filter HB signals within different frequency bands. These filters can be band pass filters as illustrated. Any resonators of the duplexers 124A and/or 124B can be implemented in accordance with any suitable principles and advantages discussed herein. The high band transmit and receive module 122 can generate HB signals for transmission by the first antenna 139 and process HB signals received by the first antenna 139. Any suitable number of signal paths for transmit and/or receive can be implemented in the high band transmit and receive module 122.

As illustrated, the mid band transmit and receive module 132 is electrically coupled to the first antenna 139 by way of triplexer 138. The illustrated mid band transmit and receive module 132 includes a power amplifier 133, duplexers 134A and 134B, low noise amplifiers 135A and 135B, and antenna switch 136. Filters of these duplexers can be arranged to filter MB signals within different frequency bands. These filters can be band pass filters as illustrated. Any resonators of the duplexers 134A and/or 134B can be implemented in accordance with any suitable principles and advantages discussed herein. The mid band transmit and receive module 132 can generate BB signals for transmission by the first antenna 139 and process MB signals received by the first antenna 139. Any suitable number of signal paths for transmit and/or receive can be implemented in the mid band transmit and receive module 132.

The second antenna 141 can receive HB and MB signals. The second antenna 141 can be a diversity antenna and the first antenna 139 can be a primary antenna. The received signals can be processed by the mid band and high band MIMO receive module 140. The illustrated mid band and high band MIMO receive module 140 includes an antenna switch 142, receive filters 143A, 143B, 143C, and 143D, and low noise amplifiers 144A, 144B, 144C, and 144D. These receive filters can be arranged to filter HB signals or MB signals within different frequency bands. These receive filters can be band pass filters as illustrated. Any resonators of the receive filters 143A to 143D can be implemented in accordance with any suitable principles and advantages discussed herein.

The illustrated RF system 120 can support downlink MIMO for both HB and MB. Although the RF system 120 of FIG. 59 includes two antennas for receiving HB and MB signals, the RF system 120 can be adapted to include additional antennas to provide MIMO of a higher order. In one example, additional antennas and modules can be implemented to support 4×4 RX MIMO for MB and HB signals.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, devices, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks and/or device structures described herein may be deleted, moved, added, subdivided, combined, and/or modified. Each of these circuit blocks and/or device structure may be implemented in a variety of different ways. The accompanying claims and their equivalents are intended to cover any such forms or modifications as would fall within the scope and spirit of the disclosure.

What is claimed is:

1. An elastic wave device comprising:
a piezoelectric layer having a cut angle in a cut angle range from −10° to 60°;
an interdigital transducer electrode on the piezoelectric layer, the interdigital transducer electrode configured to generate an elastic wave having a wavelength of $\lambda$, the interdigital transducer electrode having a thickness in a first thickness range from $0.02\lambda$ to $0.1\lambda$, and the piezoelectric layer having a thickness that is less than $\lambda$; and
a high velocity layer having a higher bulk velocity than a velocity of the elastic wave and being configured to inhibit the elastic wave from leaking from the piezoelectric layer at anti-resonance.

2. The elastic wave device of claim 1 further comprising a temperature compensating layer disposed between the high velocity layer and the piezoelectric layer.

3. The elastic wave device of claim 1 wherein the high velocity layer is a silicon layer.

4. The elastic wave device of claim 1 wherein the piezoelectric layer includes a lithium niobate layer.

5. The elastic wave device of claim 1 wherein the piezoelectric layer includes a lithium tantalate layer.

6. The elastic wave device of claim 1 wherein the thickness of the interdigital transducer electrode is between $0.05\lambda$ and $0.1\lambda$.

7. The elastic wave device of claim 1 wherein the cut angle is in a range from 15° to 35°.

8. The elastic wave device of claim 1 wherein the thickness of the piezoelectric layer is in a second thickness range from $0.35\lambda$ to $0.8\lambda$.

9. The elastic wave device of claim 1 wherein the interdigital transducer electrode includes aluminum.

10. The elastic wave device of claim 1 wherein the high velocity layer is bonded to and in physical contact with the piezoelectric layer.

11. An elastic wave device comprising:
a lithium niobate layer having a cut angle in a cut angle range from −10° to 60°;
an interdigital transducer electrode on the lithium niobate layer, the interdigital transducer electrode configured to generate an elastic wave having a wavelength of $\lambda$, and the lithium niobate layer having a thickness in a thickness range from $0.35\lambda$ to $0.8\lambda$.
a high velocity layer having a higher bulk velocity than a velocity of the elastic wave, the high velocity layer configured to inhibit the elastic wave from leaking from the lithium niobate layer at anti-resonance; and
a temperature compensating layer disposed between the high velocity layer and the lithium niobate layer, the temperature compensating layer having a positive temperature coefficient of frequency, the elastic wave device being arranged so as to have an electromechanical coupling coefficient of at least 26%.

12. The elastic wave device of claim 11 wherein the temperature compensating layer is a silicon dioxide layer.

13. The elastic wave device of claim 11 wherein the temperature compensating layer has a thickness of less than $0.5\lambda$.

14. The elastic wave device of claim 11 wherein the cut angle is in a range from −10° to 30°.

15. An elastic wave device comprising:
a lithium tantalate layer having a cut angle in a cut angle range from −10° to 50°;
an interdigital transducer electrode on the lithium tantalate layer, the interdigital transducer electrode configured to generate an elastic wave having a wavelength of $\lambda$, and the lithium tantalate layer having a thickness that is less than $\lambda$;
a high velocity layer having a higher bulk velocity than a velocity of the elastic wave, the high velocity layer configured to inhibit the elastic wave from leaking from the lithium tantalate layer at anti-resonance; and
a temperature compensating layer disposed between the high velocity layer and the lithium tantalate layer, the temperature compensating layer having a positive temperature coefficient of frequency.

16. The elastic wave device of claim 15 wherein the temperature compensating layer is a silicon dioxide layer.

17. The elastic wave device of claim 15 wherein the temperature compensating layer has a thickness of less than $0.5\lambda$.

18. The elastic wave device of claim 15 wherein the interdigital transducer electrode has a thickness in a second thickness range from $0.02\lambda$ to $0.1\lambda$.

19. The elastic wave device of claim 15 wherein the cut angle is in a range from −10° to 30°.

20. The elastic wave device of claim 15 wherein the thickness of the lithium tantalate layer is in a thickness range from $0.25\lambda$ to $0.8\lambda$.

* * * * *